(12) United States Patent
Mahmoodi et al.

(10) Patent No.: US 12,354,665 B2
(45) Date of Patent: Jul. 8, 2025

(54) DATA RECEIVER DESIGN IN DDR MEMORY INTERFACES

(71) Applicant: Western Digital Technologies, Inc., San Jose, CA (US)

(72) Inventors: Mohammad Reza Mahmoodi, Goleta, CA (US); Zahra Fahimi, Santa Barbara, CA (US); Martin Lueker-Boden, Fremont, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 64 days.

(21) Appl. No.: 18/362,388

(22) Filed: Jul. 31, 2023

(65) Prior Publication Data

US 2024/0428860 A1   Dec. 26, 2024

Related U.S. Application Data

(60) Provisional application No. 63/510,224, filed on Jun. 26, 2023.

(51) Int. Cl.
  *G06F 13/16* (2006.01)
  *G11C 16/04* (2006.01)
  *G11C 16/10* (2006.01)

(52) U.S. Cl.
  CPC .............. *G11C 16/10* (2013.01); *G06F 13/16* (2013.01); *G11C 16/0483* (2013.01); *G06F 2213/16* (2013.01)

(58) Field of Classification Search
  CPC ..... G06F 13/16; G06F 2213/16; G11C 16/10; G11C 16/0483

USPC .......................................................... 710/31
  See application file for complete search history.

(56) References Cited

U.S. PATENT DOCUMENTS

| | | | |
|---|---|---|---|
| 9,106,462 B1* | 8/2015 | Aziz ................. | H04L 25/03057 |
| 10,581,652 B1* | 3/2020 | Chada ................ | H04L 25/4925 |
| 10,785,070 B1* | 9/2020 | Takada ................ | H04L 7/0337 |
| 11,153,129 B1* | 10/2021 | Toprak-Deniz ............................ H04L 25/03044 |
| 2004/0106687 A1* | 6/2004 | Harris .................... | A61K 31/01 514/763 |
| 2015/0381393 A1* | 12/2015 | Kotagiri .................. | H04L 7/033 375/233 |
| 2017/0310510 A1* | 10/2017 | Hidaka ............. | H04L 25/03057 |
| 2019/0052488 A1* | 2/2019 | Fujii ................. | H04L 25/03159 |

(Continued)

*Primary Examiner* — Christopher B Shin
(74) *Attorney, Agent, or Firm* — Sheppard, Mullin, Richter & Hampton LLP

(57) ABSTRACT

Systems and methods disclosed herein provide for reducing noise on an data signal at receiving devices. Systems and methods disclosed herein are suited for opening a data eye by reducing noise, such as inter-symbol interference. An example of the systems and methods disclosed herein include a first equalization circuit that receives an input data signal and applies amplification to the input data signal, and a second equalization that adjusts a first pulse of the first compensated data signal based on a subset of pulses that preceded the first pulse in the first compensated data signal. In an illustrative example, the first equalization circuit can be provided as a continuous time linear equalization (CTLE) that apply a fixed boost and adjustable gain to the input data signal, and the second equalization circuit can be provided as a multi-path decision feedback equalization (DFE).

20 Claims, 41 Drawing Sheets

(56) References Cited

U.S. PATENT DOCUMENTS

| | | | |
|---|---|---|---|
| 2020/0259686 A1* | 8/2020 | Shen | H04L 25/03267 |
| 2020/0313638 A1* | 10/2020 | Hong | H03F 3/45183 |
| 2021/0250207 A1* | 8/2021 | Hossain | H04L 25/03057 |
| 2022/0113939 A1* | 4/2022 | Luo | G06F 7/50 |
| 2024/0347085 A1* | 10/2024 | Seo | G11C 7/20 |

* cited by examiner

DATA RECEIVER DESIGN IN DDR MEMORY INTERFACES

CROSS REFERENCE TO RELATED APPLICATIONS

This application claims the benefit of and priority to U.S. Provisional Patent Application No. 63/510,224, filed on Jun. 26, 2023, the contents of which are incorporated herein by reference in their entirety.

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

NAND-type flash memories may typically have multiple memory dies or chips controlled by a controller. Each die contains a memory array and peripheral circuits. At any one time, many of these memory dies may be involved in various memory operations including input or output operations with the memory controller. For example, the input/output ("I/O") requirements of these NAND-type flash memories are demanding. There may be 8 to 16 dies stacked on the same I/O channel or interface and they may operate at high speeds with reduced power, such as 200 MHz in the case of DDR2.

One issue has to do with inter-symbol interference (ISI) at the I/O interface, in which one symbol of a data signal interferes with subsequent symbols distorting the signal. ISI involves a spreading of symbol pulse beyond its allotted time interval, which interferes with a subsequent symbol pulse causing noise. This phenomenon degrades transmission speeds on the I/O interface. Conventional approaches used a data eye mask to characterize the I/O interface to address ISI. However, such approaches are not sufficient for higher transmission speeds, such as 6.4 Gbps in the case of DDR5.

Thus, there is a need to provide a high performance and low power I/O channel between a nonvolatile memory and a memory controller.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
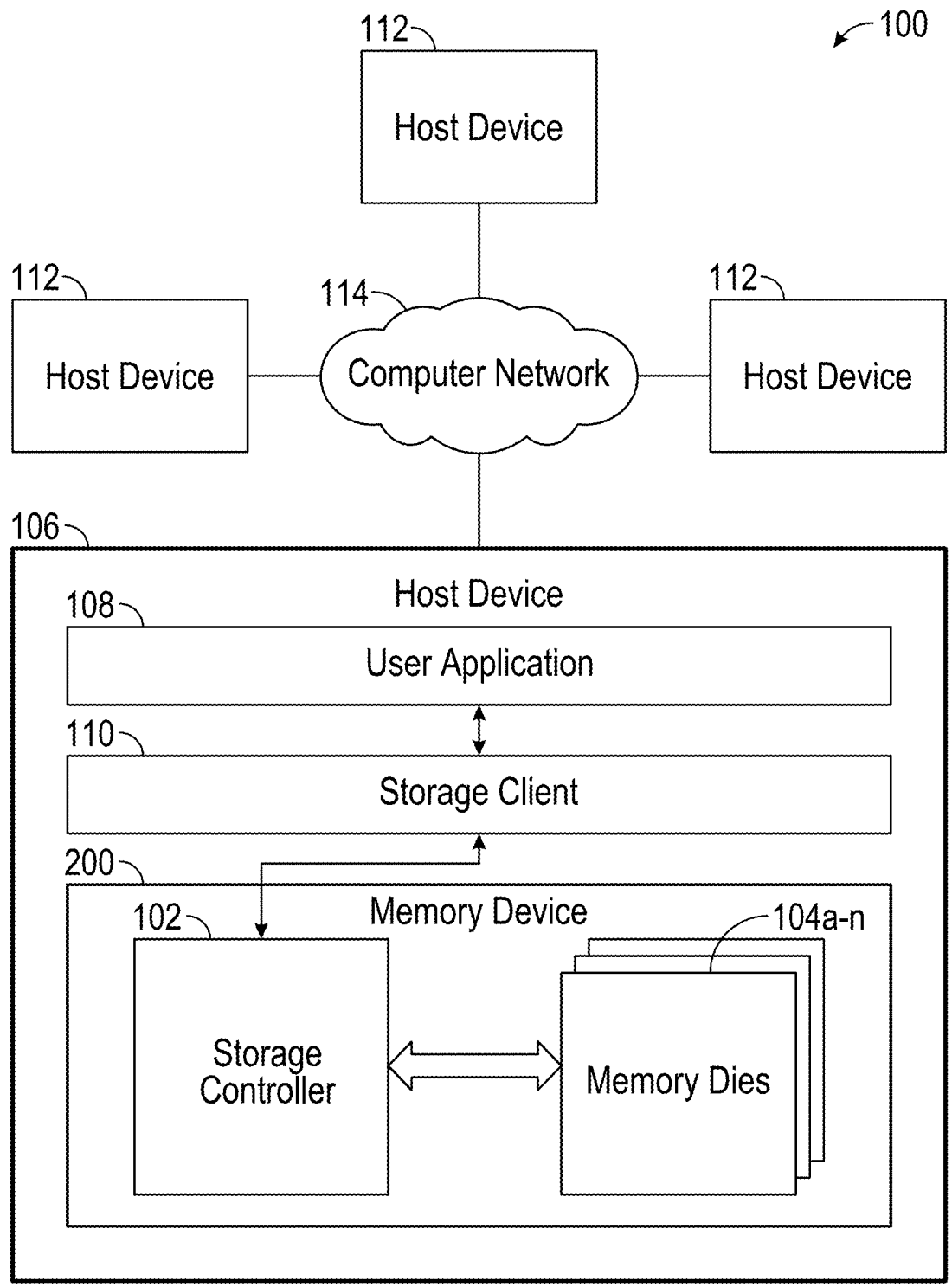
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

Compared to single data rate memory interfaces, a DDR memory interface provides for higher data transfer rates though control of the timing of the signals. For example, DDR memory I/O interfaces allow sampling data on both rising and falling edges of a clock signal, which doubles data bus bandwidth without a corresponding increase in clock frequency. Such implementations increases challenges at the I/O interface of receiver device in detecting and distinguishing data symbols of a pattern encoded into data signals. Additionally, receivers should be versatile and able to function across a wide range of input voltage swings and channel characteristics.

One of the challenges arising from high data rates is increased channel loss that may occur in a channel between a receiver I/O interface and a transmitter I/O interface. The channel has generally a low pass characteristics, which means the channel loss increases with frequency. As a result, gain on the signal at the receiver I/O interface can be corresponding lost at higher data transfer rates. Typically this challenge is addressed using continuous time linear equalization (CTLE) at the receiver I/O interface, which applies a high-pass transfer characteristic to lossy data on the channel. The transfer characteristic has a function that is inverse of the lossy channel, which is applied to a received data signal to increase gain. However, a common side effect of CTLE is that noise on the channel, for example, due to insertion loss and reflections, is amplified with the data signal.

Another challenge is reflections arising due to improper impedance match or terminations along the interface. These reflections increase ISI, which increases noise and degrades transmission speeds. Conventionally, ISI has been addressed using data eye masks that characterize the receiver I/O interface. However, such approaches are not sufficient at higher data transfer rates. This is because the eye at a receiver could be potentially fully closed. Hence, using eye mask to characterize ISI would be impractical. Decision feedback equalization (DFE) is another approach that attempts to equalize the channel response by removing ISI. DFE, as compared to CTLE, does not have the side effect of amplifying high frequency noise. DFE operates by making decision based on previously detected bits to improve the decision margin of the current bit (also referred to as a symbol).

Accordingly, embodiments of the disclosed technology provide for c circuit topologies and methods that provide a compensation circuit having a versatile first equalization circuit that provides a fixed boost component and adjustable gain component on an input swing to generate a first compensated data signal, The first equalization circuit supplies the first compensated data signal to a second equalization circuit configured to output a second compensated data signal that has reduced ISI, and in some implementations negligible ISI. In an illustrative example, the first equalization circuit is a CTLE circuit that applies fixed boost component and adjustable gain component to an input signal, which is supplied to a summer circuit of a multi-data path DFE architecture as an example of the second equalization circuit. The summer circuit according to embodiments disclosed herein provides for low variations with respect to process corner variations. Manufacturing processes in the semiconductor industry are subject to stochastic errors, causing a real process to differ from an ideal or target process. In particular, real processes distribute according to a Gaussian pattern around a target process. A key parameter used to characterize manufacturing processes is the switching speed of the resulting electrical components/devices, based on which a given process can be classified according to so called "process corners" (e.g. "fast", "slow" or "typical" process corners). Further, embodiments of the disclosed technology provide for a DFE circuit that has increased efficiency as compared to conventional DFEs.

FIGS. 1 to 4G depict an example memory system that can be used to implement the technology disclosed herein. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB")

connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such as Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such as Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computers with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments, a number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
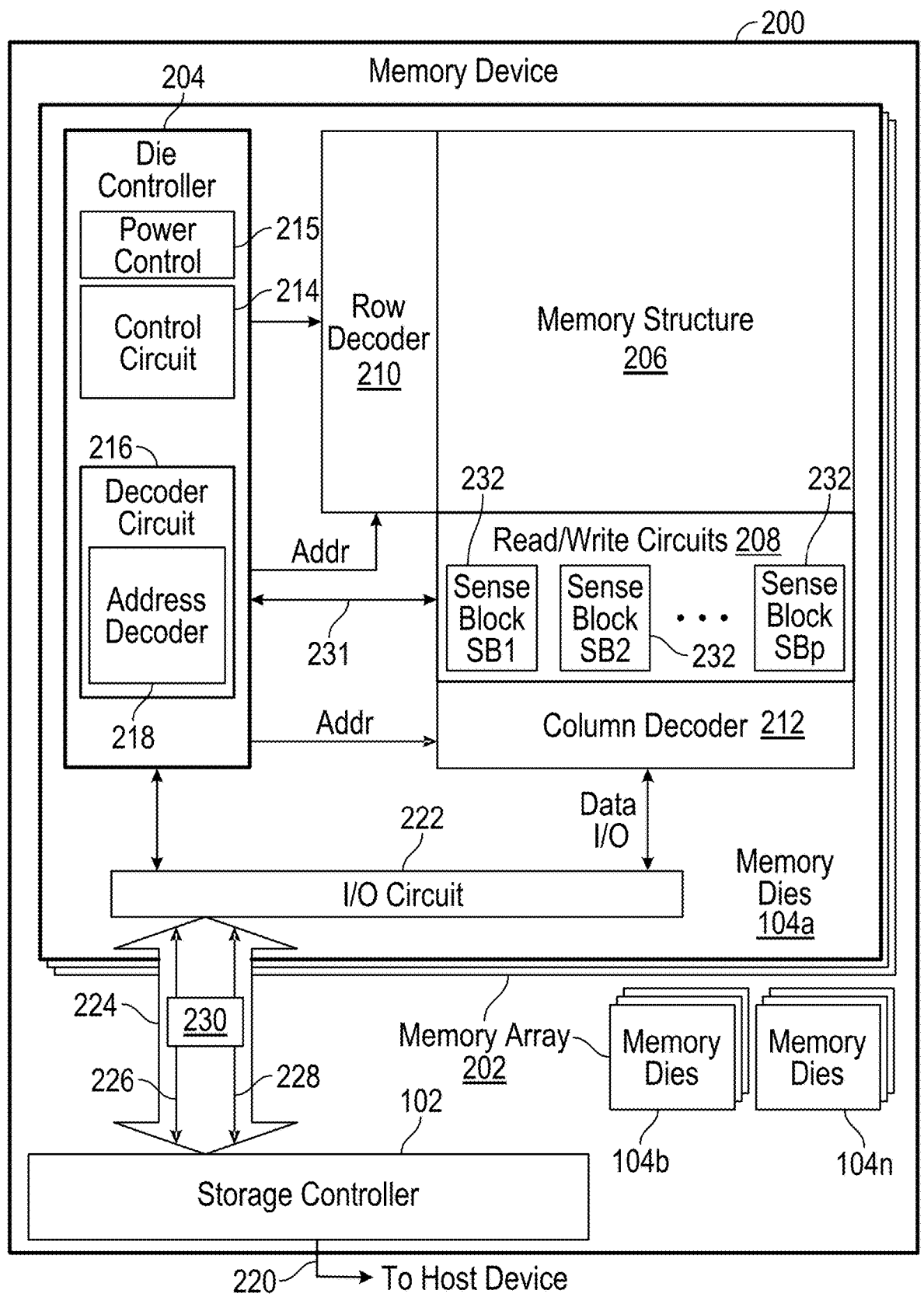
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104a-n, the storage controller 102 and memory dies 104a-n being effectively described with regard to FIG. 1. Each memory die 104a-n can be a complete memory die or a partial memory die and may include a die controller 204, at least one memory structure 206, and read/write circuits 208. The following description will be made with reference to memory die 104a as an example of memory dies 104a-n, where each memory die may include same or similar components and function in the same or similar way. Thus, while reference herein is made to memory die 104a, the same description may be applied equally to memory dies 104b-n.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D-laid out in a single fabrication plane) or three-dimensional (3D-laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104a. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, subsystem, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104a and an address bus over which addresses are transmitted to the memory die 104a. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (I/O) circuit 222 may be coupled, through the memory interface 224 and to a I/O circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via I/O circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
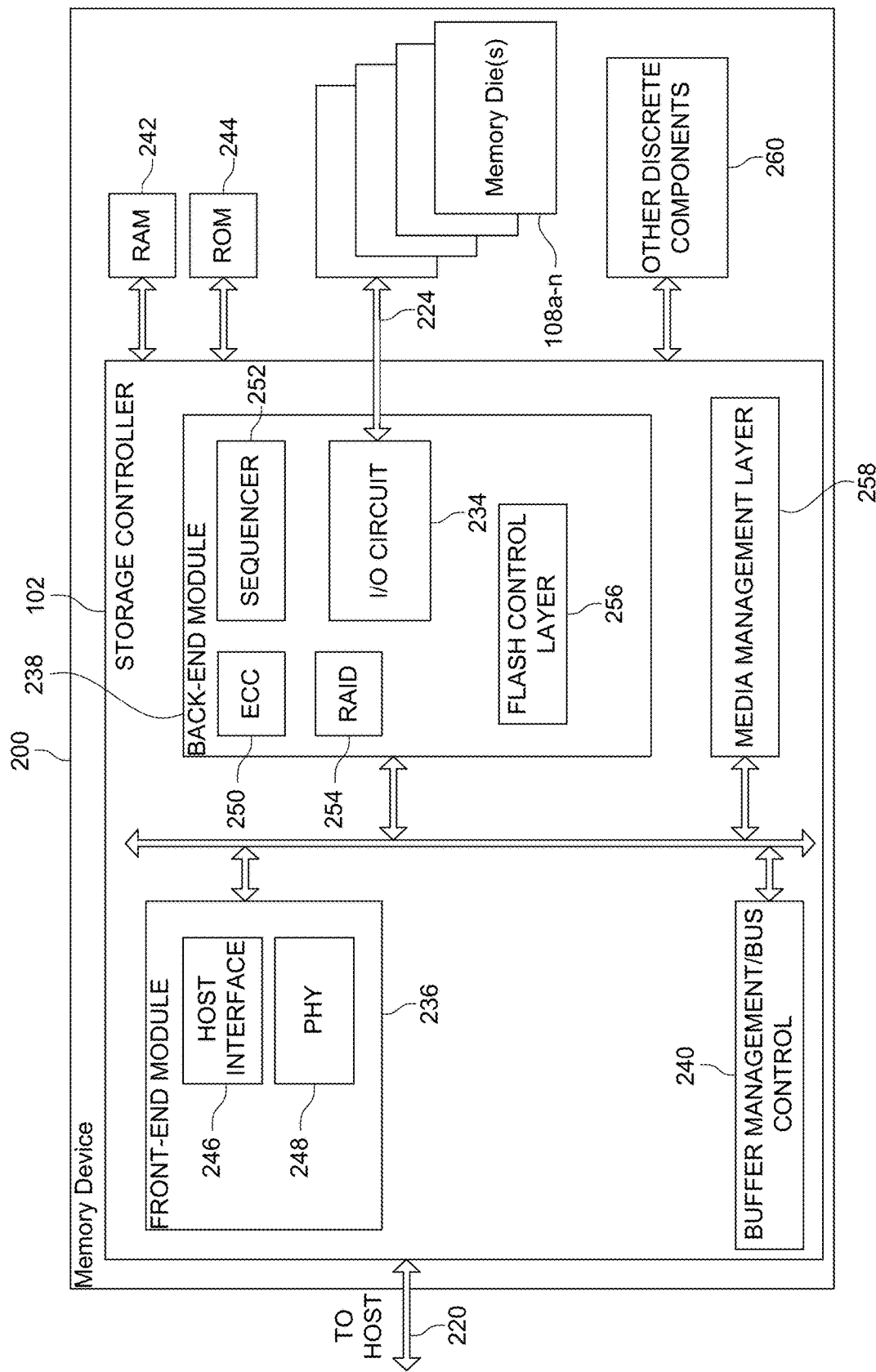
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory dies 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the I/O circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 206 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 3:
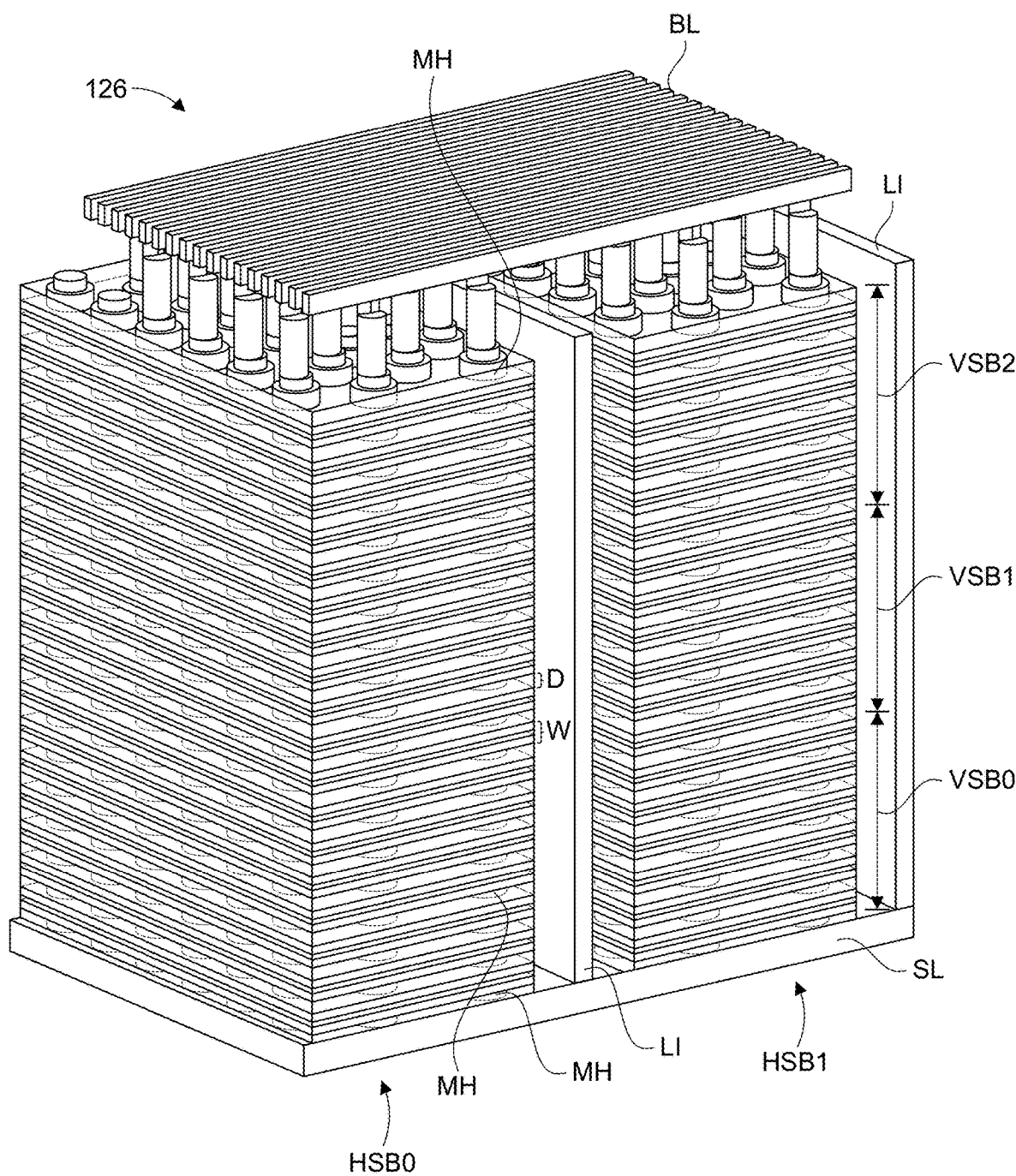
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
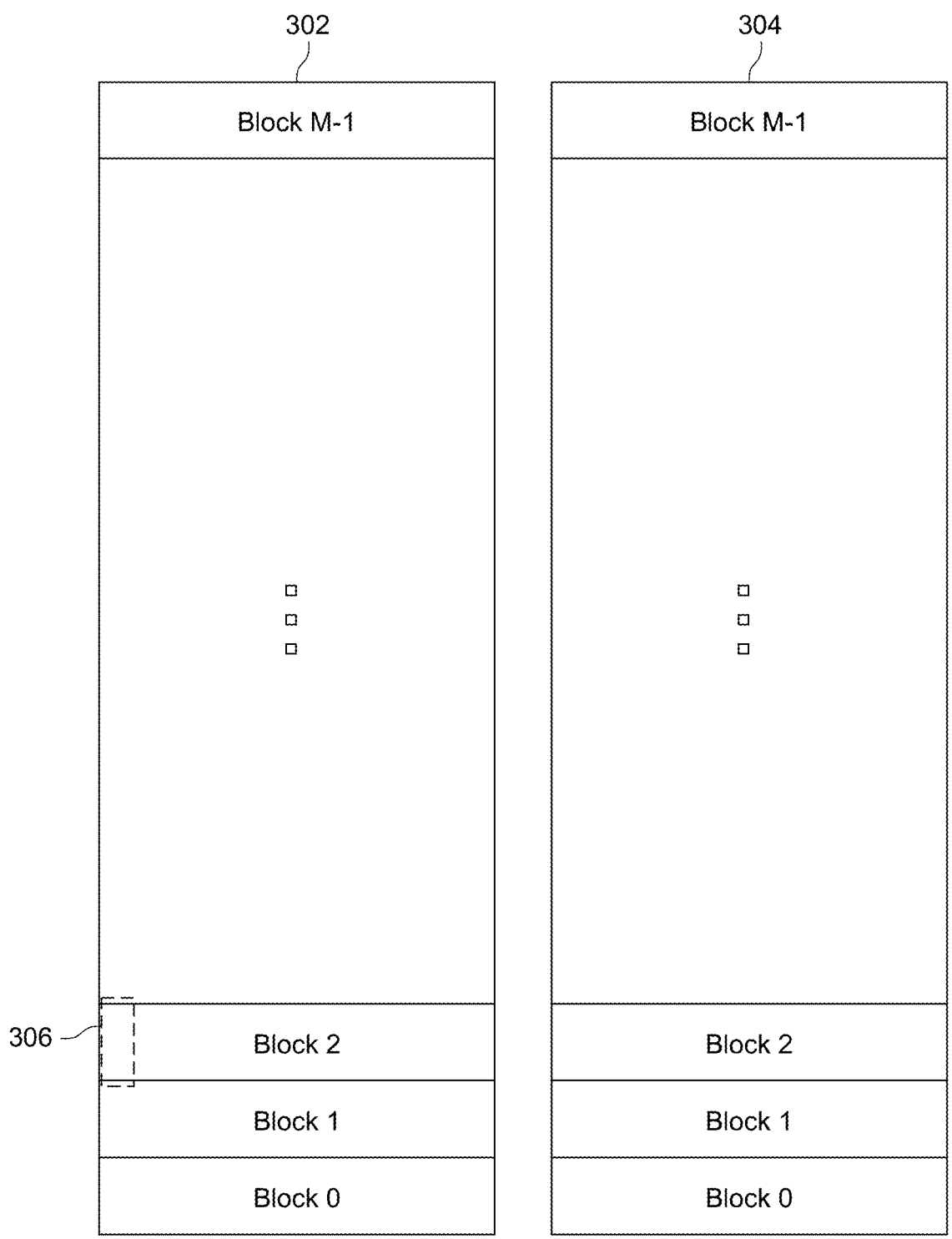
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a group of connected memory cells that share a common set of wordlines.

Figure 4B:
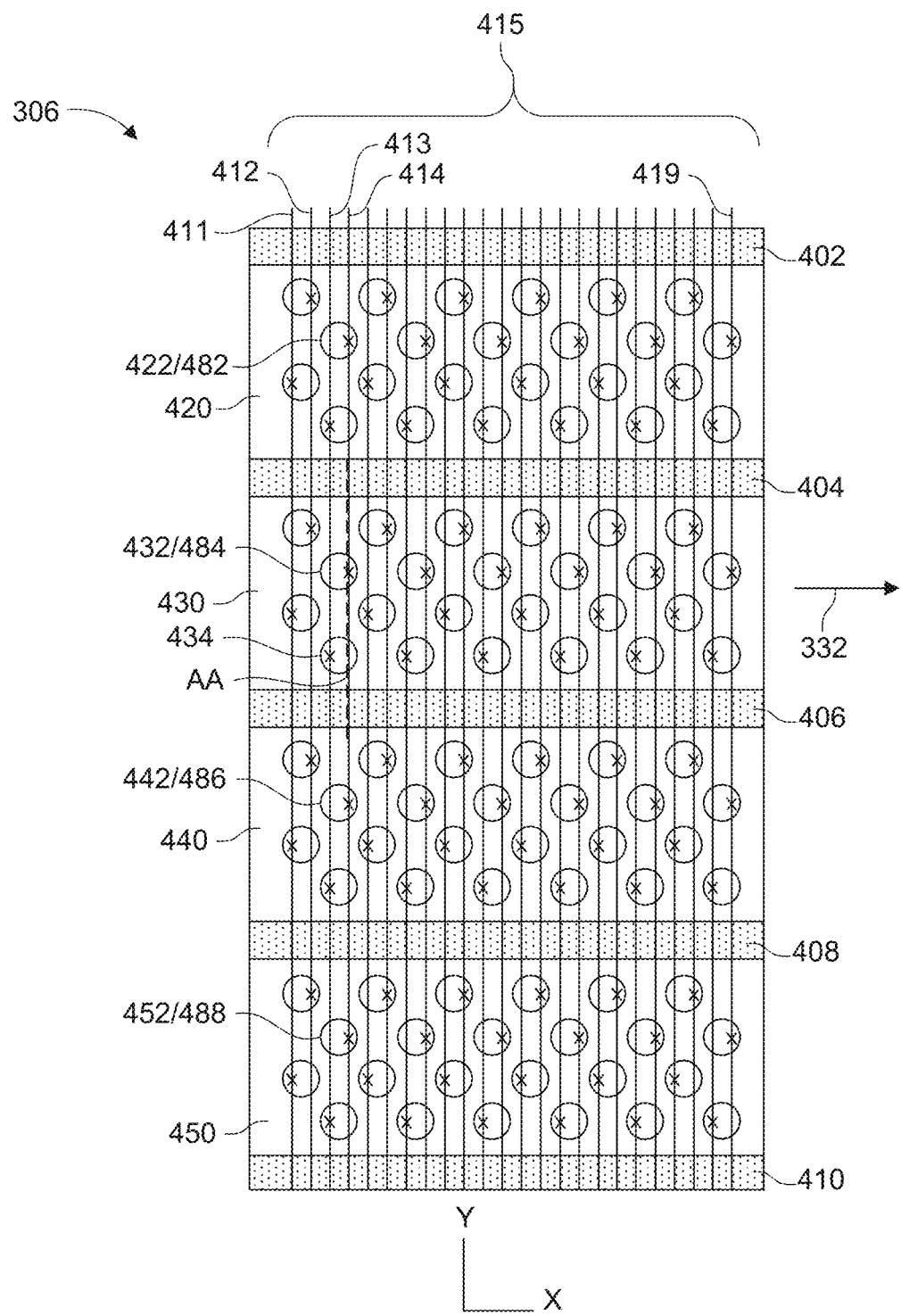
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
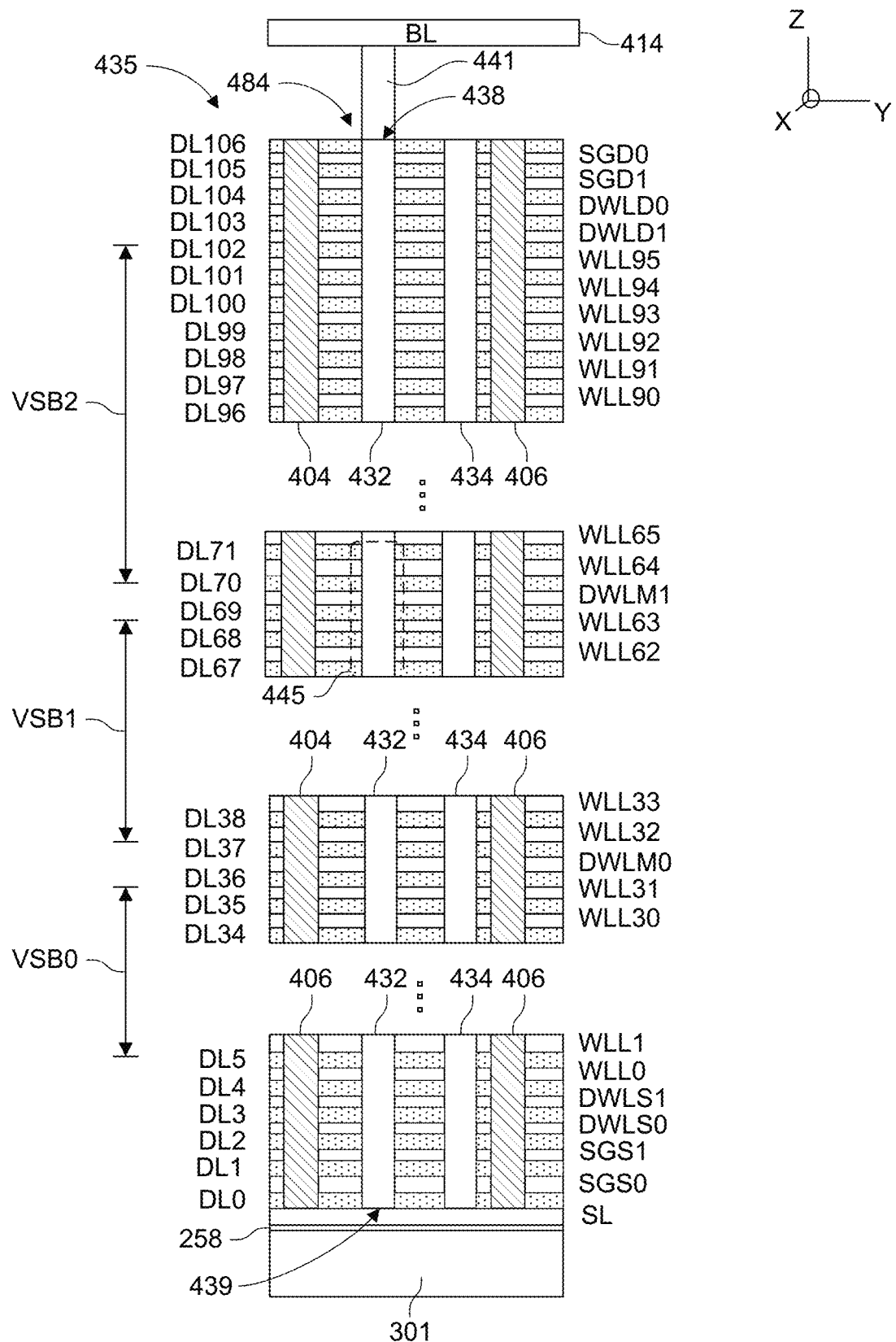
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 258 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
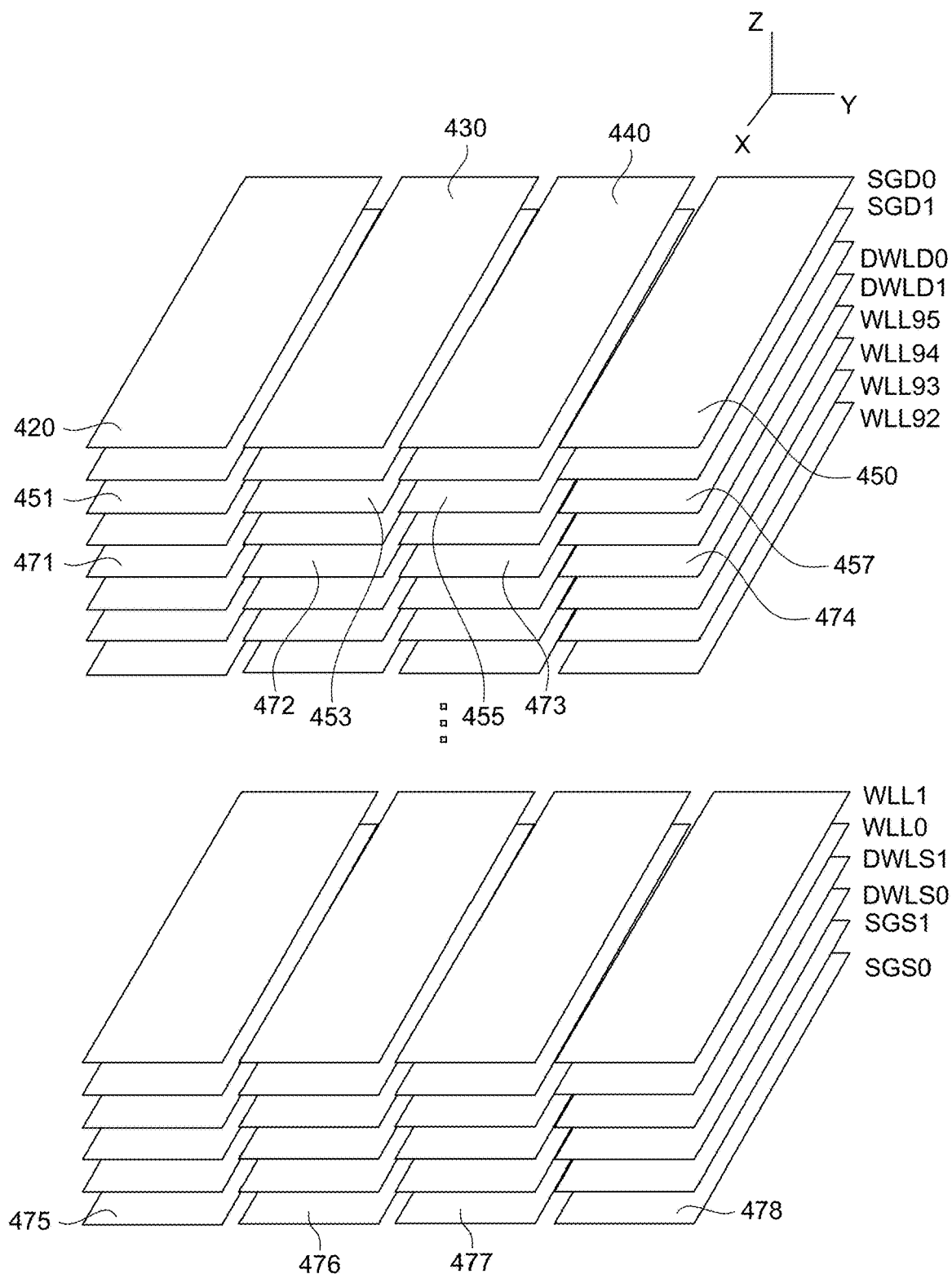
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
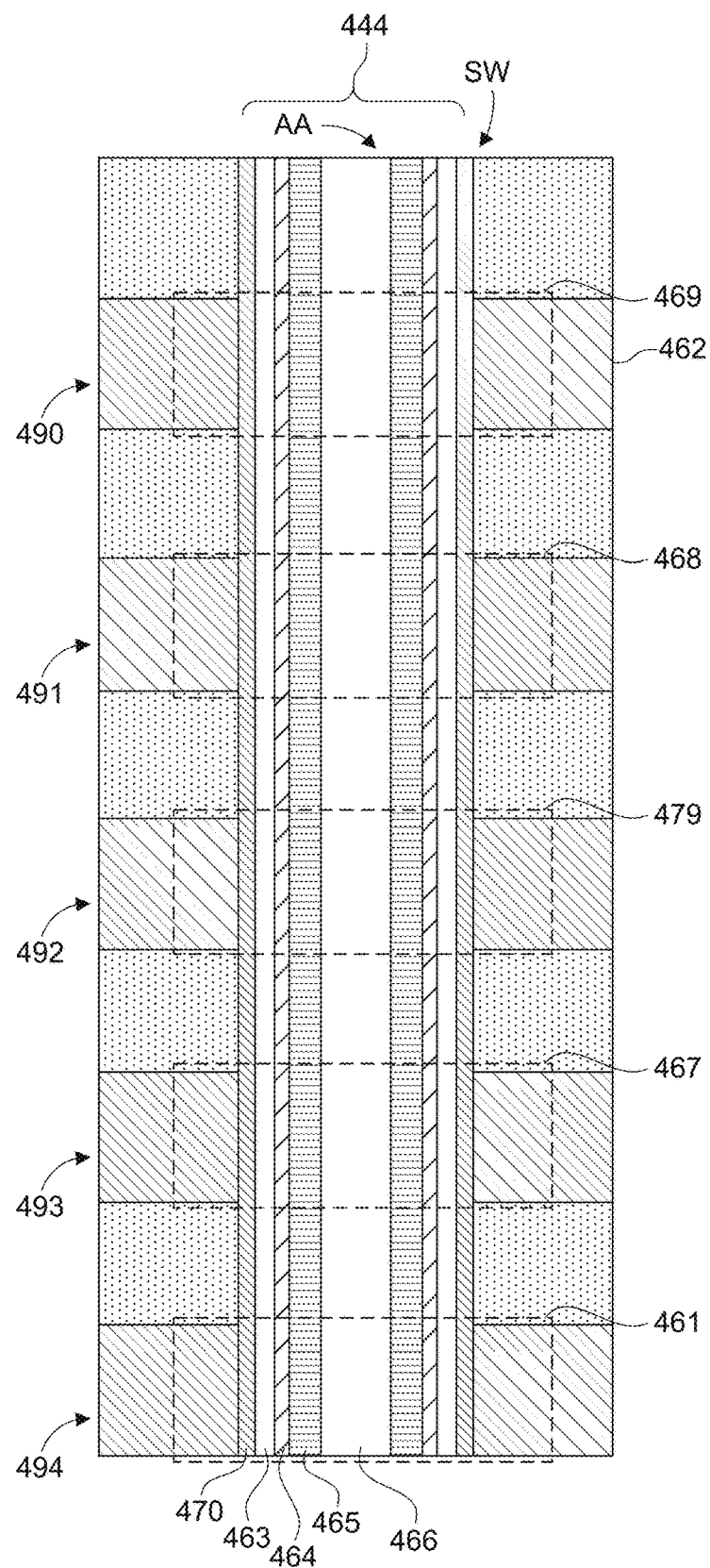
FIG. 4E depicts a view of a region of FIG. 4C.

FIG. 4E depicts a view of the region 445 of FIG. 4C. Data memory cell transistors 469 and 468 are above dummy memory cell transistor 479. Below dummy memory cell transistor 479 are data memory cell transistors 467 and 461. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 479 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
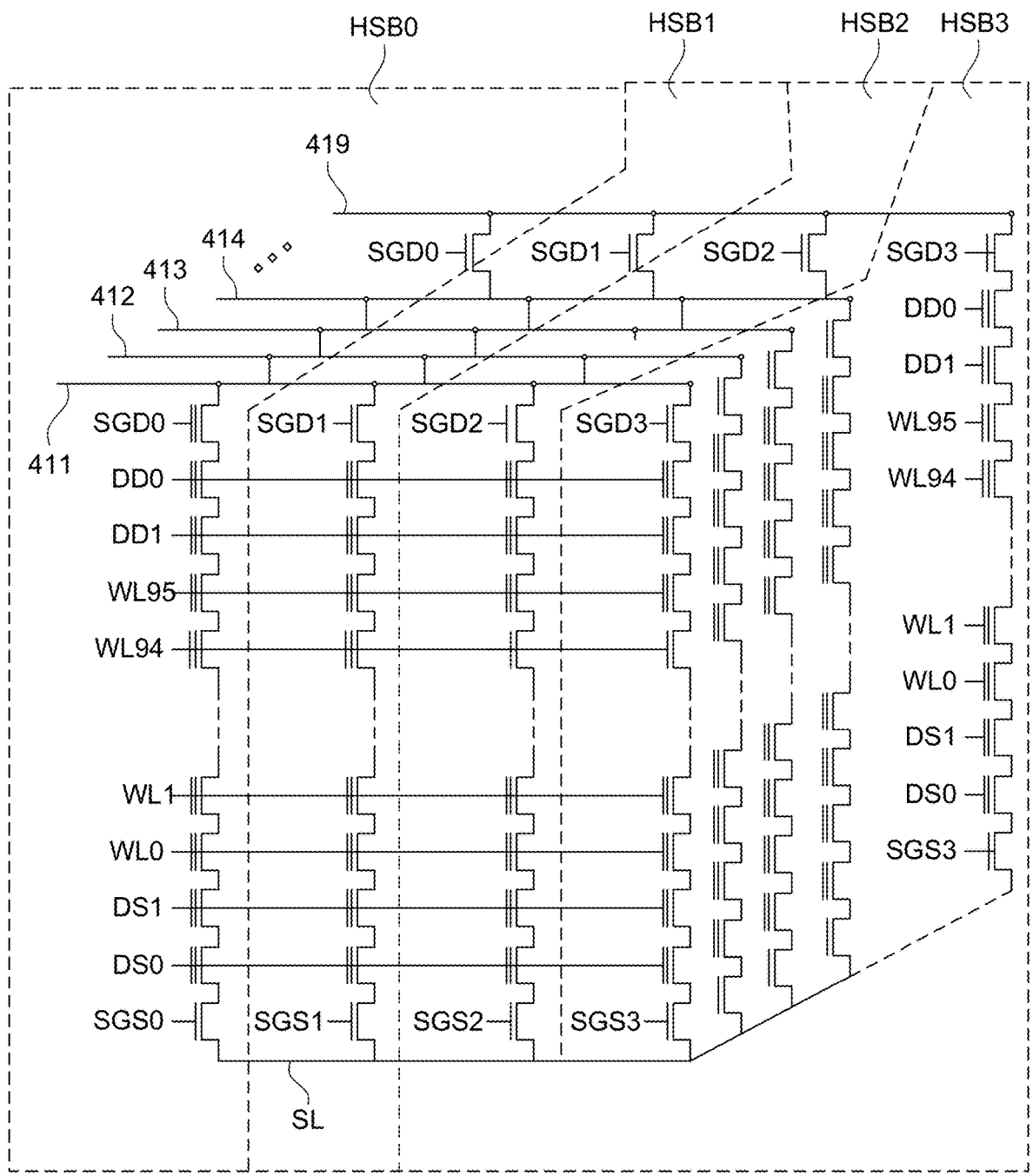
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, ... 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
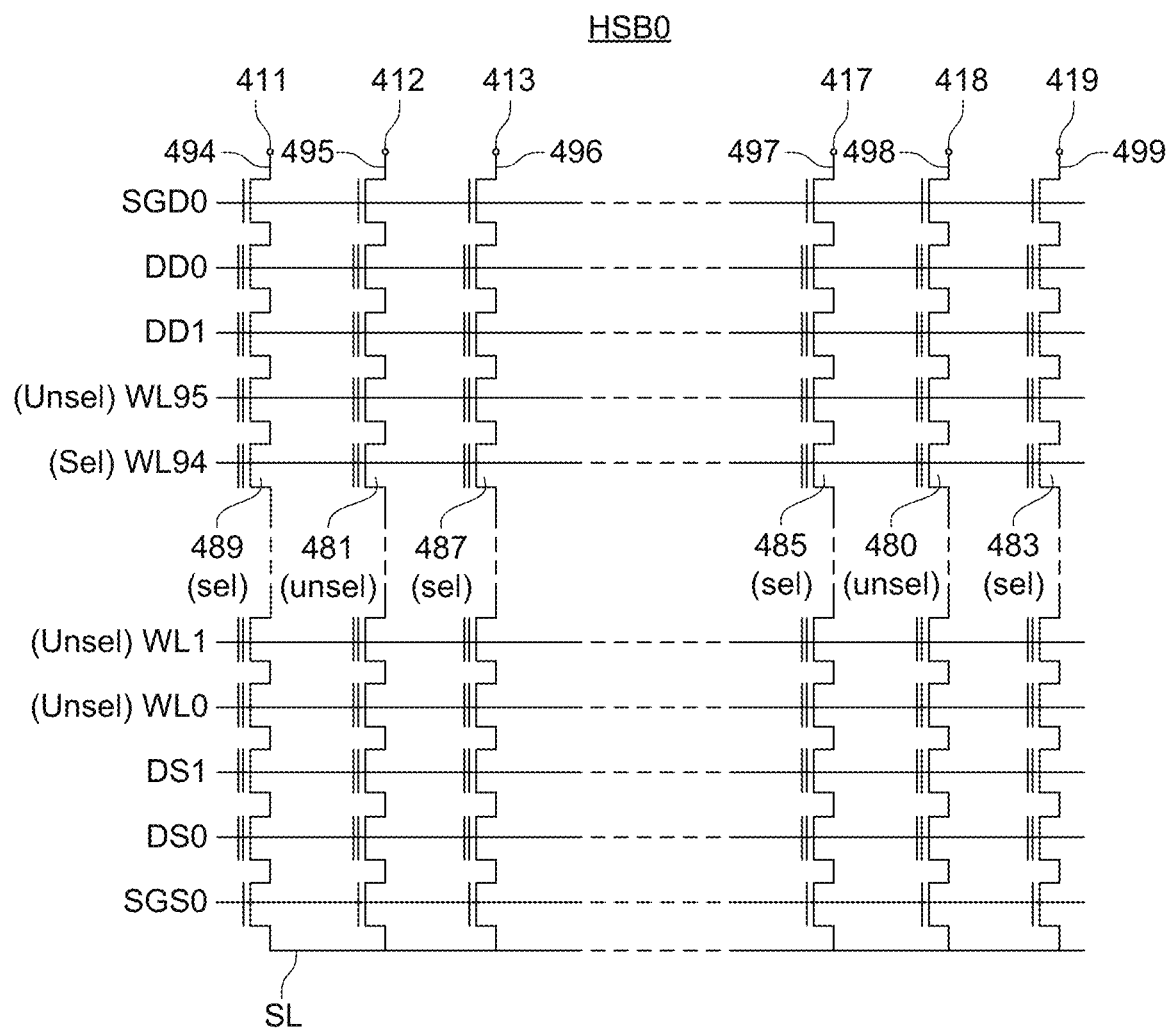
FIG. 4G is a schematic of a plurality of NAND strings showing one example horizontal sub-block, in connection with which, example embodiments of the disclosed technology can be implemented.
Figure 4H:
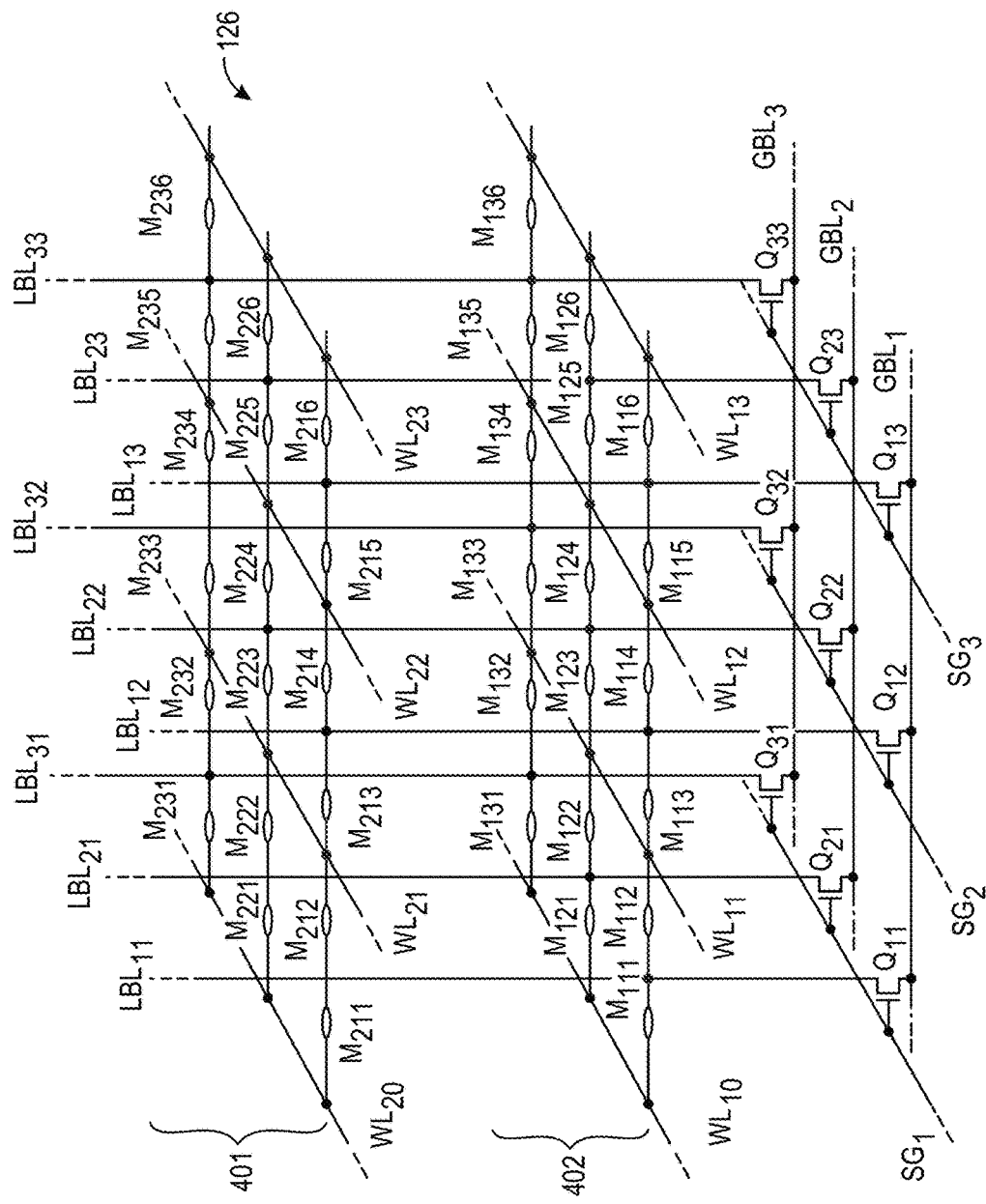
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 494, 495, 496, 497, 498, and 499; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 481 and 480 (which are connected to wordline WL94) are to remain in the erased state; therefore, memory cells 481 and 480 are unselected memory cells (labeled unsel in FIG. 4G). Additionally, assume, for example purposes, that memory cells 489, 487, 485 and 483 (which are connected to wordline WL94) are each to be programmed to a respective one of data states S1-S7; therefore, memory cells 489, 487, 485 and 483 are selected memory cells (labeled sel in FIG. 4G).

FIG. 4H illustrates another memory structure that can be used for the structure 126 of FIG. 1. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Figure 5:
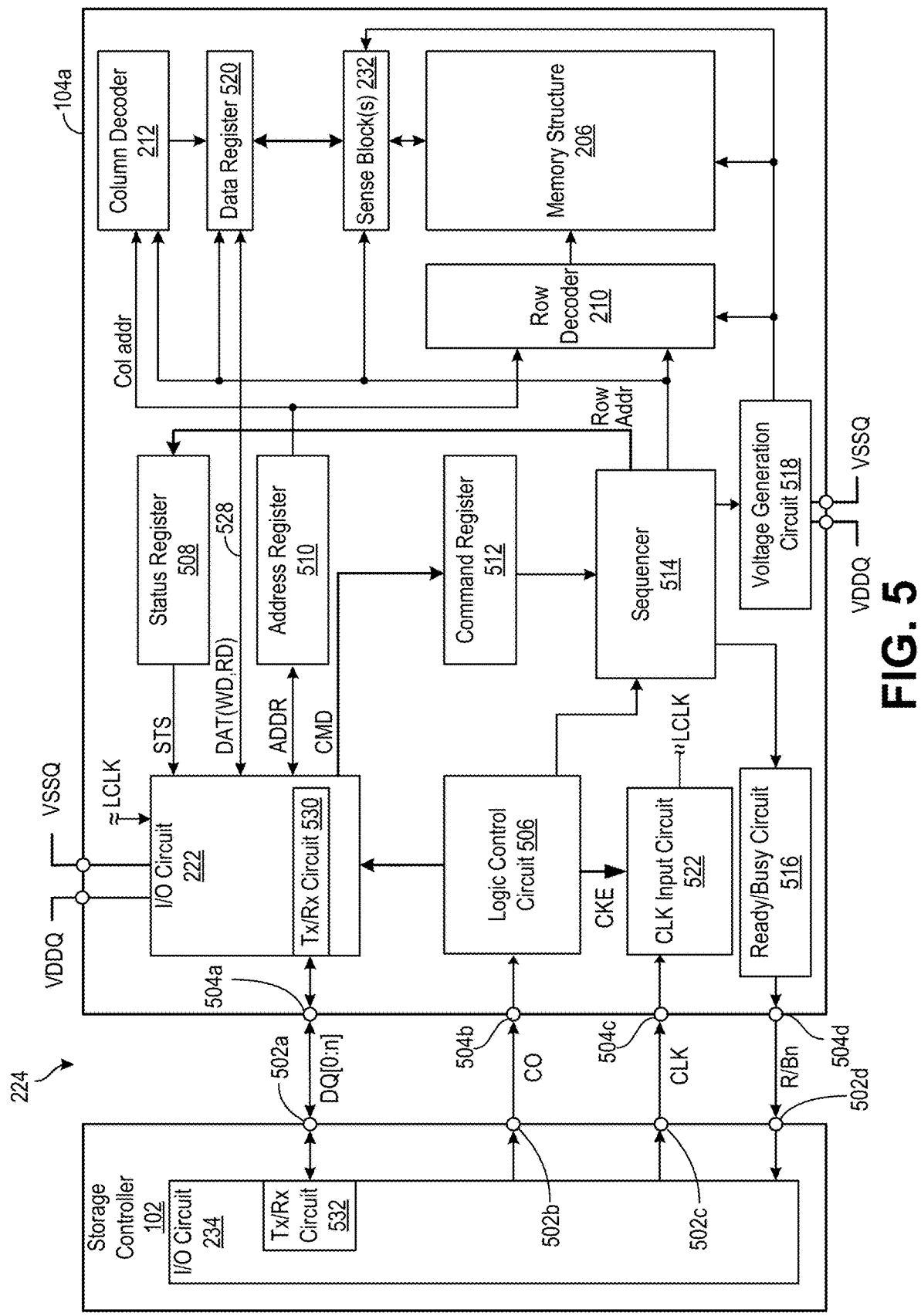
FIG. 5 is a block diagram of example memory system that depicts more details of an example embodiment of memory die, in connection with which, example embodiments of the disclosed technology can be implemented.

FIG. 5 is a block diagram of example memory system 200 that depicts more details of embodiments of memory die 104a. With reference to FIG. 2B above, the memory die 104a may be connected to the storage controller 102 via the memory interface 224 and operates based on commands from the storage controller 102.

For example, the memory die 104a transmits and receives, for example, one or more data signals (DQ signals) to and from the storage controller 102 via data bus 228 of the memory interface 224. The one or more DQ signals may be an n-bit wide signal, where each data signal is a 1-bit wide signal. For example, n may be 7, thus the DQ signal may be an 8-bit wide signal. The DQ signals may be encoded with input/output (I/O) data, for example, data in (DIN)/data out (DOUT) for data operations (e.g., read operations, write operations, etc.), address data (e.g., address codes) for address sequencing for the data operations, and/or command data (e.g., command codes) for command sequencing for the data operations.

Data sent over the DQ signals can be latched with respect to a rising edge or a falling edge of a clock (CLK) signal. The CLK signal, in various examples, can include a pair of complementary CLK signals, such as a DQS (e.g., data strobe signal) and DQSB (e.g., inverse data strobe signal). The DQSB CLK signal is the logical inverse of the DQS CLK signal. The DQSB CLK signal is added for redundancy since rising and falling edges of one signal may be distorted during transmission. DQ data can be latched on either or both of the rising and falling edges of the CLK signal to achieve a double data rate.

The memory die 104a also receives control (CO) signals, such as, but not limited to, chip enable (CEn) signal, command latch enable (CLE) signal, address latch enable (ALE) signal, write enable (WEn) signal, and read enable (REn) signal from the storage controller 102 via the control bus 226 of the memory interface 224. The memory die 104a also transmits control signals, for example but not limited to, a ready/busy signal (R/Bn) to the storage controller 102. In some embodiments, each of CO signals may be a one-bit wide signal. In other embodiments, the control signals CO signals may have other bit-widths as desired.

The storage controller 102 issues a command code to perform a read operation, a command code to perform a write operation, or the like to the memory die 104a in response to a command from a host device (e.g., host device 106 and/or 112). The storage controller 102 manages the memory space of the memory die 104a. As part of the read or write operation, the storage controller 102 issues various commands to perform for a respective operation and the memory die 104a and/or storage controller 102 transmit DIN/DOUT to complete the respective operation.

Storage controller 102 comprises I/O circuit 234 electrically connected to the I/O circuit 222 of the memory die 104a via a plurality of electrical contacts or terminals. The electrical contacts may comprise pads, pins, etc. for electrically connecting the memory die 104a to the storage controller 102 via a respective bus of the memory interface 224. For example, the storage controller 102 includes a plurality of contacts 502a-n electrically connected to a plurality of contacts 504a-n of the memory die 104a. The I/O circuit 234 transmits the CO signals and CLK signal to the memory die 104a over the control bus 226 of the memory interface 224 via respective pins and transmits DQ signals (e.g., DIN data signals) over the data bus 228 of the memory interface 224 via respective pins. The I/O circuit 222 can transmit the R/Bn signal to the storage controller 102 over the control bus 226 and the DQ signals (e.g., DOUT data signals) over the data bus 228 via respective pins.

As illustrated in FIG. 5, the memory die 104a includes I/O circuit 222, a logic control circuit 506, a status register 508, an address register 510, a command register 512, a sequencer 514, a ready/busy circuit 516, a voltage generation circuit 518, a data register 520, and CLK input circuit 522. The various components 506-520 may be included as part of the die controller 204, for example, as part of the control circuit 214 and/or decoder circuit 216. FIG. 5 also illustrates the memory structure 206, row decoder 210, a sense blocks 232, and column decoder 212, as described above in connection with FIG. 2A.

The I/O circuit 222 controls input and output of the DQ signals to and from the storage controller 102. For example, the I/O circuit 222 comprises a transmitter (Tx) and/or receiver (Rx) circuit 530 configured to exchange DQ signals with a transmitter (Tx) and/or receiver (Rx) circuit 530 on the I/O circuit 234 of storage controller 102. In the case of a write operation, Tx/Rx circuit 530 receives command codes and DIN from Tx/Rx circuit 532. Tx/Rx circuit 530 also DIN to data register 520, address codes to the address register 510, and command codes to the command register 512. DIN, command codes, and address codes are transmitted to the memory die 104a as DQ signals encoded with a bit pattern for the DIN, command, or address. The Tx/Rx circuit 530 also can transmit status information STS received from the status register 508, DOUT received from the data register 520 to be transmitted to the storage controller 102. STS and DOUT are transmitted as DQ signals encoded with a bit pattern for the STS or DOUT. The I/O circuit 222 and the data register 520 are connected via an internal data bus 528. For example, the internal data bus 528 includes a plurality internal I/O data lines (e.g., 100 to 107 corresponding to 8-bit DQ signals such as DQ[0:7]). The number of internal I/O data lines is not limited to eight, but may be set to 16, 32, or any number of data lines.

The logic control circuit 506 receives, for example, the CO signals from the storage controller 102 via control bus 226. Then, logic control circuit 506 controls the I/O circuit 222 and the sequencer 514 in accordance with a received signal.

The status register 508 temporarily stores status information STS, for example, in a write operation, a read operation, and an erasing operation for data and notifies the storage controller 102 whether the operation normally ends.

The address register 510 temporarily stores the address code received from the storage controller 102 via the I/O circuit 222. For example, the I/O circuit 222 may detect DQ signals and sample the DQ signals according to the CLK signal to obtain a bit pattern encoded thereon. The I/O circuit 222 may then decode the bit pattern to obtain the data, which in this example may be an address code. The address code is then temporarily stored in the address register 510. Then, the address register 510 transmits a row address (row addr) to the row decoder 210 and transmits a column address (col addr) to the column decoder 212.

The command register 512 temporarily stores the command code received from the storage controller 102 via the I/O circuit 222 and transmits the command code to the sequencer 514. For example, the I/O circuit 222 may detect DQsignals and sample the DQsignals according to the CLK signal to obtain a bit pattern encoded thereon. The I/O circuit 222 may then decode the bit pattern to obtain the data, which in this example may be a command code. The command code is then temporarily stored in the command register 512.

The sequencer 514 controls operation of the memory die 104a. For example, the sequencer 514 controls the status register 508, the ready/busy circuit 516, the voltage generation circuit 518, the row decoder 210, the sense blocks 232, the data register 520, the column decoder 212, and the like according to a command code stored in the command register 512 to execute the write operation, the read operation, and the erasing operation according to the code.

The ready/busy circuit 516 transmits the R/Bn signal to the storage controller 102 according to an operation state of the sequencer 514. For example, the R/Bn signal is transmitted to the storage controller 102 via the control bus 226 of the memory interface 224.

The voltage generation circuit 518 receives a high supply voltage VDD and low supply voltage VSS (which may be ground or zero in some embodiments) and generates voltages necessary for a desired operation (e.g., a write operation, a read operation, or an erasing operation) according to control of the sequencer 514. For example, voltage generation circuit 518 may generate a reference voltage Vref for distinguishing between logic states of a read or write operation. The voltage generation circuit 518 may be an example of the power control circuit 215 of FIG. 2A. The voltage generation circuit 518 supplies the generated voltage, for example, to the memory structure 206, the row decoder 210, and the sense blocks 232. The row decoder 210 and the sense blocks 232 apply a voltage supplied from the voltage generation circuit 518 to memory cells in the memory structure 206.

The data register 520 includes a plurality of latch circuits. The latch circuits store the write data (WD) and the read data (RD). For example, in a write operation, the data register 520 temporarily stores the write data received from the I/O circuit 222 and transmits the write data to the sense blocks 232. For example, in a read operation, the data register 520 temporarily stores the read data received from the sense blocks 232 and transmits the read data to the I/O circuit 222.

The clock input circuit 522 receives the clock signal CLK via pin 504c. The CLK signal may be two complementary clock signals (e.g., DQS and DQSB). The clock input circuit 522 receives a clock enable signal CKE from the logic control circuit 506 and provides a phase controlled internal clock signal LCLK. The phase controlled internal clock signal LCLK is supplied to the I/O circuit 222 and is used as a timing signal for sampling DIN/DOUT on the data bus as well as performing other functions of the memory die 104a.

The I/O circuit 222 is supplied with high supply voltage VDD and low supply voltage VSS via respective pins. The supply voltages VDD and VSS may be used for the I/O circuit 222 so that power supply noise generated by the I/O circuit 222 does not propagate to the other circuit blocks of device memory die 104a.

Figure 6:
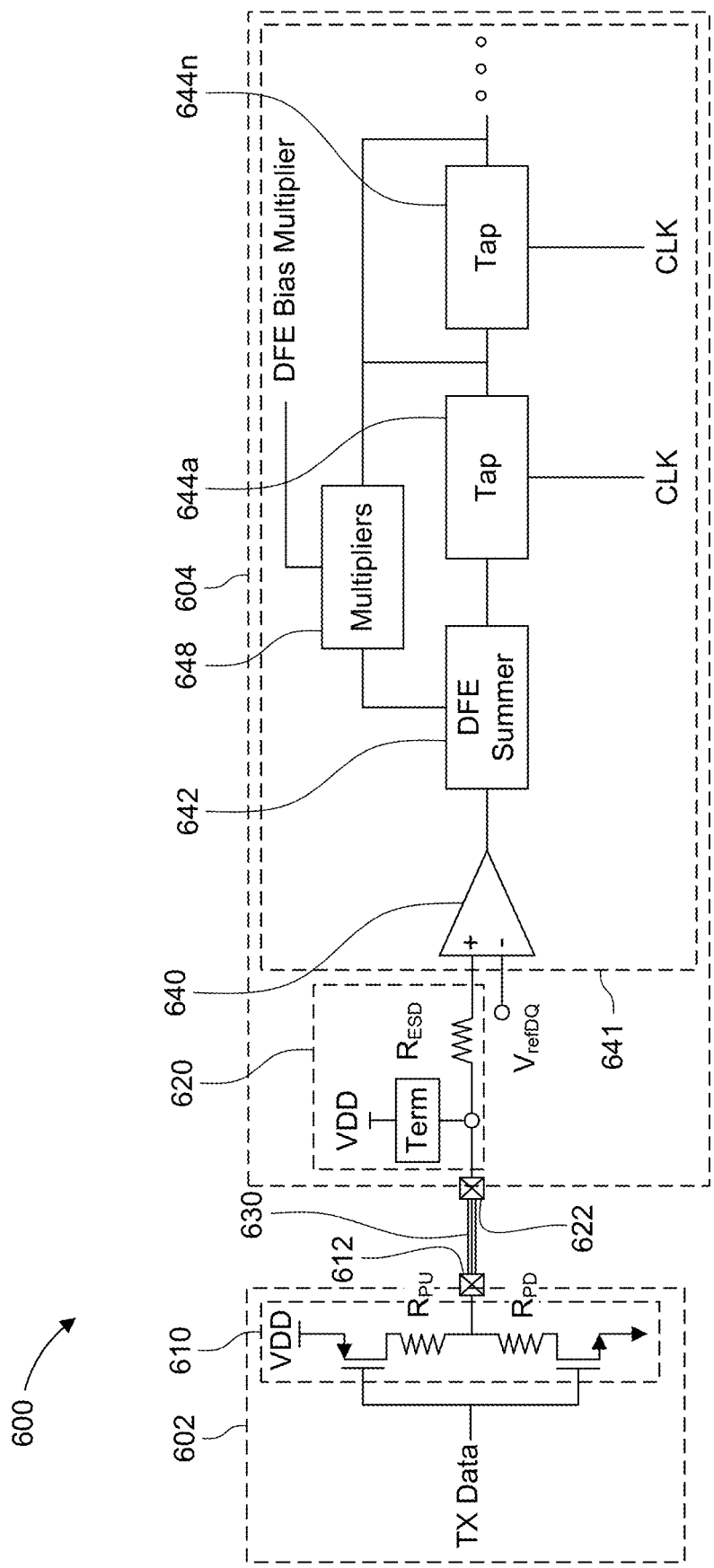
FIG. 6 is schematic of an example circuit implementation 600 of a termination logic.

FIG. 6 is schematic of an example circuit implementation 600 of a termination logic. The circuit 600 comprises a transmission driver 610 on a transmitting device 602 connected to a termination circuit 620 on a receiver device 604. The transmission driver 610 in the transmitting device 602 drives an I/O pad 612 based on a transmission signal from an internal signal TX Data of the transmitter device 602. The I/O pad 612 of the transmission driver 610 is connected to I/O pad 622 of receiver device 604 through a channel on a bus line 630. A termination circuit 620 of the termination logic is connected to the I/O pad 622 of the receiver device 604 for impedance matching so to reduce signal reflections. An input receiver 640 is provided in the receiver device 604 and configured to compare the input signal received through the I/O pad 622 with a reference voltage Vref to provide a buffer signal to the internal circuitry of the receiver device 604.

In an example implementation, the transmitting device 602 may be the storage controller 102 with I/O circuit 234 comprising transmission driver 610 as an example Tx/Rx circuit 532 and the receiver device 604 may be the memory die 104a with I/O circuit 222 comprising termination circuit 620 and input receiver 640 as an example Tx/Rx circuit 530, for example, in a case of a write operation in which storage controller 102 is transmitting DIN data to memory die 104a. Further, bus line 630, I/O pad 612, and I/O pad 622 may be implemented as a data bus line of data bus 228, one of contacts 502a, and one of contacts 504a. That is, in a case of an 8-bit wide data bus 228, there may be eight contacts 502a and eight contacts 504a. Each respective contact 502a is connected to a respective contact 504a via a data bus line of data bus 228. FIG. 6A depicts one such configuration, where bus line 630 is an example of a single line of the data bus 228, and I/O pads 612 and 622 are single electrical contact or pads.

In another example, the transmitting device 602 may be the memory die 104a with I/O circuit 222 comprising transmission driver 610 as an example Tx/Rx circuit 530 and the receiver device 604 may be the storage controller 102 with I/O circuit 234 comprising transmission driver 620 and input receiver 640 as an example Tx/Rx circuit 532, in a case of a read operation in which memory die 104a is transmitting DOUT data to storage controller 102. In this scenario, bus line 630, I/O pad 612, and I/O pad 622 may be implemented as a data bus line of data bus 228, one of contacts 504a, and one of contacts 502a.

The transmission driver 610 may include a pull-up device $R_{PU}$ connected between a first power supply voltage VDD and the I/O pad 612 and a pull-down device $R_{PD}$ connected between the I/O pad 612 and ground (or a second power supply voltage VSS that is lower than the first power supply voltage VDD). The pull-up device $R_{PU}$ may include a p-channel metal oxide semiconductor (PMOS) transistor that is switched in response to the transmission signal TX Data. The pull-down device $R_{Pd}$ may include a n-channel metal oxide semiconductor (NMOS) transistor that is switched in response to the transmission signal TX Data. Each of pull-up device $R_{Pu}$ and pull-up device $R_{Pu}$ may have a resistance $R_{on}$ between the VDD and ground, respectively, and the I/O pad 612 when each of the pull-up device $R_{PU}$ and pull-up device $R_{PU}$ is turned on based on the transmission signal TX Data.

In case of the termination circuit 600, a high voltage level VOH and a low voltage level VOL of the input signal SI at the receiver device 604 may be represented as waveform 650 shown in FIG. 6B. In a case where the low voltage is ground voltage, the voltage level for a logic high level (e.g., 1) is VDD and the voltage level for a logic low level (e.g., 0) may be calculated as follows:

$$V_{in|Data=0} = \frac{R_{PD}}{R_{PD} + R_{Term}} VDD$$

where $R_{term}$ represents the resistance of the termination circuit 620. In an example implementation, $R_{term}$ varies from 34 ohms to 240 ohms and $R_{PD}$ varies from 10 ohms to 40 ohms. Thus, an input data signal at the receiver device 604 may have small voltage swings (e.g., approximately 60 mV) and large voltage swings (e.g., approximately 0.7 V) representing an encoded data pattern on the input data signal. That is, an input data signal may be encoded with a data pattern that can be decoded into bits of data.

Bus lines, such as bus line 630, can be reflective due to impedance mismatch points on the channel. As a result, ISI may increase as the data transfer rates increase because of spreading of data pulses. A reflection dominated channel may have a reduced data eye at the DRAM ball (e.g., input of the DRAM package) due to the effects of insertion loss (such as that of the channel 630) and reflections. As noted above, termination circuit 620 provide for impedance matching so to reduce signal reflections; however, termination circuit 620 may not be able to remove all reflections perfectly in part because of the many inevitable discontinuities in the channel, imperfections in terminations, and wideband characteristics of the signal.

Accordingly, receiver device 604 is configured to utilize equalization to improve (e.g., open up) data eyes after the input data is latched by the receiver device 604. FIG. 6 illustrates a n-tap DFE subsystem 646 that can be implemented to equalize input data signals without amplifying noise on the channel due to insertion loss and reflections, which is a common side effect of other equalization techniques (such as, for example, CTLE). The n-tap DFE subsystem 646 comprises of the input receiver 640 operating as a gain amplifier, a DFE summer 642, a n number of taps 644a-n with outputs that loop back to the DFE summer 642, and a coefficient multiplier 648 for each DQ slicer. Gain amplification at the input receiver 640 can be used to ensure that the cursor or the most recent bit is in a congruent relationship with equalization required for the channel. Taps 644a-n may be implemented as slicers configured to detect a bit of data encoded on an input data signal. The coefficient multiplier 648 for each tap 644a-n provides corrections needed to the most recent bit by adding or subtracting the effects of ISI of previous bits.

Figure 7A:
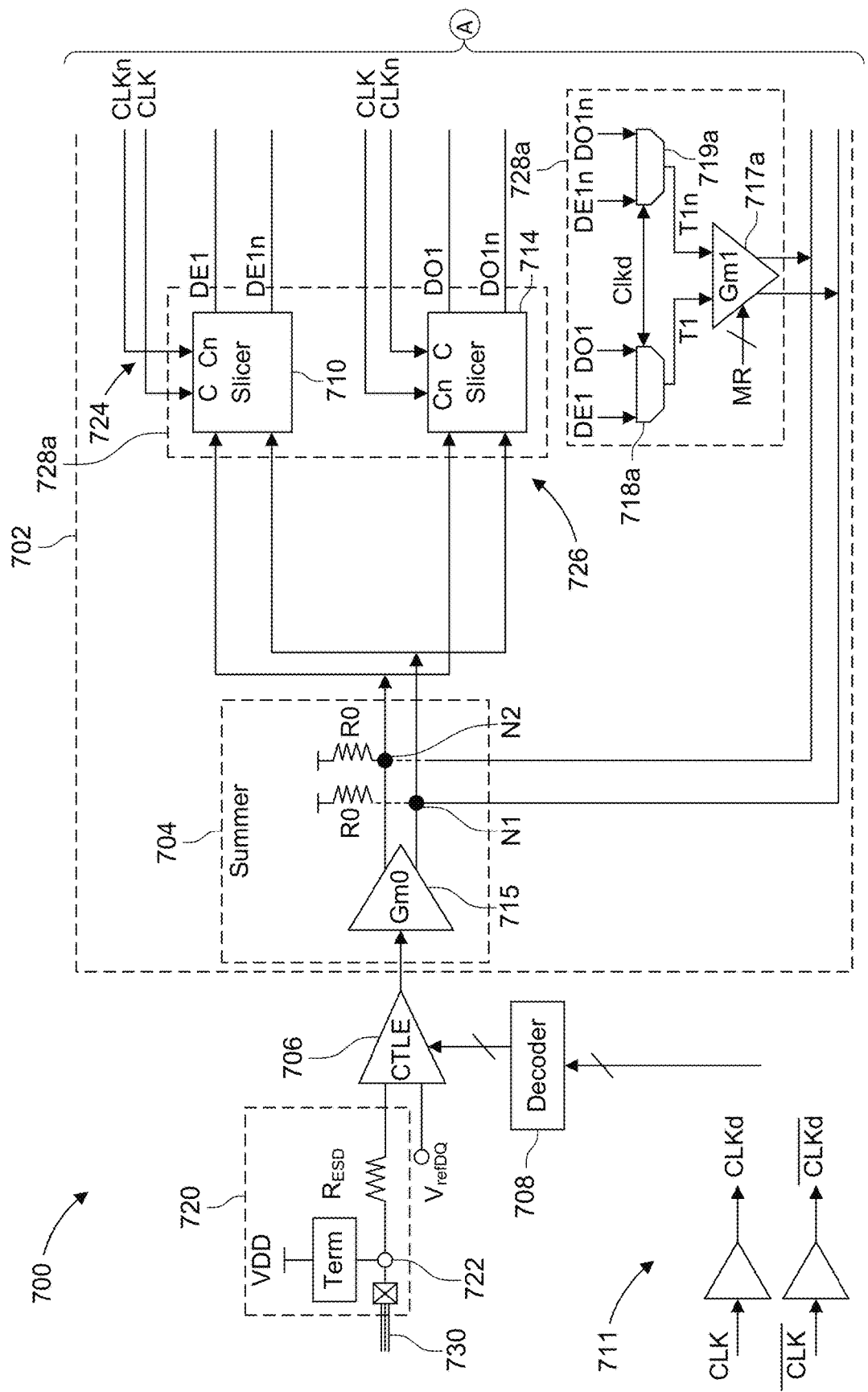
FIGS. 7A and 7B illustrate a circuit implementation of an example receiver device in accordance with embodiments of the disclosed technology.
Figure 7B:
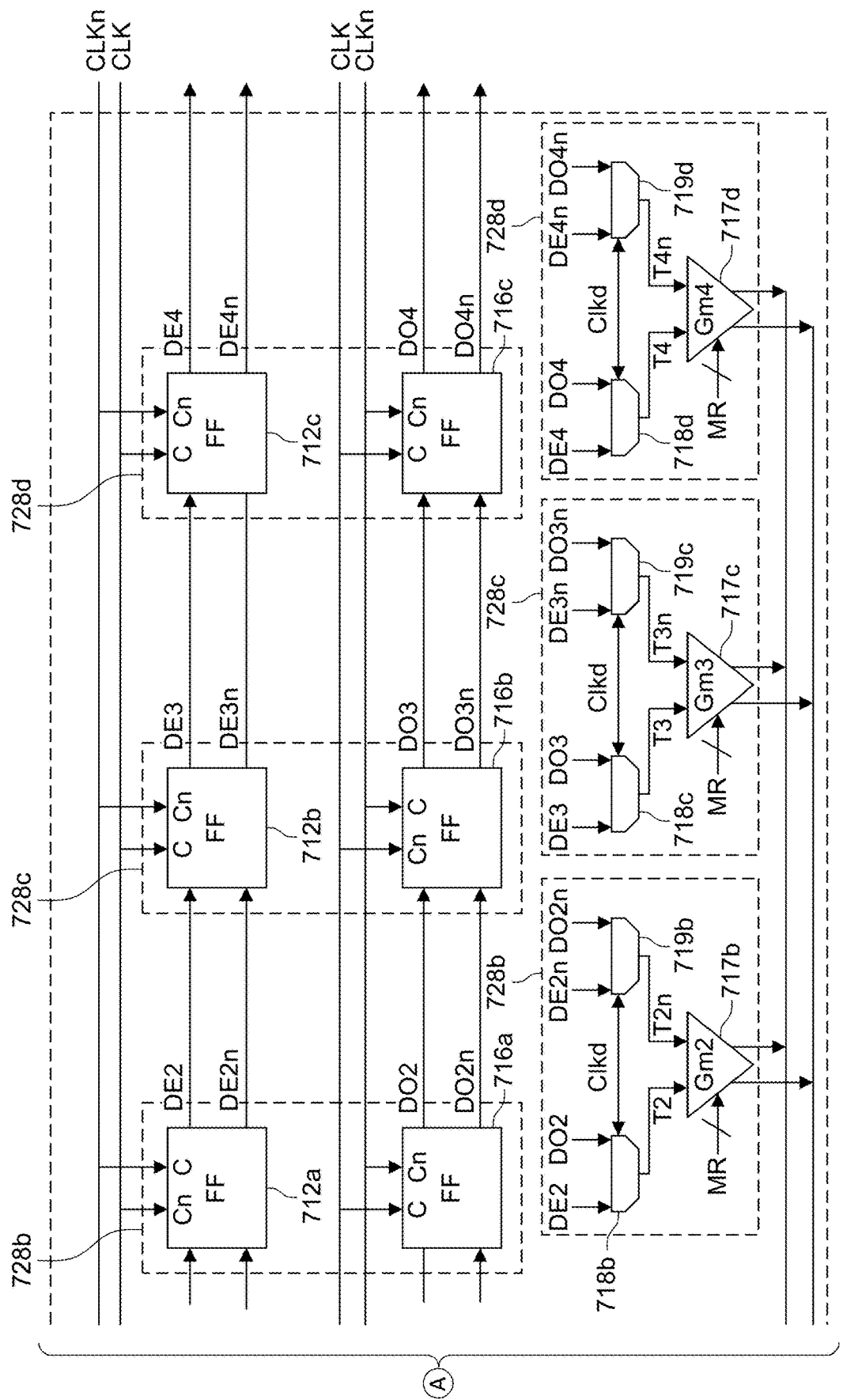

FIGS. 7A and 7B illustrate a circuit implementation of an example receiver device 700 in accordance with embodiments of the disclosed technology. Receiver device 700 comprises an I/O pad 722 connected to bus line 730 forming a channel to a transmitting device, over which an input data signal is detected by the receiver device 700. The input data signal can comprise a data pattern encoded thereon comprising a bits of data that can be detected as a plurality of consecutive pulses and latched by receiver device 700. Each pulse may be representative of bit of data of the data pattern. A termination circuit 720 is connected to the I/O pad 722 for impedance matching. The I/O pad 722, bus line 730, and termination circuit 720 may be substantially similar to the I/O pad 622, bus line 630, and termination circuit 620 of FIG. 6, respectively.

Receiver device 700 also comprises a compensation circuit connected to the termination circuit 720. The compensation circuit comprises a first equalization circuit 706 and a second equalization circuit 702. The first equalization circuit 706 is configured to apply amplification to the input data signal so to generate a first compensated data signal as an output. The second equalization circuit 702 is connected to the output of the first equalization circuit 706 so to receive the first compensated signal and output a second compensated data signal. The second equalization circuit 702 is configured to adjust a first pulse representative of a bit of the data pattern encoded in the input signal based on one or more previously detected pulses of the input signal.

In the illustrative example of FIGS. 7A and 7B, the first equalization circuit 706 is provided as a CTLE and will be referred to herein as CTLE 706, and the second equalization circuit 702 is provided as a DFE architecture and will be referred to herein as DFE architecture 702. A first input of the CTLE 706 is connected to the termination circuit 720 is connected to an input terminal of a CTLE 706 and a second input terminal of the CTLE 706 is connected to a reference voltage Vref. The output terminal of the CTLE 706 is connected to DFE architecture 702. The DFE architecture 702 comprises a summer circuit 704 that receives an outputs from the CTLE 706. Outputs from the summer circuit 704 drive a plurality of taps 728a-d (collectively referred to as taps 728), which span a first data path 724 and a second data path 726. The first data path 724 may be used for obtaining even bits of data on the input data signal and the second data path 726 may be used for obtaining odd bits of data. The first data path 724 comprises a slicer 710 and a first plurality of flip-flops 712a-712c. The second data path 726 comprises a slicer 714 and a second plurality of flip-flops 716a-716c. Obtained bits of data are provided to multiplexers 718a-d and 719a-d, which are supplied to a multipliers 717a-d, respectively. Outputs from the taps 728 are fed back to the summer 704 for summation (e.g., adding or subtracting) with the output form summer 704 and driving the first and second data paths 724 and 726. The example shown in FIGS. 7A and 7B illustrates a 4 tap DFE architecture; however the present disclosure is not limited to 4 taps. Any number of taps may be used, for example, 2, 4, 5, etc.

In the illustrative example of FIGS. 7A and 7B, analog equalization of the receiver device 700 is realized by the CTLE 706 and the DFE circuit topology 702. For example, the CTLE 706 receives an input data signal (e.g., a pattern of voltage swings) from the termination circuit 720 and Vref from a voltage generation circuit (e.g., voltage generation circuit 518 of FIG. 5). In some embodiments, the CTLE 706 generates a transfer function that inverts the frequency response characteristics of the channel and applies the transfer function output from the termination circuit 720. For example, the CTLE 706 generates the inverse of the channel frequency response so that the product of the transfer functions with the input data signal has a relatively flat magnitude up to the Nyquist frequency (e.g., as shown in FIG. 14). Thus, the CTLE 706 is configured to boost the channel response of high-frequency data signals. However, signal-to-noise ratio (SNR) tradeoffs in CTLE design may only allow for partially flattening of response, which can be addressed using DFE architecture 702 to perform further equalization. Since inverse data signals (e.g., DQn) are received at the same rate of data signals (e.g., DQ), the DFE architecture 702 utilizes a half-rate architecture provided as the first data path 724 for obtaining even bits of data and the second path 726 for obtaining odd bits of data in the data signal. This configuration avoids needing to use a strobe multiplier. which would require a relatively large area and power, with increase jitter and uncertainty of the output strobe that drives the slicers. Multiplexers 718a-n and 719a-n select between the even and odd obtained bits based on whether equalization is being applied to an even or an odd bit of incoming data, which are used to drive slicers 710 and 714 and flip-flops 712a-n and 716a-n. A delayed version of a clock signal (e.g., DQS clock signal) is used for selection by the multiplexers 718a-n and 719a-n in order remove glitches at the input of taps.

The operation of the receiver device 700 will be now provided in more detail. The input data signal is provided to the CTLE 706 as a voltage, which may include a voltage swing dependent on a received data pattern. The CTLE 706 receives command codes from a controller for enabling the CTLE 706 and setting gain to be applied by the CTLE 706. In the example of FIGS. 7A and 7B, the control signals are communicated as Mode Register (MR) settings, which are provided to decoder 708 (e.g., decoder circuit 216) as binary command codes for controlling the functionality of the CTLE 706 (along with DFE architecture 702). The decoder 708 converts binary command codes, specified by the MR setting, to a representation consumable by the CTLE 706 (or other components of the receiver device 700). MR settings (e.g., MR[i]) indicate commands for a desired mode (or state) of operation to which the command code is supplied. In the case of the CTLE 706, the MR settings are provided, for example, as a digital code sent by the logic control circuit 506 to the decoder 708, which includes commands to enable equalization (e.g., a global enable) and programming of the gain supplied by the CTLE 706. The MR setting are converted by the decoder 708 to a command code that is input into the CTLE 706. The command codes may include a global enable command code to enable CTLE 706 and DFE architecture 702 and command bits to program gain bias at the CTLE 706 (e.g., settings to set configurations of the CTLE 706 to provide desired gain). According to examples disclosed herein, the CTLE 706 is configured to apply a fixed boost component with an adjustable gain component to the input data signal. The command codes, specified by the MR setting, are used to program the gain. For example, the CTLE 706 may be configured to apply a 4 dB boost to the input signal and a gain that is adjustable between a lower gain (e.g., −6 dB as an illustrative example) to an upper gain (e.g., 6 dB as an illustrative example). The fixed boost component is relatively small, such that the fixed boost component is less than the upper gain. Dedicated bits in the command code are ingested by the CTLE 706 and used to drive the CTLE 706 and adjust the gain.

The CTLE 706 outputs a voltage to the summer circuit 704. The summer circuit 704 includes a transconductance block 715 and resistors R0. Summer circuit 704 sums the input signal from the CTLE 706 multiplied by a constant transconductance (gm) applied by the transconductance block 715. The transconductance block 715 may be constant, meaning that it need not be adjustable. That is, the voltage input into summer circuit 704 is multiplied by the constant transconductance of the transconductance block 715, and the output voltage appears at the differential nodes N1 and N2 based on current supplied to resistors R0. For example, currents are forced into the differential node N1 and N2 from the summer circuit 704. These currents flow into respective resistors R0 such that a differential voltage (e.g., the difference between two voltage levels of Vin,1 and Vin,2) appears across the differential nodes N1 and N2. If there is no other current from taps 728, the voltage levels at the differential nodes N1 and N2 will be the input voltage from CTLE 706 multiplied by the transconductance of the transconductance block 715 times the resistance of resistors R0.

Multipliers 717a-d (collectively referred to as multipliers 717) of taps 728 are configured to supply a feedback current based bits of data obtained by the taps 728. The multipliers 717 operate to source an adjustable amount of current to the differential node N1 and N2, which is added or subtracted from the current output by the transconductance block 715. The total current at the differential node N1 and N2 is summed up by the summer circuit 704 and flows into resistors R0. Multipliers 717 apply gain factors, programmed by MR setting, to obtained bits of data, which sink or source current from the differential nodes N1, N2. The resultant current is multiplied by resistors R0 and a resultant differential voltage will appear at the differential nodes N1 and N2.

Essentially, DFE architecture 702 generates a feedback current to the summer circuit 704 to equalize the channel response at the receiver device 700 and remove ISI from a current bit of a data pattern based on feedback obtained using number of preceding bits of data of the data pattern. In the case of the example 4-tap DFE architecture 702 of FIGS. 7A and 7B, the equalization for a pulse representing a current bit is performed using a feedback current that is based on four preceding bits. For example, for a current (or most recent) even bit of data, the feedback current is based on four bits of data that preceded the current even bit. Similarly, for a current odd bit of data, the feedback current is based on four bits of data that preceded the current odd bit. Multipliers 717 apply gain factors (also referred to herein as multiplication factors) to sink or source current based on each bit of data to generate the feedback current, which is supplied to the differential nodes N1 and N2 to equalize the channel and removes ISI from the current bit. Each multiplier 717 can be implemented as a current-mode digital-to-analog converter (DAC). A DAC value for a given multiplier can be adjusted during training to produce a fixed current, for example, Ix. If an input bit to a multiplier is at a logic high level (e.g., 1), the multiplier can function to sink Ix from the summer circuit 704. If the input bit to the multiplier is logic low level (e.g., zero), the multiplier can function to sink −Ix from the summer circuit 704.

Figure 8:
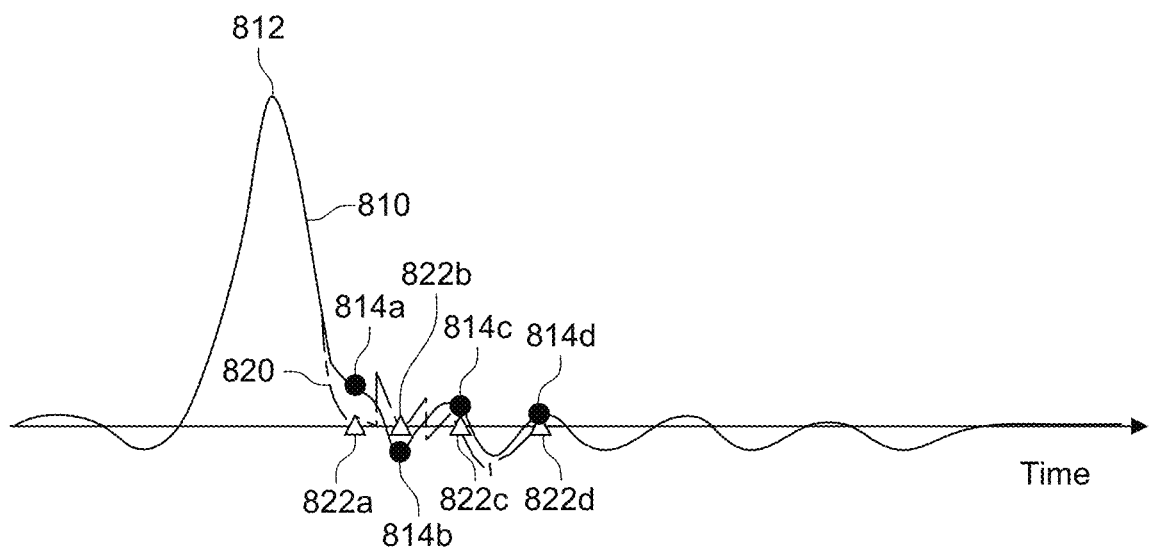
FIG. 8 illustrates an example input pulse simulated by a receiver device without equalization and with equalization.

FIG. 8 illustrates an example input pulse without equalization and with equalization. FIG. 8 shows an input pulse response waveform 810 on a receiver device (e.g., receiver device 700) upon detecting an input pulse signal without equalization. Peak 812 represents the pulse of a current bit of data and peaks 814a-814d represent ISI. FIG. 8 also shows a pulse response waveform 820 of an input data signal with equalization. Pulse response waveform 820 retains the peak 812 with reduced signal degradation by minimizing (or removing) peaks 814a-814d through equalization that reduces the receiver devices response at peaks 814a- to to points 822a-822d. For example, a feedback current generated by receiver device 700, based four preceding impulses (or bits of data), can be used to counter the reflection peaks 814a-d and equalize the response signal.

Returning back to FIGS. 7A and 7B, each slicer 710 and 714 receives differential voltages from differential nodes N1 and N2 as inputs. Slicers 710 and 714 operate as comparators and output a logic level responsive to a comparison of the two voltage levels. For example, if the voltage level at differential node N1 is greater than the voltage level at the differential node N2 slicers 710 and 714 will output a logic high level (e.g., "1"). Alternatively, if the voltage level at differential node N1 is greater than the voltage level at the differential node N2 slicers 710 and 714 will output a logic low level (e.g., "0"). For example, a clock signal (CLK) and an inverse clock signal (CLKn) are input into each slicer 710 and 714 and an input data signal is encoded on both rising and falling edges of a clock signal. Slicer 710 can then sample the input voltage levels at the differential nodes N1 and N2 on a rising edge of the CLK signal, while slicer 714 samples the input voltage levels at a falling edge of the CLK signal. Thus, slicer 710 obtains and holds an even bit DE1 (and its inverse DE1n based on sampling the CLKn signal) of the input signal and the slicer 714 samples an odd bit DO1 (and its inverse DO1n). According to various embodiments, slicers 710 and 714 can be analog comparators because the voltage swing at the differential nodes N1 and N2 may be small (e.g., on the order of tens of millivolts and even down to a few millivolts).

Flip-flops 712a-c and 716a-c operate in a manner similar to slicers 710 and 714, respectively, and obtain a number of bits that are subsequent to the bit obtained by slices 711 and 714 on the bit pattern. That is, for example, if a pulse to be equalized represents an odd bit, then flip-flops 716a-c operate to latch three odd bits that immediately preceded the bit obtained by the slice 714 in the data pattern. In the case where a pulse to be equalized represents an even bit, then flip-flops 712a-c operate to latch three odd bits that immediately preceded the bit obtained by the slice 710 in the data pattern. For example, flip-flop 712a samples the input voltage levels at a rising edge, thereby obtaining and latching an even bit DE2 (and its inverse DE2n) that preceded the bit obtained by the slicer 710. Flip-flop 716a samples the input voltage levels at the falling edge, thereby obtaining and latching an odd bit of data DO2 (and its inverse DO2n) that preceded the odd bit obtained by slicer 714. Flip-flop 712b samples the input voltage levels at a rising edge and latches a third even bit DE3 (and its inverse DE3n) and flip-flop 716b samples the input voltage levels at a falling edge to latch a third odd bit of data DO3 (and its inverse DO3n). Flip-flop 712d samples the input voltage levels at a rising edge and latches a fourth even bit DE4 (and its inverse DE4n) and flip-flop 716d samples the input voltage levels at a falling edge to latch a fourth odd bit of data DO4 (and its inverse DO4n). In this way, while slicers 710 and 714 obtain a first even or odd bit of data that preceded a current input pulse, respectively, and flip-flops 712a-c and 716a-c operate to latch three preceding even or odd bits of data, respectively.

The sampled data is then supplied to multiplexers 718a-d and 719a-d for driving multipliers 717a-d. More particularly, data sampled by a given tap 728 is provided to the multiplexers 718 and 719 corresponding to the given tap 728. Multiplexers 718 and 719 are driven by a delayed version of the CLK signal (Clkd) to remove glitches from the signal path and selects between even or odd bits of data based on the state of the clock (e.g., logic high or logic low). For example, as shown in FIGS. 7A and 7B, DE1 and DO1 obtained by slicers 710 and 714 are provided to multiplexer 718a and DE1n and DO1n obtained by slicers 710 and 714 are provided to multiplexer 719a to generate signals T1 and T1n, respectively. When Clkd is at a logic high level (e.g., 1), multiplexer 718a selects DE1 and multiplexer 719a selects DE1n, which are provided to multiplier 717a to drive the transconductances of the multiplier 717a. This can occur every other cycle, e.g., when Clkd is at logic high level, the feedback multiplier is fed by data from slicer 710. Alternatively, when Clkd is at a logic low level (e.g., 0), multiplexer 718a selects DO1 and multiplexer 719a selects DO1n, which are provided to multiplier 717a (e.g., when Clkd is at logic low level, the feedback multiplier can be fed by data from slicer 714). Operation of taps 728b-d operate according to similar principles to drive the corresponding multipliers 717b-d.

Multipliers 717a-d apply respective gain to input signals according to a respective gain factor. The gain factors can be set, for example, according to command codes obtained in the MR settings selected upon boot up of the receiver device 700. The gain factor for each multipliers 717, which can be determined in advance through training, is based on channel characteristics. For example, during training, a training signal can be detected by receiver device 700, a response signal observed, and the gain factor for each multiplier 717 can be adjusted to optimize the gain of each multiplier. Referring to FIG. 8 as an example, a gain factor for multiplier 717a can be adjusted to remove the peak 822a, and then a gain factor for multiplier 717b can be adjusted to remove the peak 822b, and so on.

The multipliers 717 each output a respective feedback current that is collectively supplied to the summer circuit 704. FIGS. 7A and 7B depict T1-T4 and T1n-T4n, which are digital values define the direction of the output (feedback) current in the respective multiplier 717. The feedback current is summed with the current for a most recent pulse (e.g., most recent bit), which operates to equalize the channel and removed ISI from the channel response.

Figure 9A:
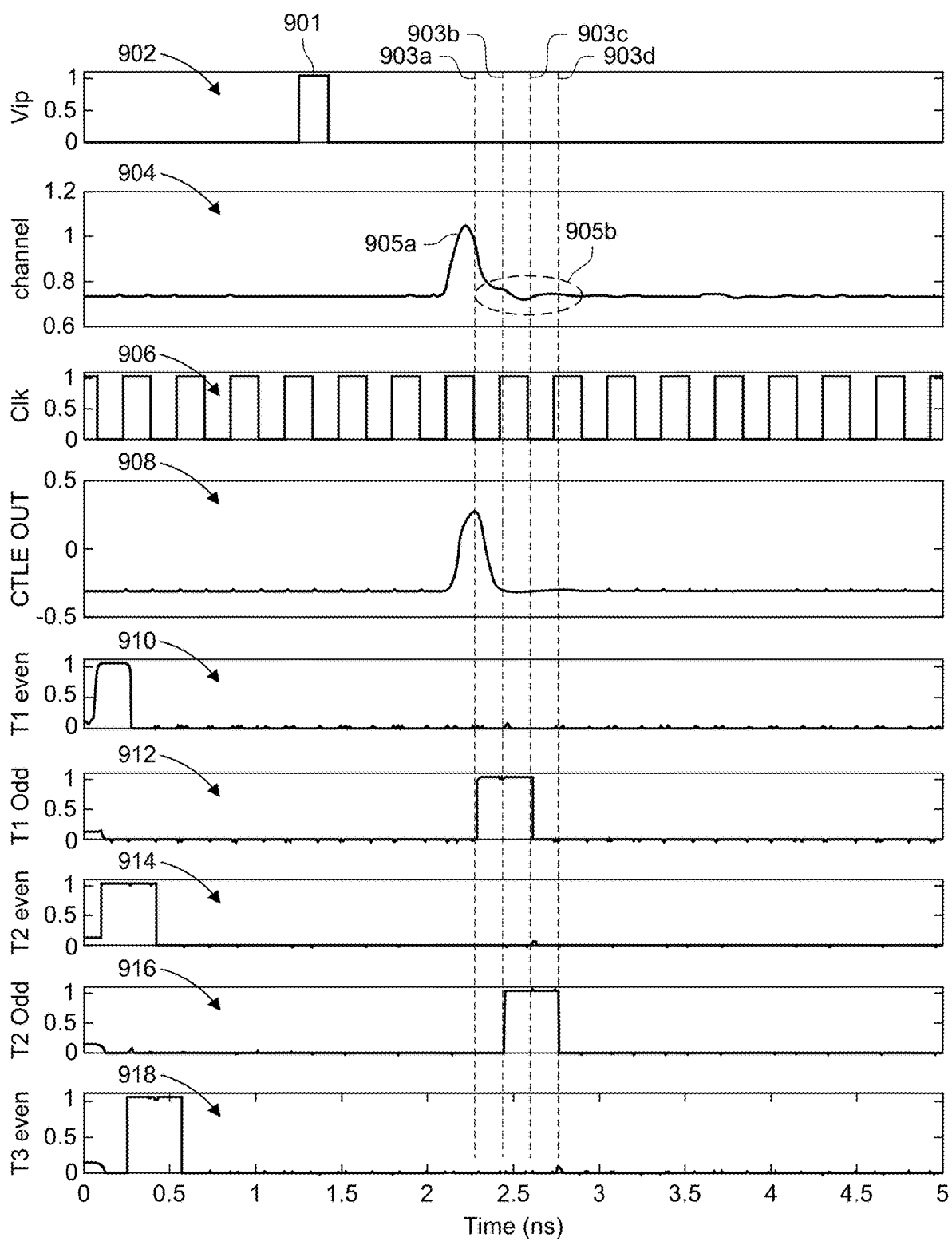
FIGS. 9A and 9B depict waveforms of outputs that can be generated during operation of the receiver device of FIGS. 7A and 7B in accordance with the present disclosure.
Figure 9B:
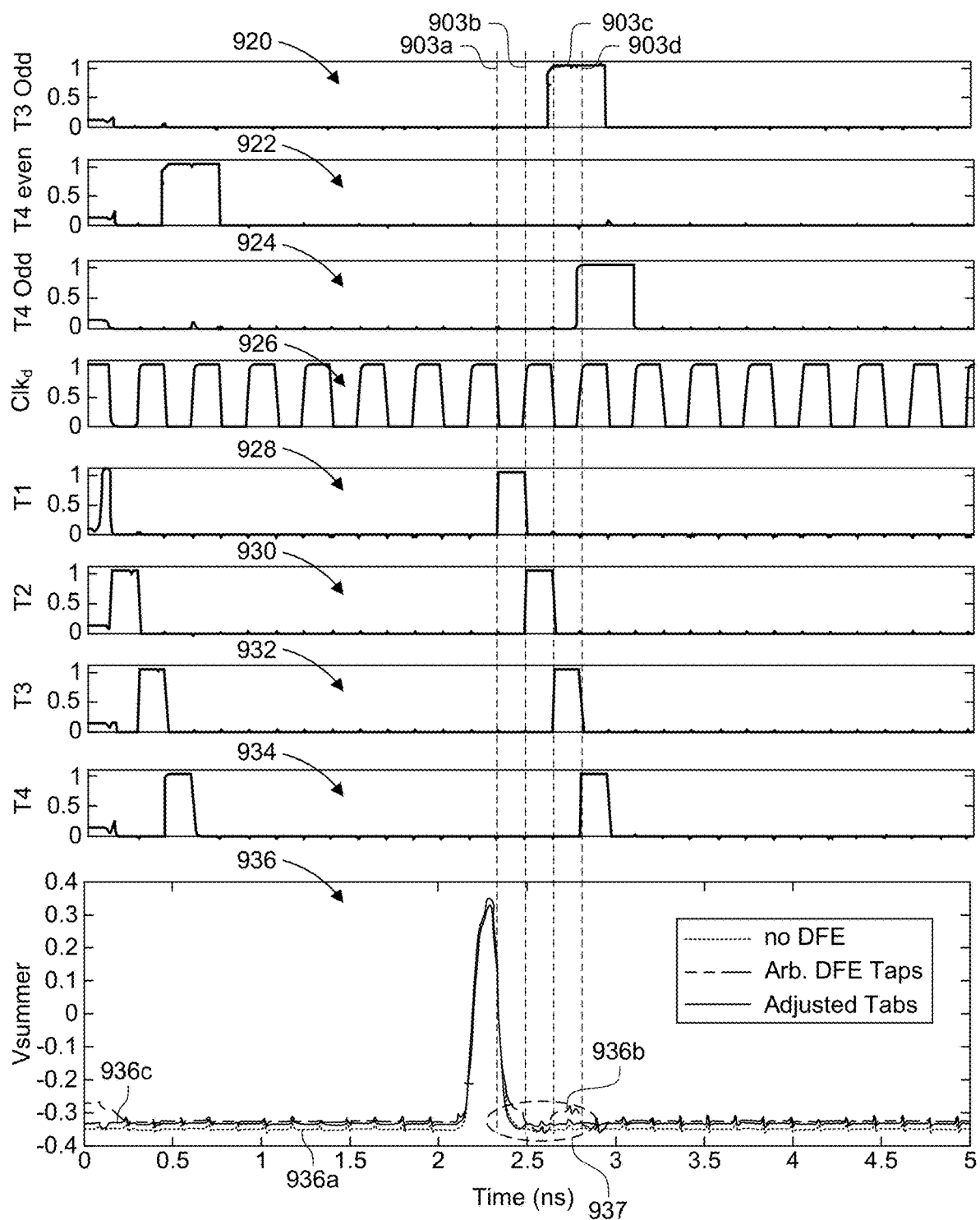
Figure 10A:
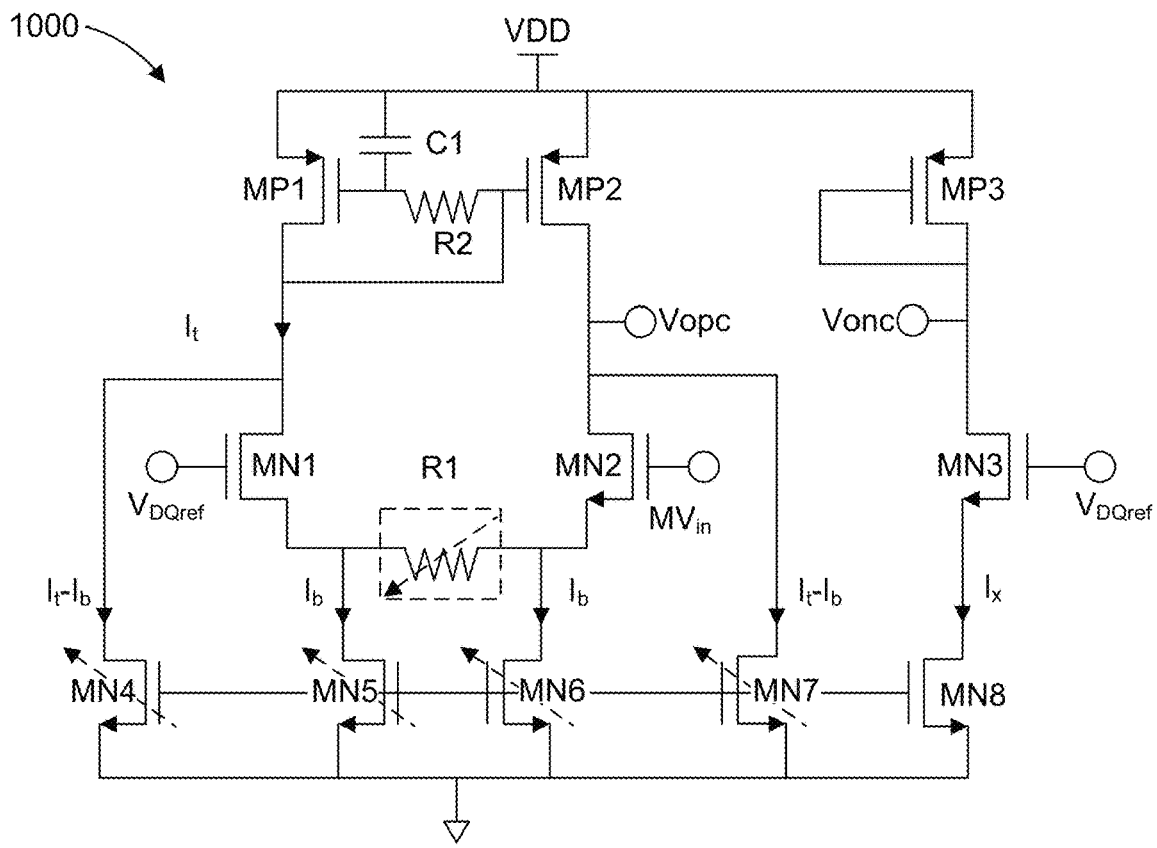
FIGS. 10A-10E are schematic diagrams of an example continuous-time linear equalizer (CTLE) circuit according to an embodiment of the disclosed technology.
Figure 10B:
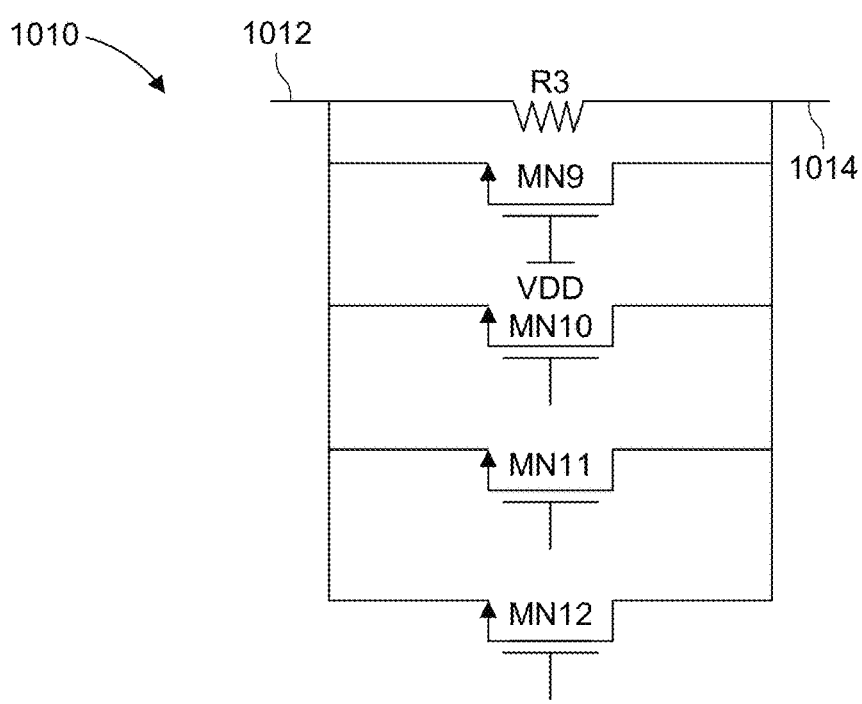
Figure 10C:
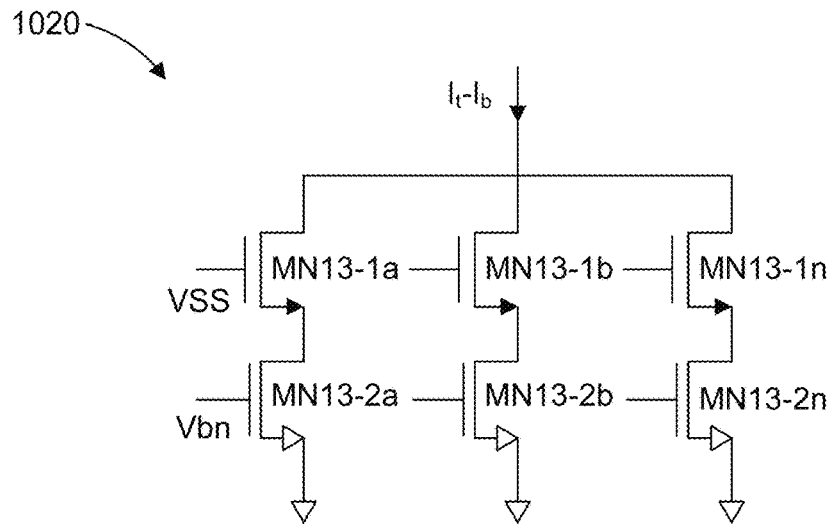
Figure 10D:
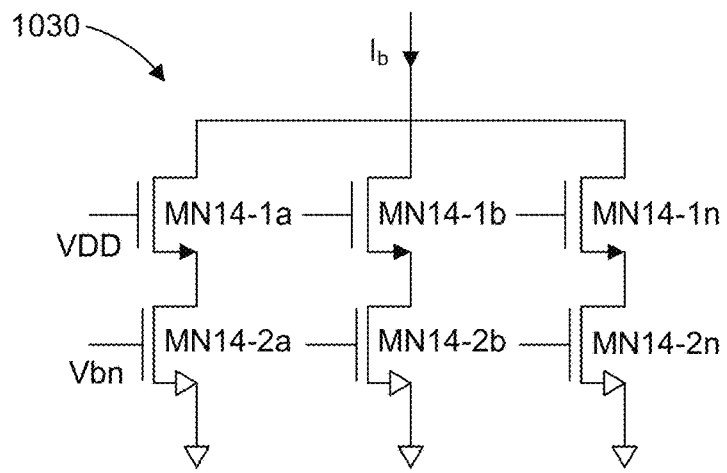
Figure 10E:
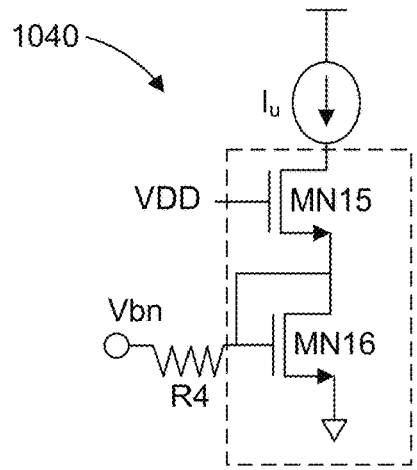

FIGS. 9A and 9B depict waveforms of outputs that can be generated during operation of the receiver device 700 in accordance with the present disclosure. FIGS. 9A and 9B includes guide lines 903a-d that illustrate temporal commonality between features of the each waveform.

Waveform 902 is an example of single data pulse to be transmitted by a transmitting device. Waveform 902 includes a single pulse 901 representing a bit (or symbol) of data. Waveform 904 is an example of the channel response of waveform 902 on the channel 730. Waveform 904 includes a pulse response 905a and ISI 905b. Waveform 906 is an example CLK signal at the receiver device 700, such as a DQS signal in some embodiments. Waveform 908 is an example of the output from CTLE 706, for example, input into summer circuit 704. As described above, the CTLE 706 operates to provide a fixed boost component and adjustable gain component that flattens the response. Thus, the CTLE 706 operates to reduce the impact of channel loss 905b from the channel response waveform 906.

Waveforms 910-924 are example of output signals the first and second data paths 724 and 726. For example, waveform 910 is an example of the signal output from the slicer 710 of first data path 724, which samples the waveform 902 at a rising edge of waveform 906 to produce waveform 910. In the simulated example of FIGS. 9A and 9B, the input pulse may represent an odd bit of data and thus slicer 710 obtains a logic low level. Waveforms 910, 912, 914-924, and 928-936 each depict initial values stored in slice 710 and/or flipflops 712 before clocking begins. After clocking begins, a logic level (e.g., high or low logic level depending on the input pulse) is detected and written in each waveform until the input pulse arrives at the respective slicer 710 and/or flipflops 712. Waveforms 914, 918, and 922 are examples of the signal output from the flip-flops 712a-c of first data path 724. Similar to slicer 710, flip-flops 712a-c also sample the input signal at the rising edge, and, thus, latch logic low levels as well. Waveform 912 is an example of the signal output from the slicer 714 of second data path 726, which sample the waveform 902 at a falling edge of waveform 906 to produce waveform 912, as shown by guide line 903a. Thus, slicer 714 obtains a logic high level, which is held until a subsequent sampling at the next falling edge of waveform 906 (e.g., guide line 903c). Similarly, waveforms 916, 920, and 924 are examples of the signal output from the flip-flops 716a-c of second data path 726 which also latch a logic high level on sequential falling edges of the waveform 906 as shown by guidelines 903b, 903c, and 903d, respectively. In other words, the same single data is essentially shifted in the of the odd path (e.g., second data path 726).

As explained above, the outputs from each slicer and flip-flop are provided to multiplexer that selects the proper data to drive a multiplier and generate feedback current at the differential nodes. Waveforms 928-934 are examples outputs from multiplexers 718. In the waveforms of FIGS. 9A and 9B, since the bit in question is an odd bit, multiplexers 718 select outputs from the second data path 726 sampled at the falling edge of a delayed clock waveform 926.

Plot 936 illustrates multiple waveforms 936a-c that are output from summer circuit 704 at the differential nodes N1 and N2, based on feedback current from multipliers 717. Waveform 936a is an example waveform in a case without equalization, waveform 936b is an example waveform in a case with equalization using arbitrary gain factors applied by the multipliers 717, and waveform 936c is an example waveform in a case with equalization using optimized gain factors applied by the multipliers 717. As can be seen in region 937, waveform 936c provides for reduced reflections as compared to waveform 936b or 936a. That is, the waveform 936c has a flatter, most consistent channel response than the other waveforms.

FIGS. 10A-10E are schematic diagrams of an example CTLE circuit 1000 according to an embodiment of the disclosed technology. CTLE circuit 1000 is an example implementation of CTLE 706 of FIGS. 7A and 7B. The CTLE circuit 1000 is configured to support a range of voltage swings by providing a programmable (e.g., adjustable) gain, which can provide at least some linear equalization on the input signal (e.g., as shown in waveform 908).

CTLE circuit 1000 comprises a plurality of metal-oxide-semiconductor field-effect transistors (MOSFET), resistors and a capacitor. For example, CTLE circuit 1000 comprises transistors MP1, MP2, and MP3, which may be p-channel MOSFET (pMOS transistors) or another suitable semiconductor device. A high voltage VDD is connected to source terminals of MP1, MP2, MP3, and first plate of capacitor C1. Gate terminal of MP1 is connected to a second plate of capacitor C1 and to a first terminal of resistor R2. Gate terminal of MP2 is connected to a second terminal of resistor R2. Gate terminal of MP3 is connected to its drain terminal and to node Vonc at which a first output voltage level is provided. For example, node Vonc can be connected to summer circuit 704.

CTLE circuit 1000 also comprises transistors MN1-MN26, which may be n-channel MOSFET (nMOS transistors) or another suitable semiconductor device. For example, a drain terminal of MN1 is connected to the drain terminal of MP1 and gate terminal of MP2. Drain terminal of MN1 is also connected to the drain terminal of MN4. Source terminal of MN1 is connected to the drain terminal of MN5 and a first terminal of resistor R1. Drain terminal of MN2 is connected the drain terminal of MP2, drain terminal of MN7, and a node Vopc at which a second output voltage level is provided. For example, node Vopc can be connected to summer circuit 704. Source terminal of MN2 is connected to second terminal of resistor R1 and drain terminal of MN6. Gate terminal of MN2 is connected to a voltage Vin, for example, from termination circuit 720. Voltage Vin may be the input data signal provided to the CTLE circuit 1000, which may comprise a data pattern encoded into the single via voltage swings. Drain terminal of MN3 is connected to the drain terminal of MP3 and its source terminal is connected to drain terminal of MN8. Gate terminals of MN1 and MN3 are connected to the reference voltage. Source terminals of MN4-MN8 are connected to ground and gate terminals are connected to each other.

Resistor R1 may be an adjustable resistor having a variable resistance, an example of which is shown as resistor 1010. Resistor 1010 can be utilized to maintain constant gain from the CTLE circuit 1000 regardless of the voltage swing. For example, higher voltage swings at the inputs may cause an increase in gain generated by the CTLE circuit 1000, and the resistance of resistor 1010 can be adjusted so to reduce the gain at the higher voltage swings, thereby providing a constant gain. Resistor 1010 comprises a resistor R3, which has its first terminal 1012 connected to the source terminal of MN1 and drain terminal of MN5 and its second terminal 1014 connected to the source terminal of MN2 and drain terminal of MN6. Resistor R3 is connected in series with MN9-MN12, such that source terminals of MN9-MN12 are connected to first terminal 1012 and drain terminals of MN9-MN12 are connected to second terminal 1014. Gate terminal of MN9 is connected to VDD, while gate terminal of MN10-MN12 are configured by command codes specific by MR settings. Thus, the resistance of resistor 1010 can be adjusted based on MR settings specifying which transistor of MN10-MN12 to turn.

Transistors MN4-MN7 (which may be referred to as input driver transistor) may be adjustable to produce adjustable currents $I_r$-$I_b$ and $I_b$, which translates to adjustability of the gain applied by the CTLE circuit 1000. Input driver circuit 1020 is an example implementation of MN4 and MN7 and input driver circuit 1030 is an example implementation of MN5 and MN6. Circuit 1020 comprise a plurality of transistors. For example, circuit 1020 comprises MN13-1a through MN13-1n having drain terminals connected to an input current from circuit 1000. In the case where circuit 1020 is implemented as MN4, drain terminals of MN13-1a through MN13-1n are connected to drain terminals of MN1 and MP1. In the case where 1020 is implemented as MN7, drain terminals of MN13-1a through MN13-1n are connected to drain terminals of MN2 and MP2. Source terminals of MN13-1a through MN13-1n are connected to drain terminals of MN13-2a through MN13-2n, respectively, and drain terminals of MN13-2a through MN13-2n are connected to ground. In an example, MN13-1a to MN13-1n and MN13-2a to MN13-2n each comprise eight transistors for a total of 16 transistors; however, other examples may use different numbers of transistors. A gate terminal of MN13-1a is connected to a low supply voltage VSS, gate terminal of MN13-2a through MN13-a-n are connected to voltage Vbn, and gate terminals of MN13-1a to MN13-1n receive bits from the MR register for adjusting gain of circuit 1020.

Input driver circuit 1030 similarly comprises a plurality of transistors. For example, circuit 1030 comprises MN14-1a through MN14-1n having drain terminals connected to an input current from circuit 1000. In the case where input driver circuit 1030 is implemented as MN5, drain terminals of MN14-1a through MN14-1n are connected to source terminal of MN1. In the case where 1030 is implemented as MN6, drain terminals of MN14-1a through MN14-1n are connected to source terminal of MN2. Source terminals of MN14-1a through MN14-1n are connected to drain terminals of MN14-2a through MN14-2n, respectively, and drain terminals of MN14-2a through MN14-2n are connected to ground. In an example, MN14-1a through MN14-1n and MN14-2a through MN14-2n each comprise eight transistors for a total of 16 transistors; however, other examples may use different numbers of transistors. A gate terminal of MN14-1a is connected to a high supply voltage VDD, gate terminals of MN14-1a through MN14- receive bits from the MR register for adjusting gain of circuit 1030, and gate terminals of MN14-2a through MN14-2n are connected to voltage Vbn. MN14-2a through MN14-2n may have varied widths so to provide the programmable gain of the CTLE circuit 1000.

Circuit 1040 is an example implementation of a unit cell for generating voltage Vbn. Circuit 1040 comprises a current source sourcing current $I_{ic}$, which flows into a drain terminal of MN15, which has a gate terminal connected to high supply voltage VDD. Source terminal of MN15 is connected to a drain terminal of MN16 and to a first terminal of resistor R4, which is also connected to a gate terminal of MN16. Thus circuit 1040 generates voltage Vbn at the second terminal of resistor R4, which can be connected to a gate terminal of MN13-2a of circuit 1020 and/or a gate terminal of MN14-2a of circuit 1030, for example. A source terminal of MN16 is connected to ground.

According to an example implementation, CTLE circuit 1000 operates to invert the channel. In other words CTLE circuit 1000 can provide an inverse transfer characteristic of the frequency response of the channel so that a resultant product of the transfer function (e.g., product of the channel's frequency response and the inverse) has a relatively flat magnitude up to the Nyquist frequency. In various implementations, such operation can be achieved by the CTLE circuit 1000 generating a fixed boost (e.g., the fixed boost component) that is applied to high-frequency components of the channel response on input data signals. The high-frequency boost can be the result of inductive behavior of R2, C1, and the transconductance of MP1 in circuit 1000. Since the transconductance of MP1 in circuit 1000 is constant, the high frequency boost is almost constant. Thus, implementations disclosed herein provide boost at high frequencies; matches the inverse loss profile of the channel with reasonable tolerance (e.g., 10% in an illustrative example, however other tolerances may be used depending on the desired application); provides minimal low-frequency loss to minimize noise accumulation; and provide linearity so that the equalizing transfer function acts as the inverse of the channel loss profile.

Furthermore, CTLE circuit 1000 according to various implementations may act as a buffer with wide input common-mode range, which can provide gain, especially when input voltage swing is small. CTLE circuit 1000 can provides a boost to compensate for small channel loss. While higher channel loss and distortions may be addressed using the DFE architecture, the boost and its frequency may be independent of the input swing.

The gain generated provided by CTLE circuit 1000 can comprise two components: adjustable gain for low frequency gain and a fixed boost for peaking gain minus the low frequency gain. A relatively small fixed boost (e.g., less than an upper gain of the adjustable gain component, for example, on the order of a few decibels, such as 4 dB in an illustrative example) may be used to improve performance for the high frequency components of the channel response, while avoiding unnecessary noise amplification for low loss channel cases. The fixed boost maybe adjusted by changing circuit parameters, but remains fixed during operation. The gain provided by the CTLE circuit 1000 may be adjustable in order to address variability and variations in channel characteristics. To provide for adjustable gain in CTLE circuit 1000, transistors MN4-MN7 (sometimes referred to herein as input driver transistors) may be adjustable (or programmable) by changing their respective transconductance (gm). Changing the transconductance can be achieved by adjusting the current on the drain terminal of an input drive transistor, while maintain a fixed current on the drain terminals of MP1 and MP2. As a result, the output DC operating point of the CTLE circuit and CTLE bandwidth can be held approximately constant.

To provide consistent operation of CTLE circuit 1000 across various swing ranges, the same digital bits that drive the corresponding DQ DAC can be utilized to control the gates of MN13-1b through MN13-1n and MN13-1b through MN13-1n. A large reference voltage Vref (generated by the DAC) corresponds to small voltage swing and a small reference Vref corresponds to large voltage swing. The CTLE circuit 1000 uses the command codes from the MR settings that drive the DQ DAC to change the effective resistance of resistor R1 for different voltage swing conditions. With a higher voltage swing that comes with smaller input common-mode (because the reference signal may be required to be in the midpoint of the actual single-ended signal), the gain tends to increase. To keep the gain constant, the effective resistance of resistor 1010 can be increased by leveraging the DAC bits in the MR settings to drive gate terminals of MN10-MN12.

The high-frequency boost of the CTLE is due to the zero introduced in the CTLE circuit 1000 by R2 and C1, as well as the transconductance MP1 and MP2. Since the transconductance of MP1 and MP2 are kept constant for various gains and substantially constant for various voltage swings, a consistent behavior is observed in the boost of the frequency response.

Figure 11A:
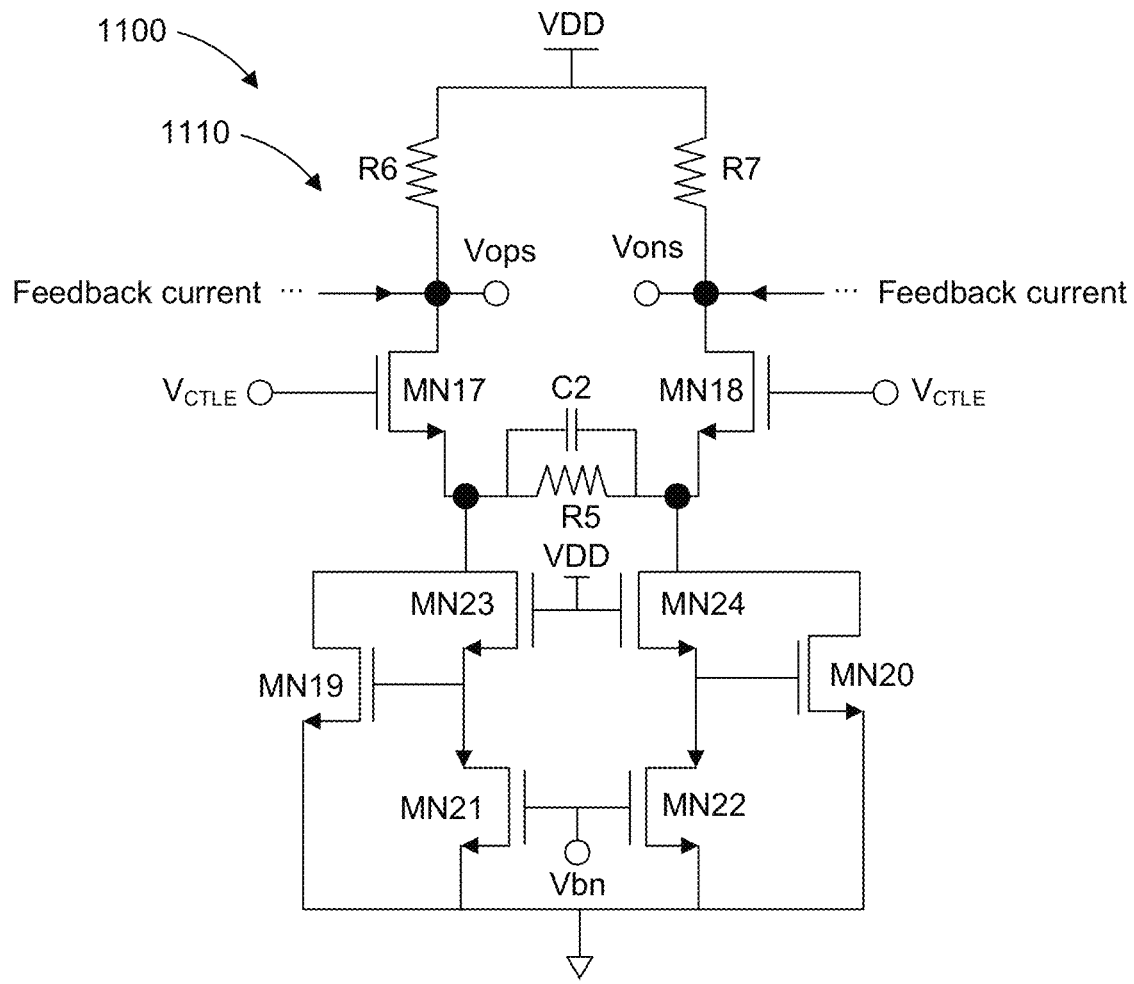
FIGS. 11A and 11B are schematic diagrams of an example summer circuit according to an embodiment of the disclosed technology.
Figure 11B:
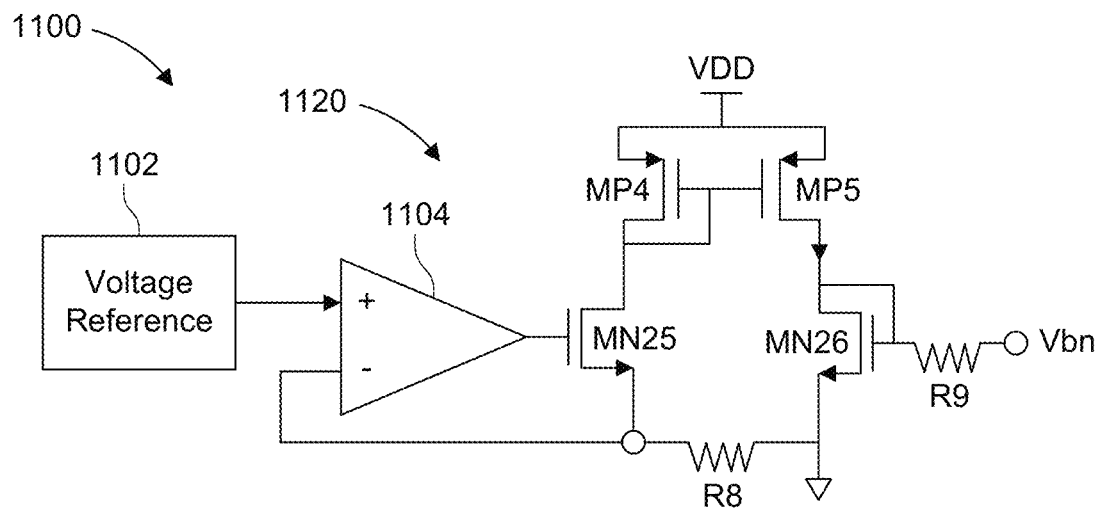
Figure 12A:
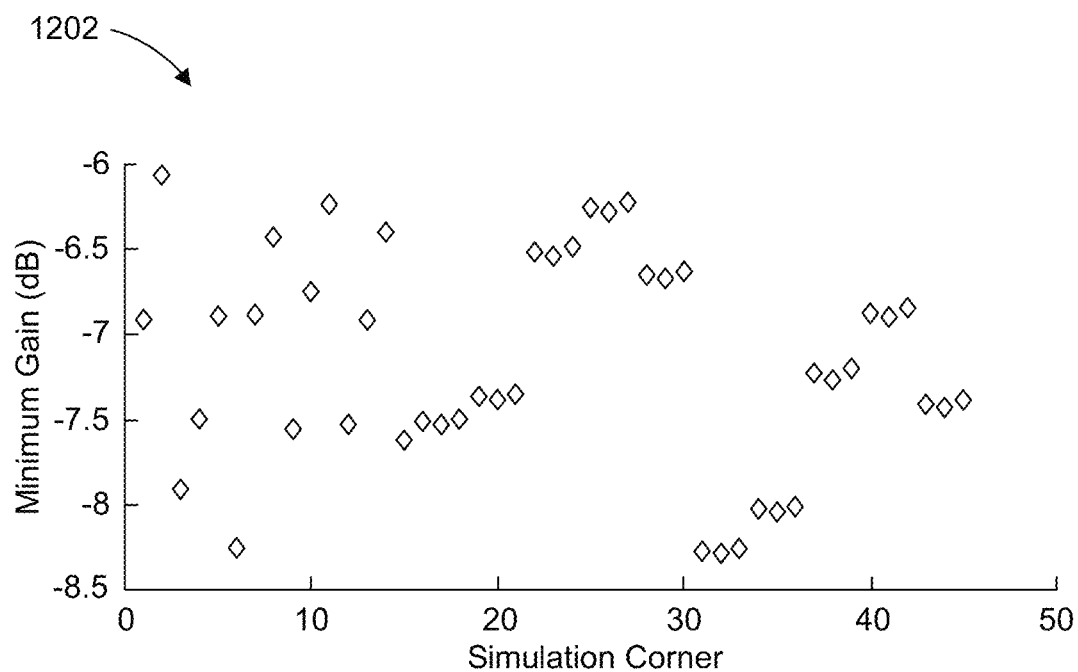
FIGS. 12A-12D and FIGS. 13A-13D depict AC simulation results in accordance with an example implementation of the present disclosure.
Figure 12B:
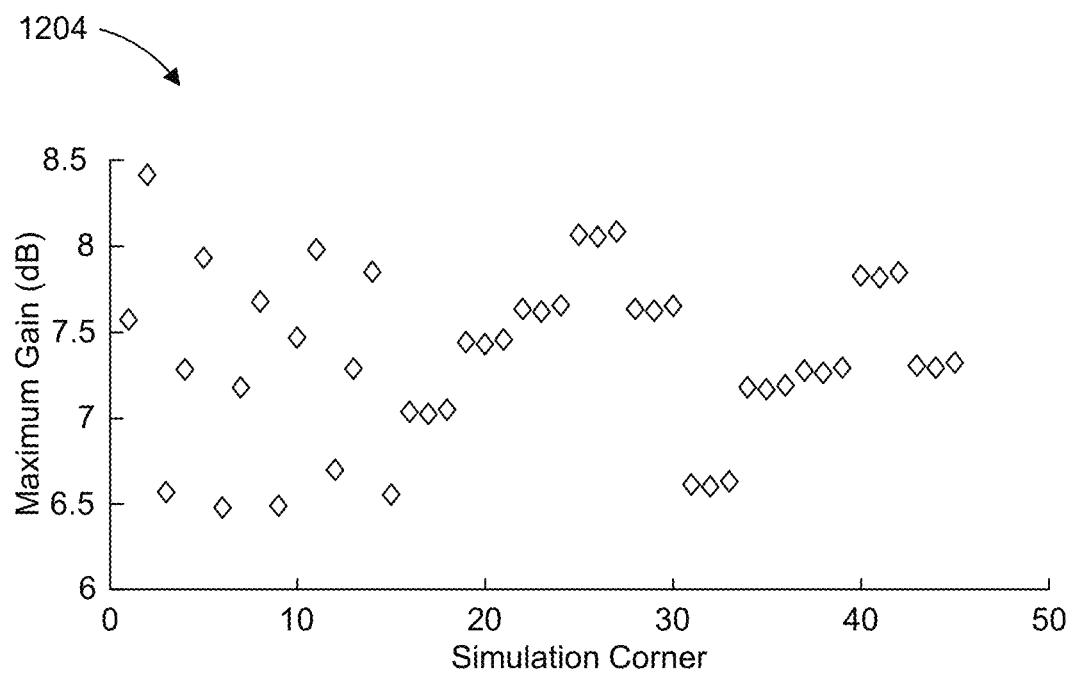
Figure 12C:
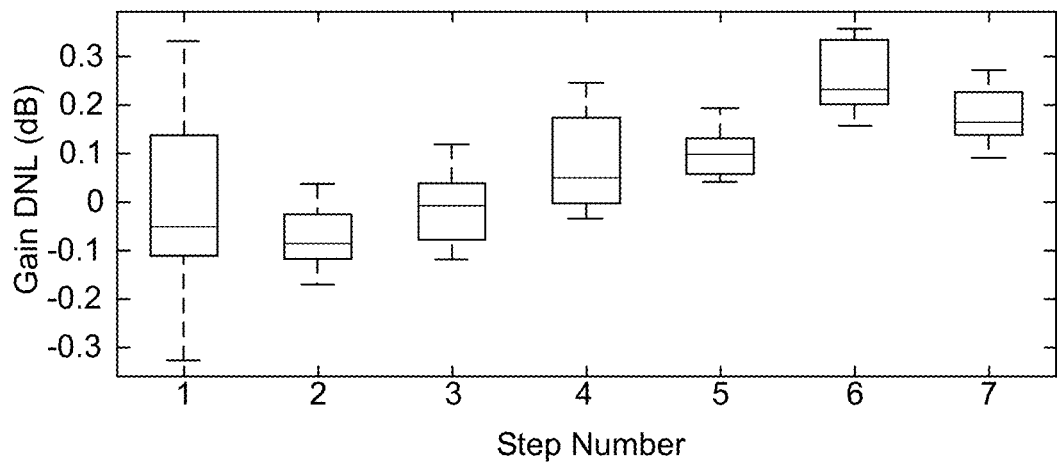
Figure 12D:
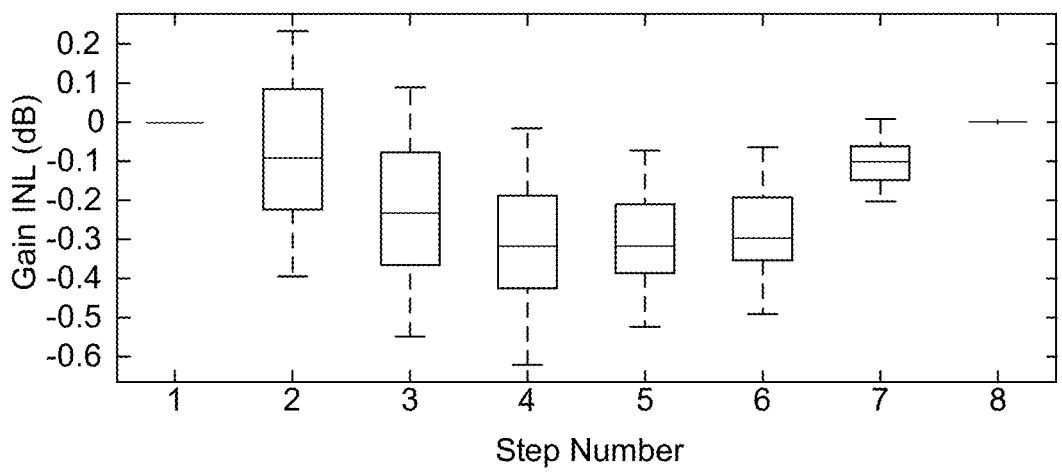
Figure 13A:
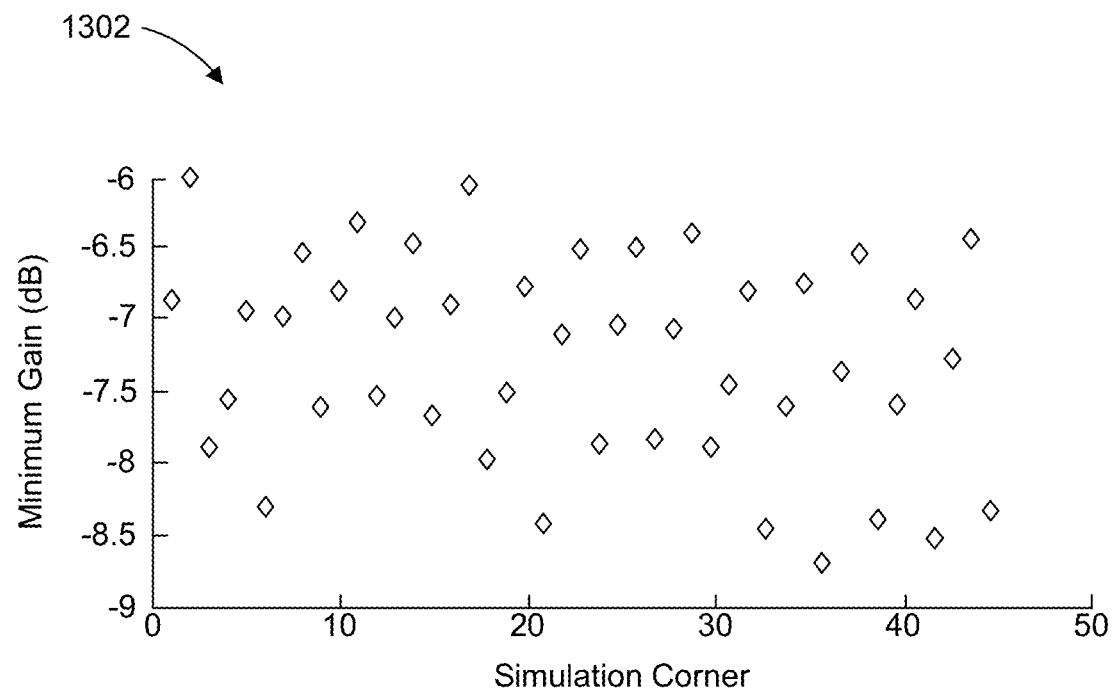
Figure 13B:
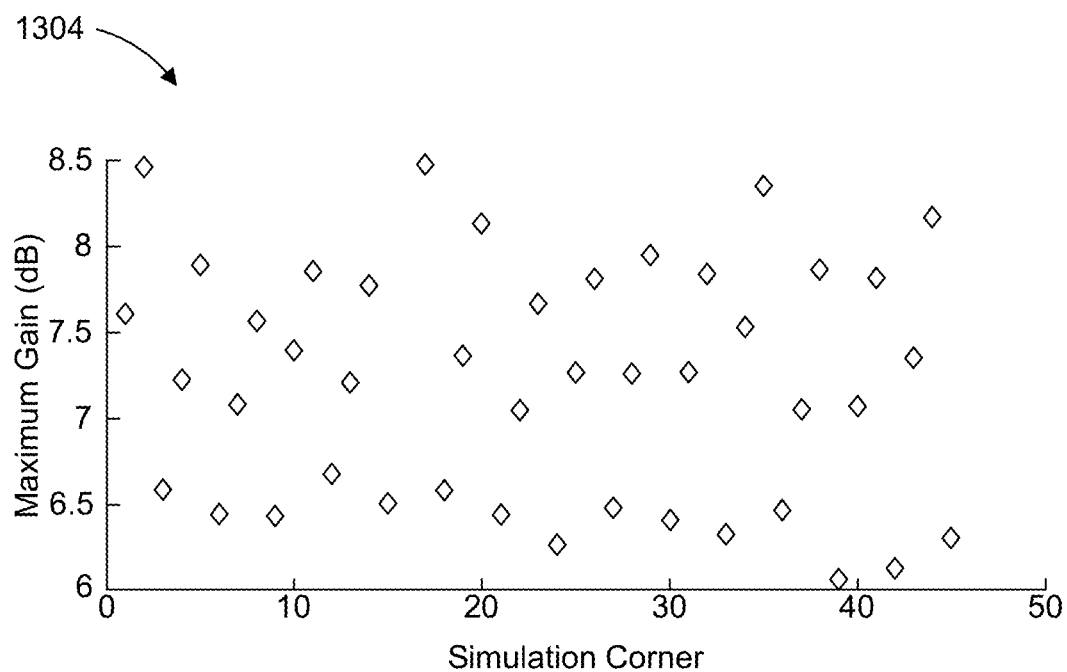
Figure 13C:
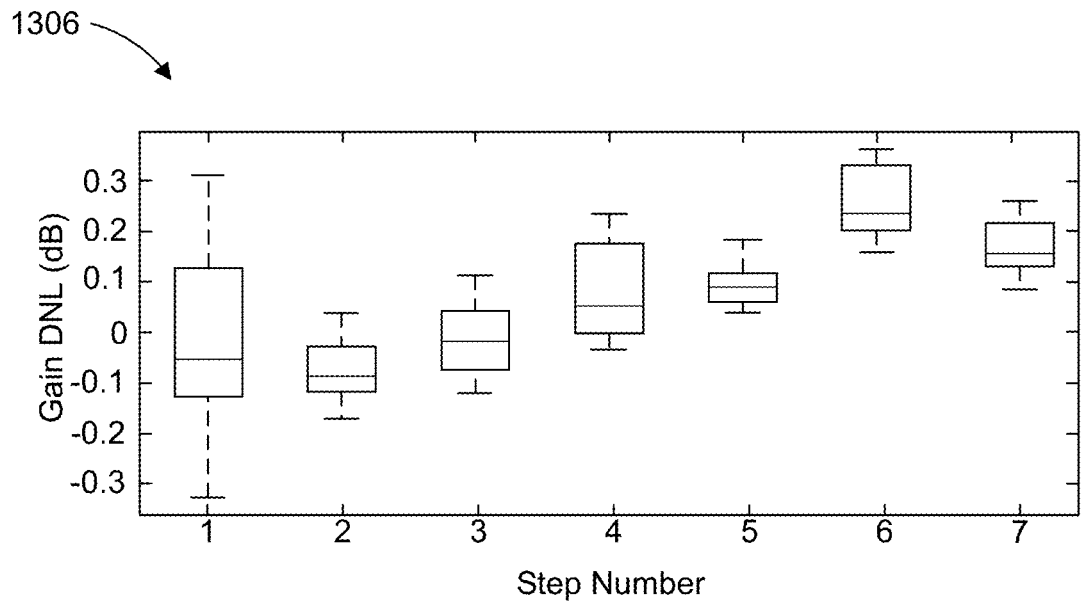
Figure 13D:
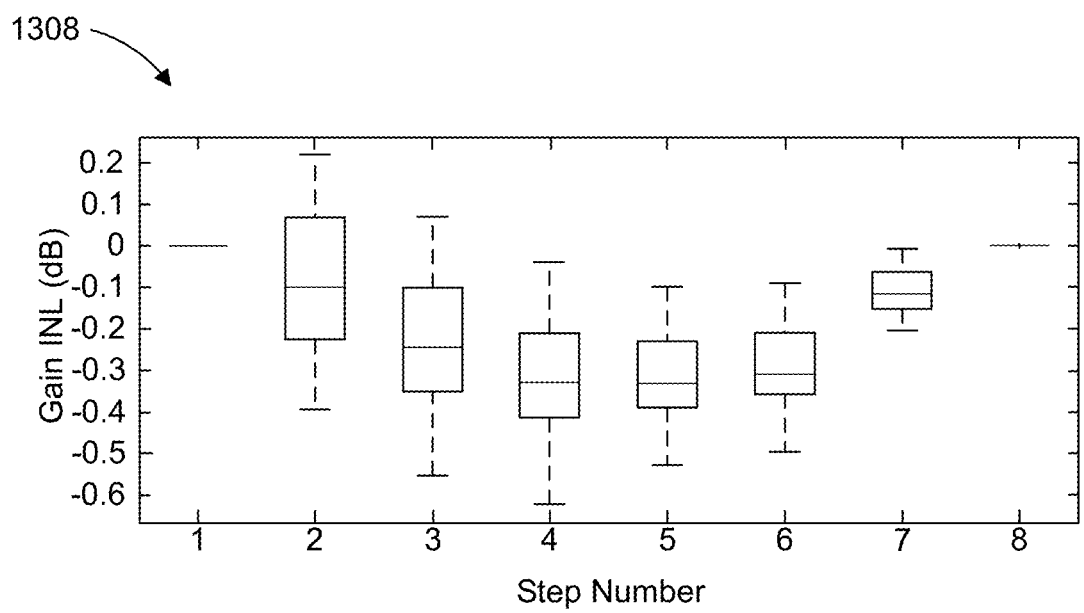
Figure 14A:
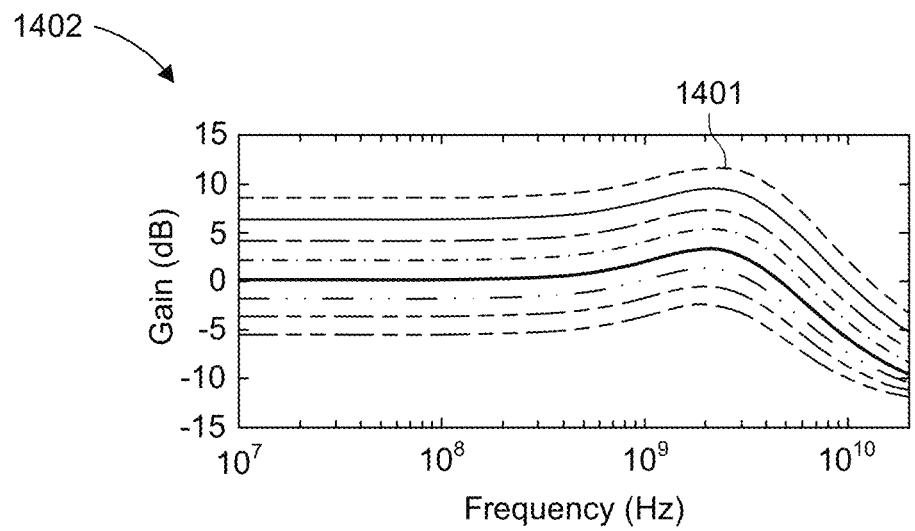
FIGS. 14A-14G depict simulation results of AC response to input data signal in accordance with an example implementation of the present disclosure.
Figure 14B:
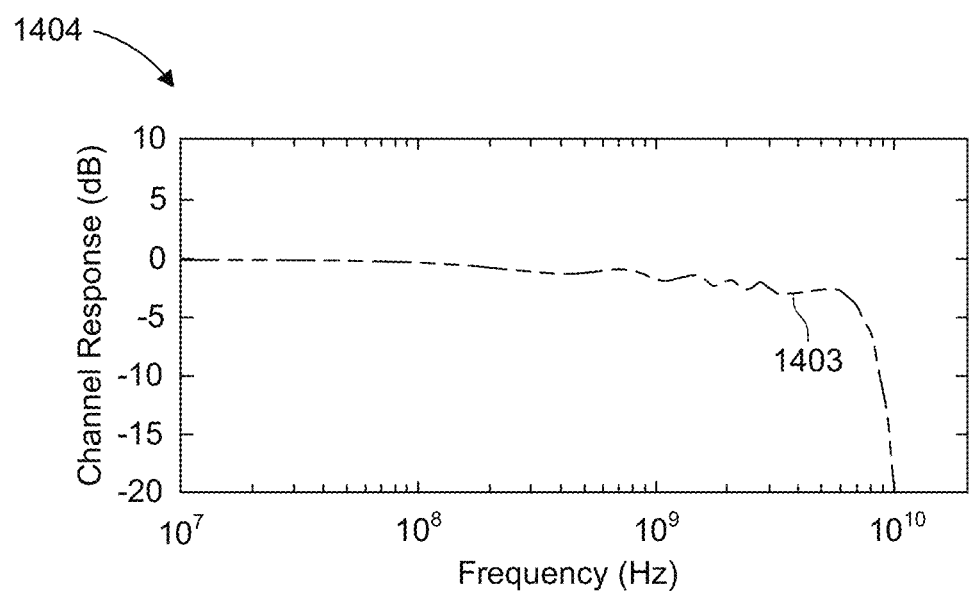
Figure 14C:
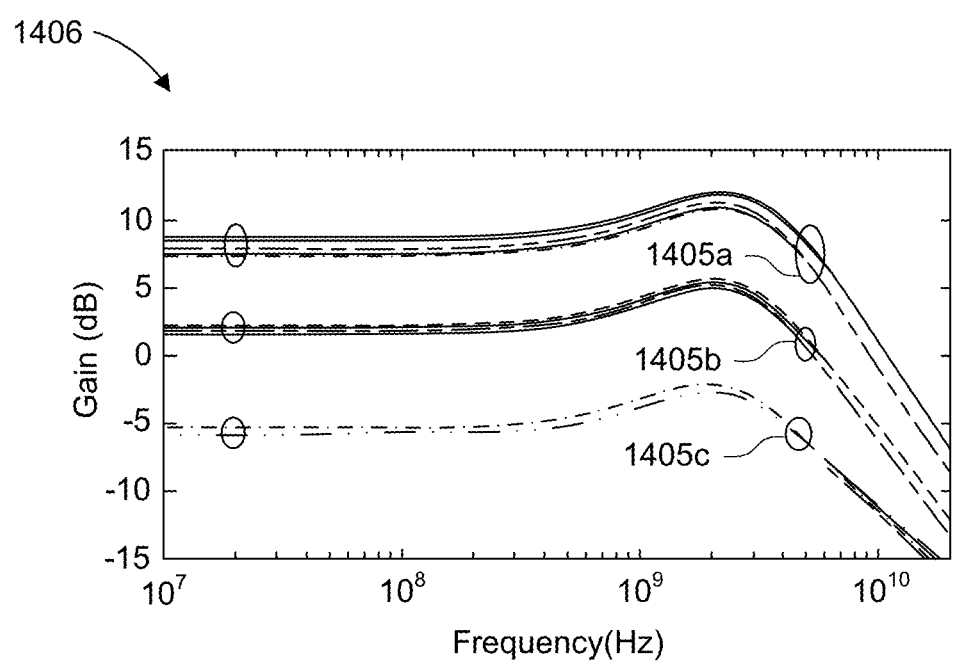
Figure 14D:
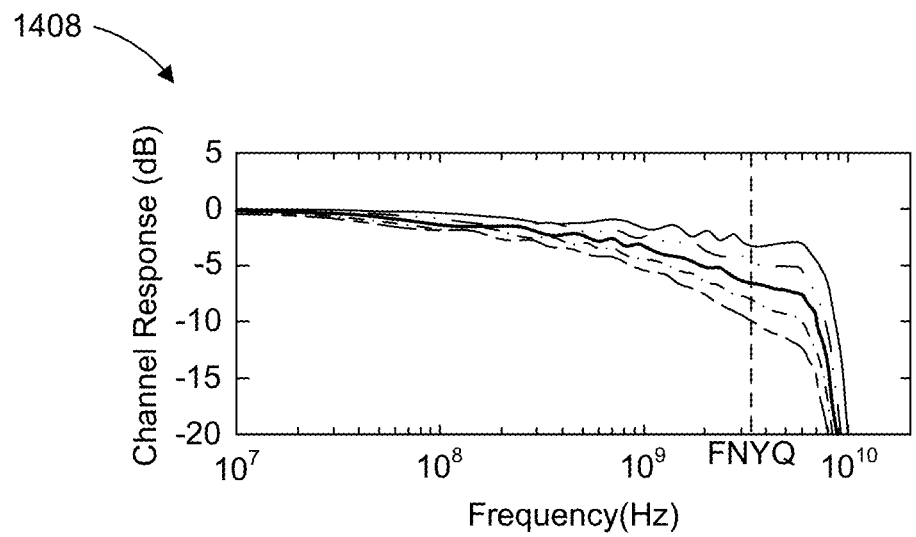
Figure 14E:
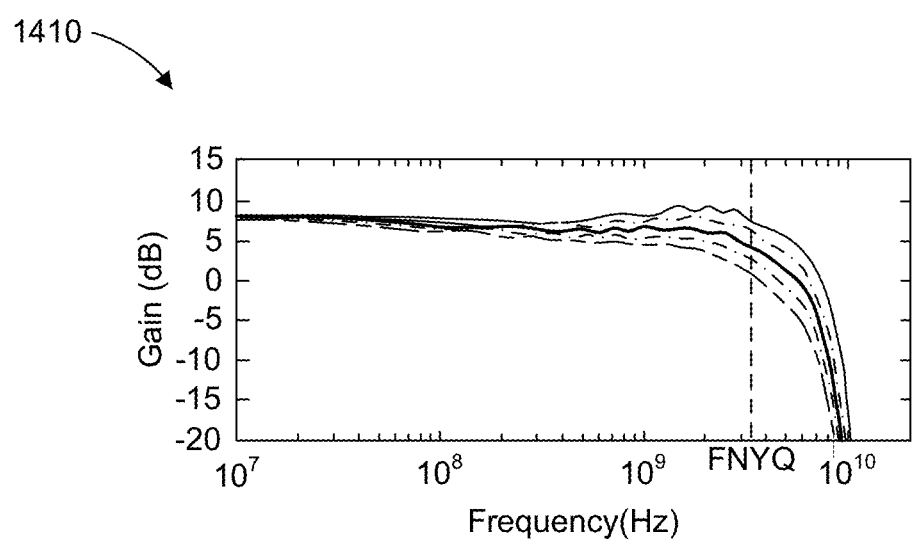
Figure 14F:
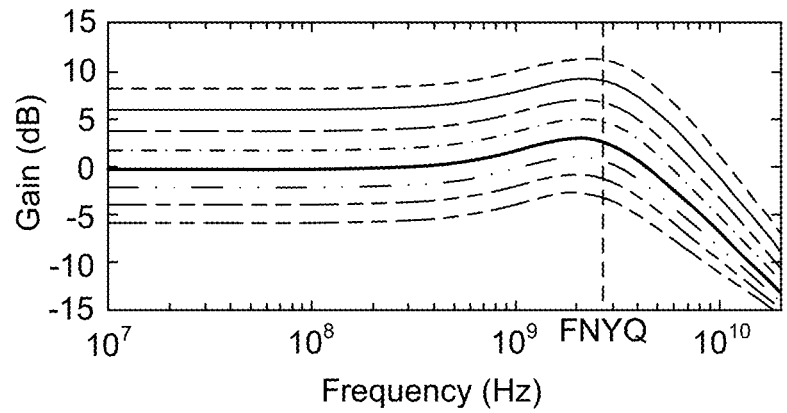
Figure 14G:
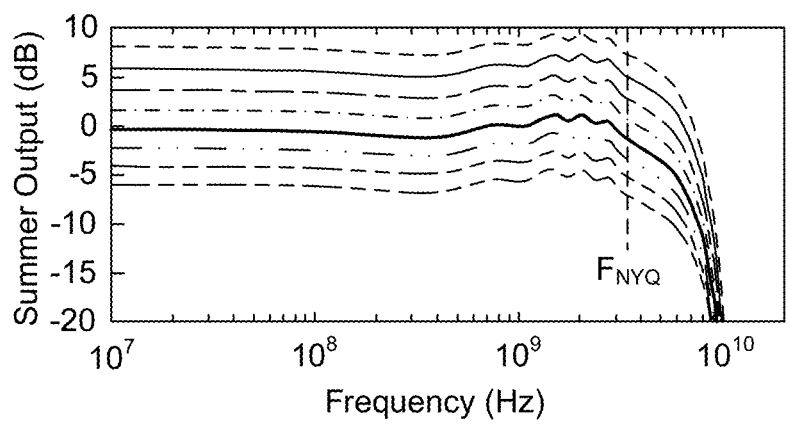

FIGS. 11A and 11B are schematic diagrams of an example summer circuit 1100 according to an embodiment of the disclosed technology. Summer circuit 1100 is an example implementation of summer circuit 704 of FIGS. 7A and 7B. Summer circuit 1100 comprises summer circuitry 1110 connected to biasing circuitry 1120.

Summer circuitry 1110 comprises a plurality of metal-oxide-semiconductor field-effect transistors (MOSFET) and resistors connected to various voltage sources. For example, summer circuitry 1110 comprises resistors R6 and R7 each having a first terminal connected to high voltage supply VDD. Summer circuitry 1110 also comprises transistors MN17-MN24, which may be nMOS transistors or another suitable semiconductor device. Drain terminals of MN17 and MN18 are connected to second terminals of resistors R6 and R7, respectively, and gate terminals of MN17 and MN18 receive an output voltage $V_{CTLE}$ from the CTLE (e.g., CTLE circuit 1000). Resistors R6 and R7 are examples of resistors R0 in FIGS. 7A and 7B and current flowing across resistors R6 and R7 are translated into voltages levels that are output at nodes Vops and Vons. The nodes Vops and Vons at which resistors R6 and R7 connect to MN17 and MN18 are examples of differential nodes N1 and N2, respectively, of FIGS. 7A and 7B. A source terminal of MN17 is connected to a first terminal of resistor R5 and to drain terminals of MN23 and MN19. A source terminal of MN19 is connected to ground. Gate terminal of MN19 is connected to a source terminal of MN23 and a drain terminal of MN21, which has a source terminal connected to ground. Source terminal of MN18 is connected to a second terminal of resistor R5 and to drain terminals of MN24 and MN20, which has a source terminal connected to ground. Gate terminal of MN20 is connected to a source terminal of MN24 and drain terminal of MN22, which has a source terminal connected to ground. Gate terminal of MN23 is connected to gate terminal of MN24, which are both connected to voltage VDD. Gate terminal of MN21 is connected to gate terminal of MN22, which are both connected to voltage Vbn, for example, supplied by circuit 1040 of FIG. 10E. A capacitor C2 is connected in parallel with resistor R5.

Transistors MN17 and MN18, resistor R5, and capacitor C2 may be an example of the transconductance block 715 of FIGS. 7A and 7B, such that the gain factor applied by transconductance block 715 is based on the effective transconductance of MN17 and MN18. Thus the voltage at nodes Vops and Vons are the differential voltages that are supplied to taps in a DFE architecture (e.g., taps 728). Feedback current from DFE taps can be provided at these nodes as well.

Biasing circuitry 1120 comprises a reference voltage generator 1102, amplifier 1104, resistors, and MOSFETS. Amplifier 1104 may be a 2-stage low-offset amplifier. The reference voltage generator 1102 supplies a reference voltage to a first input terminal of amplifier 1104. An output terminal of amplifier 1104 is connected to a gate terminal of MN25, which has a drain terminal connected to a drain terminal of MP4. Source terminal of MP4 is connected to a high voltage supply VDD, which is also connected to a source terminal of MP5. Gate terminals of MP4 and MP5 are connected to each other and to the drain terminals of MP4 and MN25. Drain terminal of MP5 is connected to a drain terminal of MN26 and to a first terminal of resistor R9, which receives voltage Vbn (e.g., from circuit 1040) at a second terminal. Resistor R9 operates to filter noise out of the reference voltage. Gate terminal of MN26 is connected to the first terminal of resistor R9. Source terminal of MN26 is connected to a first terminal of resistor R8 and to ground. A second terminal of resistor R8 is connected to a source terminal of MN25, which are connected to a second input terminal of amplifier 1104.

In operation, summer circuit 1100 converts an input voltage from the CTLE circuit 1000 to a current in the form of a transconductance at nodes Vopc and Vonc and adds the current to feedback current (if present). The summed current is converted to voltage at nodes Vops and Vons using output resistors R6 and R7, respectively. Since the CTLE circuit 1000 adjusts the gain, the summer circuit 1100 is configured so to not add any gain to the signals. If increased equalization is needed, it may be easier to add equalization at summer circuit 1100 using the degenerate resistor (e.g., resistor R5), opposed to adding equalization at the CTLE circuit 1000.

For example, gain is not added by summer circuit 1100 as follows. Currents generated at the drain terminals of MN24 and MN23 are substantially the same current. Similarity in the currents is provided as a result of resistor R5 and capacitor C2, which divide the current into two branches: first branches comprising MN21 and MN23 and second branch comprising MN22 and MN24. The two branches operate to sync an equal amount of current within the respective branch. Resistor R5 and capacitor C2 are included in summer circuit 1100 to assist with equalization and adjust the gain in summer circuit 1100 to one. Thus, gain adjustability is provided by the CTLE circuit 1000. This configuration can function to preserver bandwidth at the summer circuit 1100 because applying additional gain is not required in summer circuit 1100 and the pair of resistor R5 and capacitor C2 create a zero that extends bandwidth of summer circuit 1100.

Furthermore, summer circuit 1100 provides for gain (or lack thereof) that is independent of process corners. For example, The current at drain terminals of MN24 and MN23 is dependent on the biasing circuit 1120. For example, the voltage drop across resistor R8 will generate a fixed current on the drain terminal of MP4, which is copied to the drain terminal of MP5 and mirrored to the drain terminals of MN23 and MN24. The current at the drain terminals of MN23 and MN24 depends on the voltage generated by the reference voltage generator 1102 over the resistance of resistor R8. When voltage from reference voltage generator 1102 over resistor R8 drops at resistors R6 and R7, the common mode voltage at nodes Vops and Vons is going to be dependent only on the voltage from reference voltage generator 1102 (e.g., (Vons+Vops)/2)). When the voltage from reference voltage generator 1102 is process corner independent, in accordance with embodiments disclosed herein, then the common mode at the drain terminal of MN18 is also going to be process independent. Thus, the biasing circuitry 1120 may provide a constant voltage drop across resistor R8. This constant voltage drop reduces process variation spread in the output common-mode voltage, which eases the slicer design and improves the integral nonlinearity error (INL) in multipliers. The gain provided by summer circuit 1100 is proportional to resistors R5, R6 and R7. By making the biasing current, set by biasing circuit 1120, inversely proportional to resistance, the transconductance will reduce in Rmax corners resulting in a reduction in the spread of gain variations. That is, gain will be process corner independent so summer circuit 1100 does not apply significant gain, regardless of process corners of the components that make up summer circuit 1100.

Summer circuitry 1110 also comprises a plurality of injection devices that also provide for reduction in the spread of gain variations across process corners. For example, summer circuit 1100 should operate in a uniform way across all process corners, which depend on the fabrication process. The injection devices operate to reduce the spread of the gain variation across those corners. For example, injection devices are configured to generate a process-dependent current that shifts an output voltage for fast process corners toward typical and slow process corners. Shifting the output voltage in this way, will assist to spread gain variation, for example, by reducing a standard deviation in the gain due to process induced variations. In the example of FIG. 11A, injection devices are provided as MN19 and MN20.

FIGS. 12A-12D and FIGS. 13A-13D depict AC simulation results in accordance with an example implementation of the present disclosure. FIGS. 12A-12D depict simulation results at an output of CTLE circuit 1000, while FIGS. 13A-13D depict simulation results of out from summer circuit 1100 (e.g., output from summer circuit 1100 based on processing by CTLE circuit 1000 and summer circuit 1100).

Plots 1202 and 1302 illustrate simulated minimum gain across 15 process corners at three temperatures (e.g., 0° C., 25° C., and 85° C.), where the designed minimum gain target is less than −6 dB. Plots 1204 and 1304 illustrate simulated maximum gain for the 15 process corners at the three temperatures, where the designed maximum gain target is more than 6 dB. Plots 1202, 1302, 1204, and 1304 show results in a case with 60 mV channel swing (which sets the DC operating point of the CTLE). The AC gain is obtained by biasing both of input CTLE terminals at VDD−(swing/2)

and apply an AC gain. The AC gain is obtained by biasing both of input CTLE terminals at VDD−(swing/2) and apply an AC stimulus to the Vin terminal in CTLE circuit 1000. The feedback currents from taps are set to zero for this simulation.

In plots 1206 and 1306, the x-axis is the step number, which determines the selected gain, which can be set by MR bits. The y-axis illustrates box and whisker plots of simulated gain differential nonlinearity (DNL) as a function of step number. In plots 1208 and 1308, the x-axis is the step number. Plots 1208 and 1308 illustrate box and whisker plots of simulated gain integral nonlinearity (INL) as a function of step number.

FIGS. 14A-14G depict simulation results of AC response to input data signal in accordance with an example implementation of the present disclosure. Plots 1402 and 1404 depict simulation results at an output of CTLE circuit 1000, while plots 1406-1414 depict simulation results output from summer circuit 1100 (e.g., CTLE circuit 1000 and summer circuit 1100). The simulations used to obtain FIG. 14 the same simulations for obtaining FIGS. 12 and 13. Plot 1402 shows gain as a function of frequency (Hz), where each plotted line represents a separate MR setting for programing the gain. Plot 1402 shows an approximate 3 dB boost at the peaks (e.g., peak 1401) Plot 1404 shows the AC channel response as a function of frequency, and illustrates an approximate 3 dB drop at valley 1403 at 3.2 GHz. Similar results are shown in plots 1410 and 1412, with an approximate 0.2 dB drop at 3.2 GHz (e.g., Nyquist frequency for this simulation). The AC response plots depict the DC gain assuming a certain biasing point, the CTLE/Summer bandwidth, boosting factor, and high frequency response. The gain control is realized by using dedicated MR settings that are applied to the CTLE circuit 1000. FIG. 14 illustrates ability of the disclosed embodiments to provide clean gain control and clean boost for all gains. Plot 1412 shows a relatively flattened curve for frequencies below the Nyquist frequency.

Plot 1406 depicts gain response as a function of frequency (similar to plot 1402) but for three gain selections. In each group, the gain selection is fixed and the input swing is varied between 60 mV to 300 mV. For group 1405a, the gain selection 6 dB and for group 1405b, the gain selection is ~1 dB, and for group 1405c, the gain selection is −6 dB. In other words, MR settings for this simulation is set to 6 dB for group 1405a, 1 dB for group 1405b, and −6 dB for group 1405c. The plots show that, for the various input swings, CTLE circuit 1000 and summer circuit 1100 provides almost constant gain and boost almost irrespective of the input swing (e.g., input common-mode voltage).

Plots 1408 and 1410 depict channel response and gain, respectively, as a function of frequency for various channel lengths. MR settings are used to program the desired gain to 6 dB and the channel length is varied from 50 mm to 500 mm, at 100 mm increments (e.g., each plotted line represents a result for a given channel length). As shown in plots 1410 and 1408, the response with 3 dB boost is relatively flat for channel lengths under 200 mm.

Figure 15A:
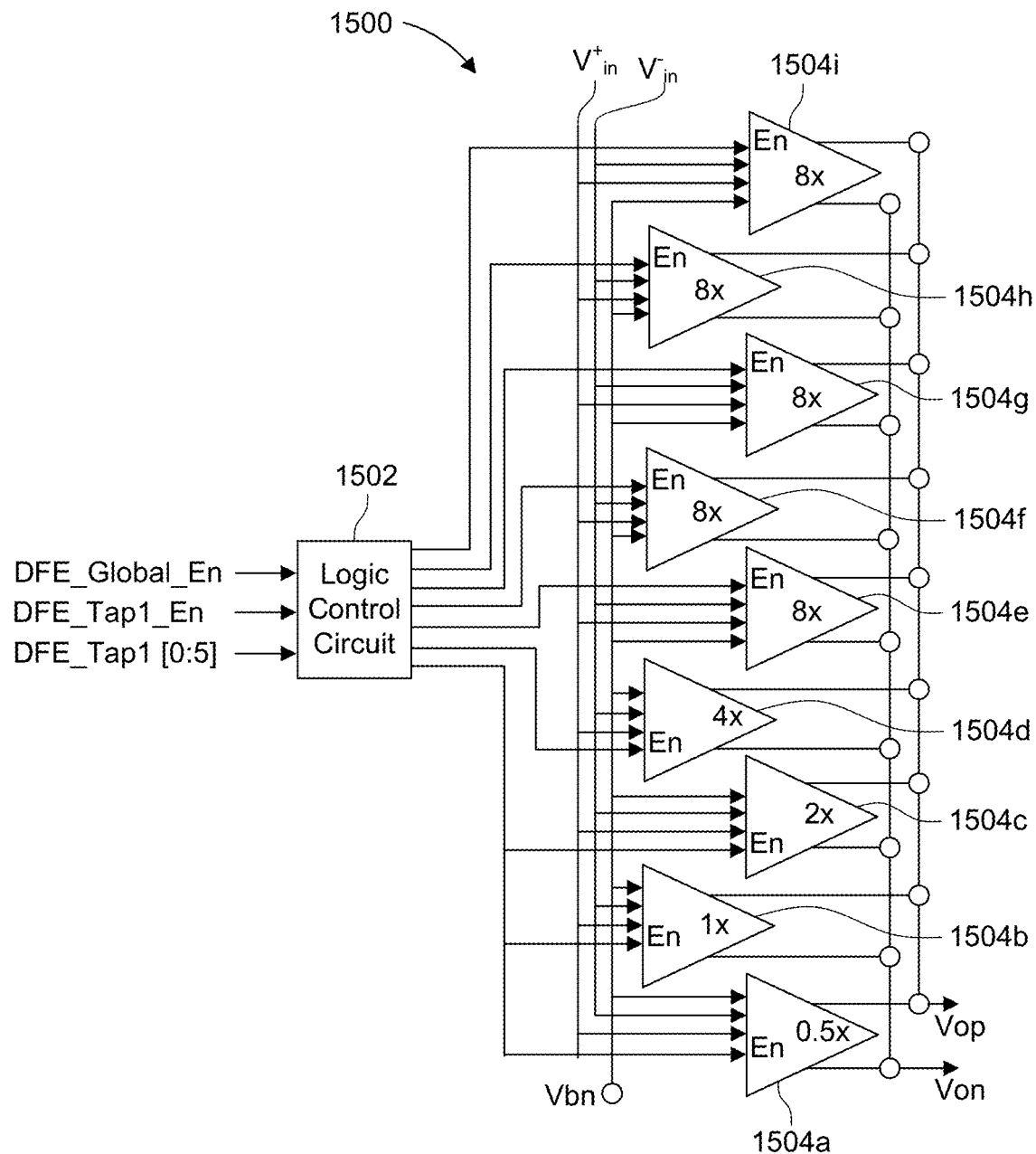
FIGS. 15A-15C are schematic diagrams of an example multiplier according to an embodiment of the disclosed technology.
Figure 15B:
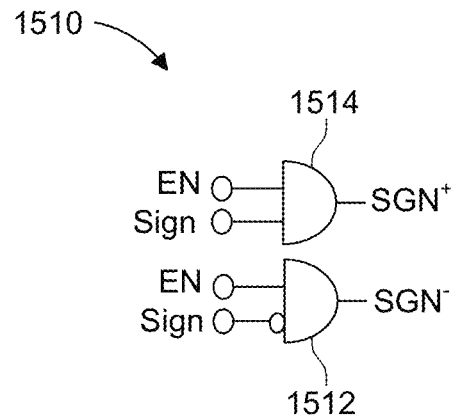
Figure 15C:
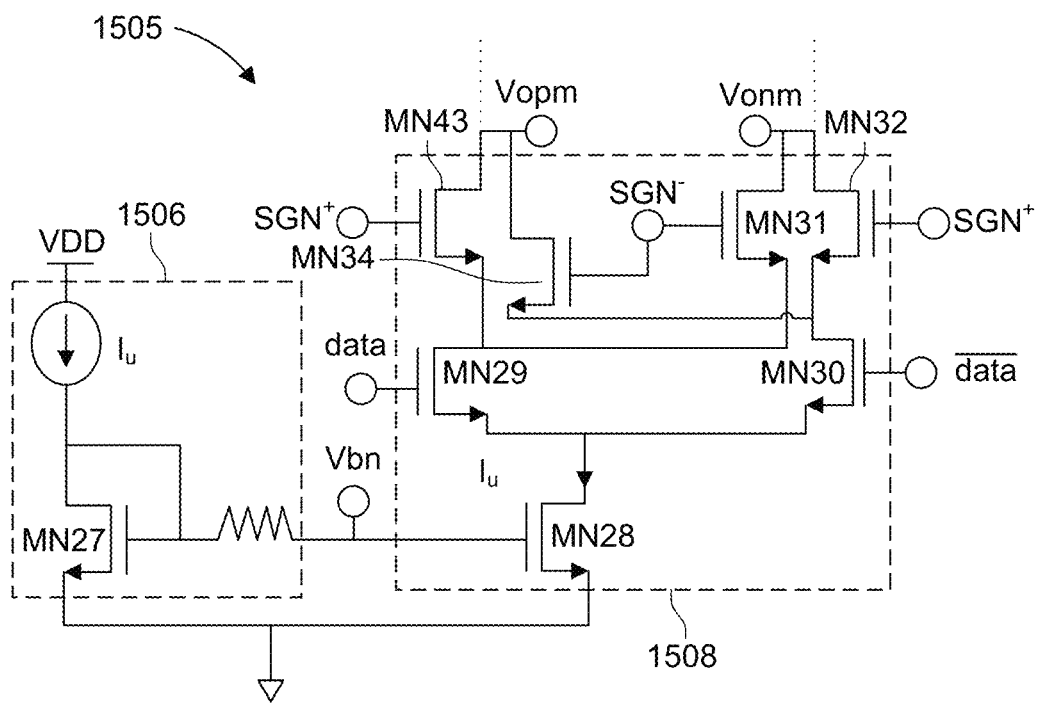
Figure 16A:
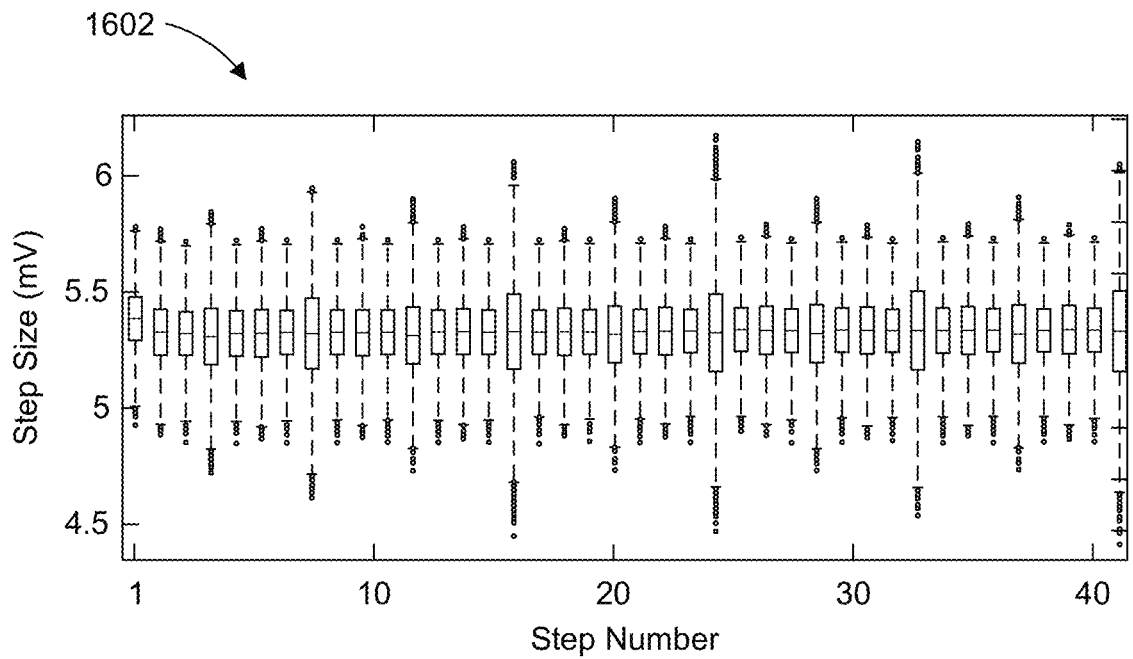
FIGS. 16A-16D and FIGS. 17A-17D depict simulation results of the multiplier of FIGS. 15A-15C in accordance with an example implementation of the present disclosure.
Figure 16B:
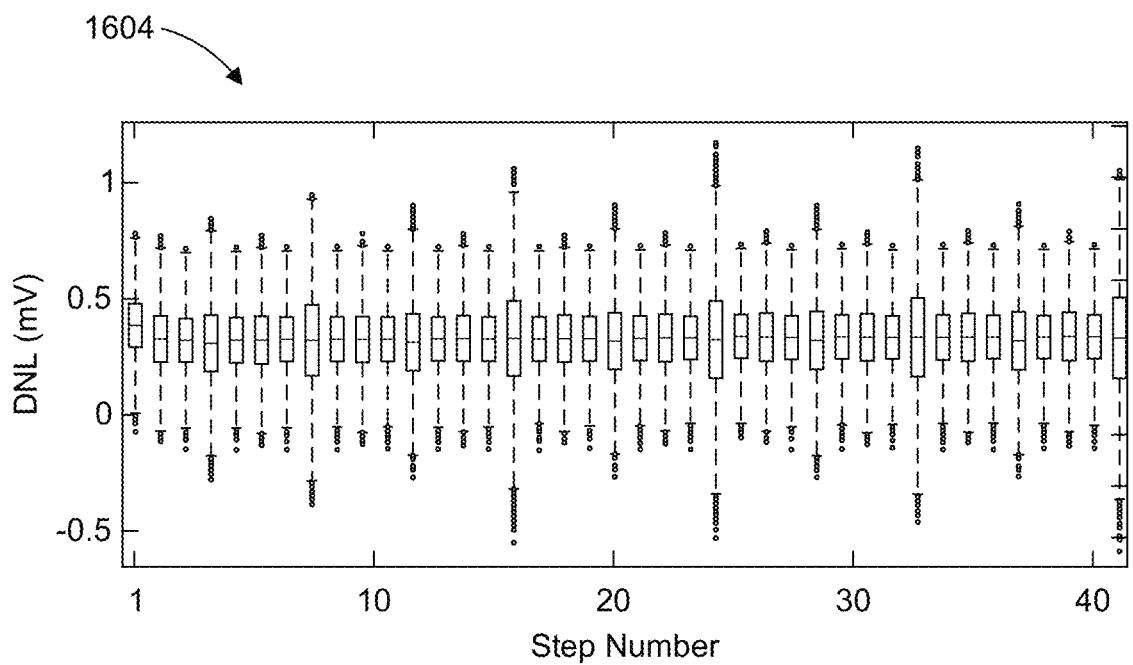
Figure 16C:
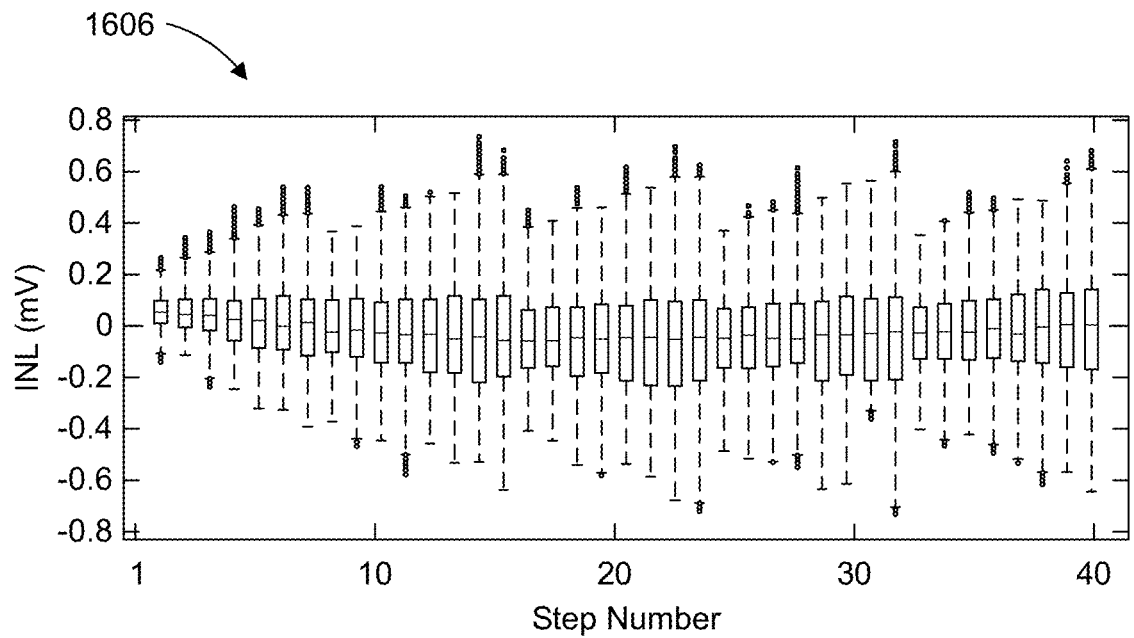
Figure 16D:
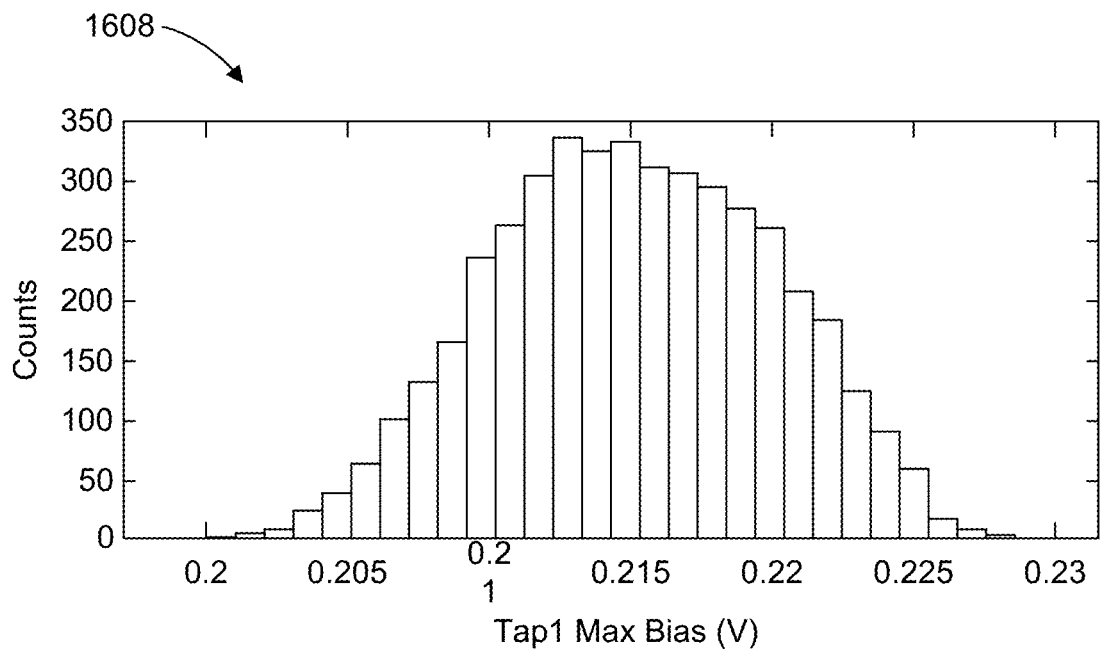
Figure 17A:
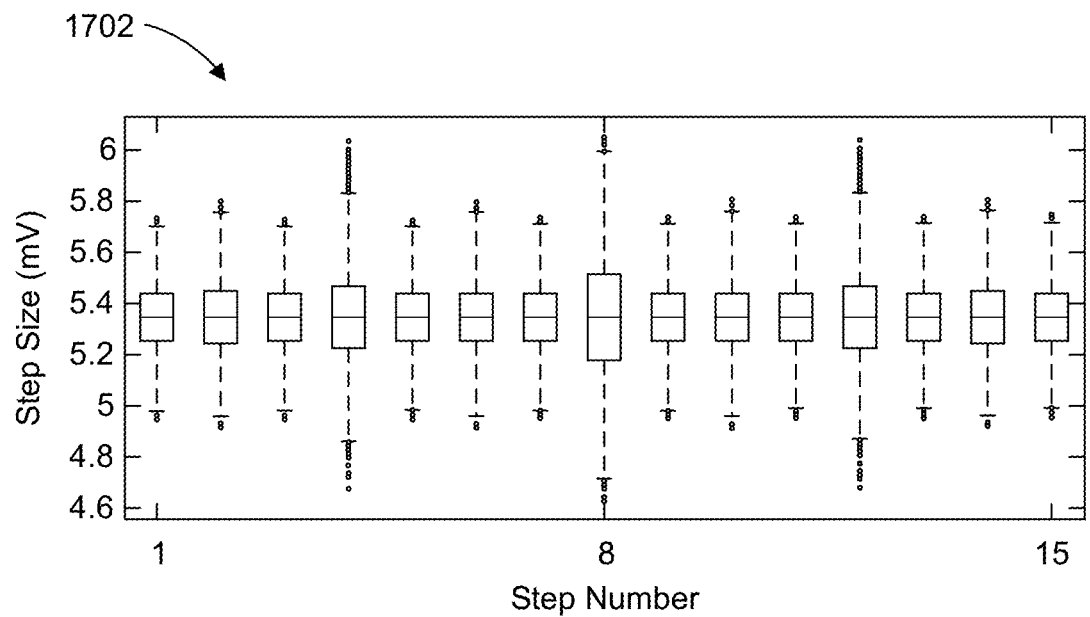
Figure 17B:
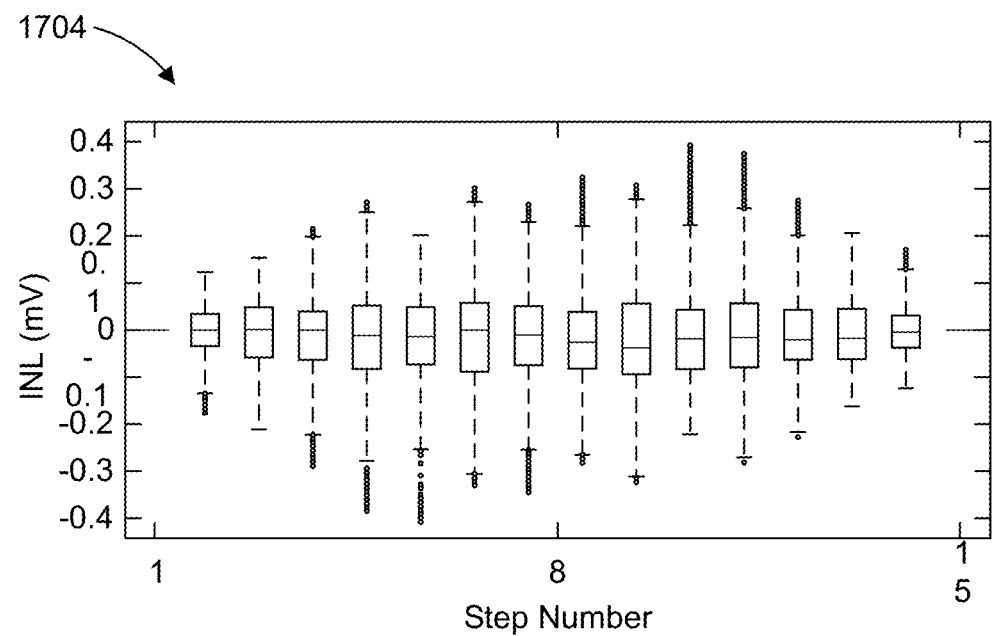
Figure 17C:
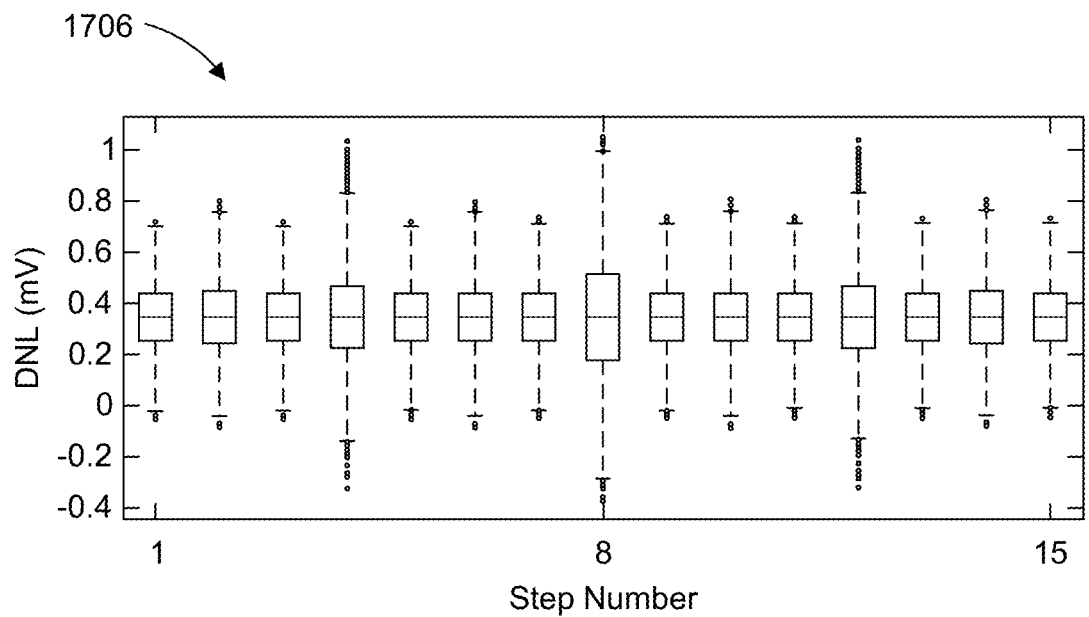
Figure 17D:
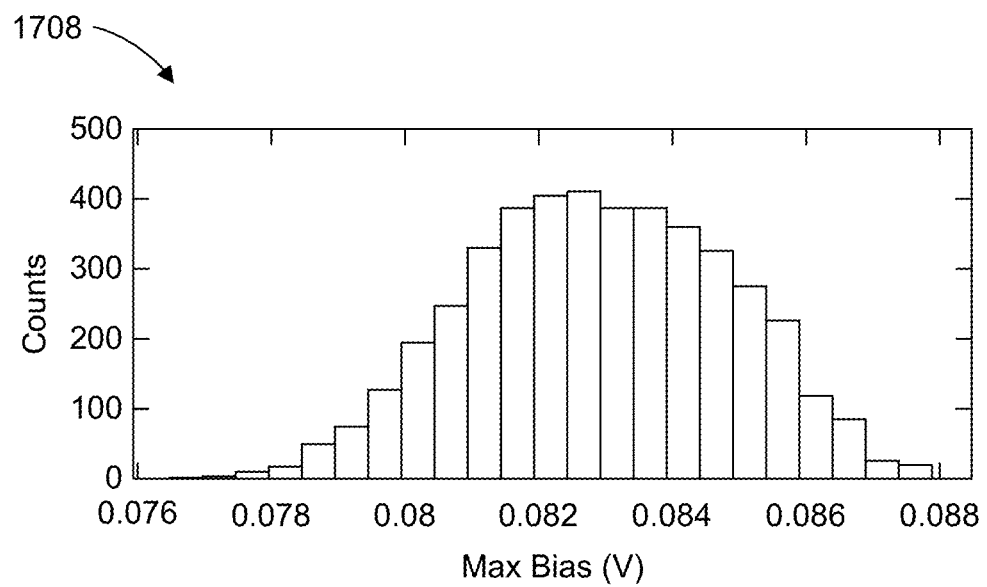

FIGS. 15A-15C are schematic diagrams of an example multiplier 1500 according to an embodiment of the disclosed technology. Multiplier 1500 is an example implementation of DFE a multiplier 717 of FIGS. 7A and 7B, which receives inputs from multiplexers 718 and 719, as described above in connection with FIGS. 7A and 7B.

In the example shown in FIGS. 15A-15C, the multiplier 1500 is based on segmented DAC architectures. Multiplier 1500 comprises a plurality of differential amplifier 1504a-g (collectively referred to herein as differential amplifiers 1504). Each differential amplifier 1504 comprises one or more unit cell circuit 1508 connected in parallel. The parallelism comes from the fact that the outputs of all unit cell circuit 1508 of a given differential amplifiers 1504 (e.g., nodes Vopm and Vonm in unit cell circuit 1508) are connected. Each differential amplifier 1504 functions as a transconductance multiplier that applies a respective multiplier to an input signal (e.g., 0.5×, 1×, 2×, 4×, 8×, etc.) to achieve a desired gain factor, set according to MR settings, of multiplier 1500. The transconductance of the 0.5× block is effectively half of the 1× block. This can be obtained, in one example, by reducing the width of transistor MN28 in a unit cell circuit 1508 for the 0.5× block. Based on the MR setting input, a certain number of unit cell circuits 1508 can be turned on and hence, a certain gain factor can be obtained. The multiplier applied by each differential amplifiers 1504 corresponds to the number of parallel unit cell circuits 1508 and the biasing circuit 1506 is shared between all unit cell circuits 1508. That is, for example, differential amplifier 1504b may comprises circuit 1505 as shown in FIG. 15C, while differential amplifier 1504e includes a circuit 1505 comprising 8 instances of unit cell circuit 1508 connected in parallel. Differential amplifier 1504a (e.g., 0.5×) applies a fixed bias to ensure that range requirements are satisfied. For example, an average step size can be 5 mV and, in this case, 40 steps may be required, in order to achieve a minimum of 200 mV for a maximum bias, with a 2.5 mV offset included. As a result of the unit cell circuit 1508 being similarly implemented in each of the differential amplifiers 1504, the step size of the adjustment to the transconductance multiplication imparted by each unit cell circuit 1508 is the same. In an example implementation, this step size is at least 5 mV for each unit cell circuit 1508. To compensate for the worst-case error in transconductance multiplication and ensure that maximum bias requirement is met, the average step size may be slightly larger than 5 mV. In terms of parasitic at the summer circuit 704, each unit cell 1508 in an example implementation can add less than 30 attofarads (aF) to each output. The total for all taps at the output may be approximately 2.76 femtofarads, which translates to less than 15 ps contribution to differential nodes at the summer circuit 704.

In an example implementation, if a multiplier 1500 is disabled, the contribution to the feedback current supplied to the summer circuit 704 is approximately zero. In each step, one unit cell circuit 1508 is enabled. If enabled but configured to activate only differential amplifier 1504a, multiplier 1500 contributes approximately 2.5 mV to the differential output voltage of the summer circuit 704. Every step (also referred to as a multiplication factor), where enabling or activating differential amplifiers 1504 constitutes a step, adds approximately 5 mV to the feedback current. Differential amplifiers 1504a (e.g., 0.5× cell) meets the range requirements by generating 2.5 mV at step 0 in this example. In other words, for Tap1, the multiplier 1500 can generate 2.5 mV, 7.5 mV, . . . , 202.5 mV voltages, which includes 41 steps. The last value can generate a maximum bias, which is set to 202.5 mV in this example. An example of a minimum value for the maximum bias across all corners is 200 mV.

Unit cell circuit 1508 comprises a plurality of MOSFETs that can be turned on or off depending on how the unit cell is desired to impact the transconductance of an input signal. Circuit 1510 receives a tap enable signal that enables the unit cell 1505 and changes the direction of the current flowed in the output nodes Vopm and Vonm. If EN signal is set to logic low level, both SGN− and SNG+ signals will be turned off.

AND gates 1514 and 1512 generate sign positive current enable signal (SGN+) or a sign negative enable signal (SGN−) based on its input sign bit. Assuming the unit cell circuit 1508 is enabled, if input data is high and the sign bit is high, current can be sank from the Vopm node through MN43. If input data is high but the sign bit is low, current can be sank from the Vonm node through MN31. If input data is low but the sign bit is high, current can be sank from the Vonm node through MN32. If input data is low and the sign bit is low, current can be sank from the Vopm node through MN34. Unit cell circuit 1508 receives an SGN− signal at a gate terminals of MN34 and MN41, while the SGN+ signal is received at a gate terminals of MN32 and MN43.

Source terminal of MN32 is connected to source terminal of MN34, both of which are connected to drain terminal of MN30. Gate terminal of MN30 is connected to the inverse input data signal (e.g., from the multiplexer 719) and its source terminal is connected to a source terminal of MN29 and drain terminal of MN28. The inverse data signal is shown as $V^-_{in}$, in FIG. 15A. Gate terminal of MN 29 is connected to the input data signal (e.g., from multiplexer 718) and its drain terminal is connected to source terminals of MN31 and MN43. The input data signal is shown as $V^+_{in}$ in FIG. 15A. Drain terminals of MN43 and MN34 are connected to voltage output node Vopm and drain terminals of MN31 and MN32 are connected to voltage output node Vonm. Voltage output nodes Vopm and Vonm are connected to differential nodes N1 and N2 of FIGS. 7A and 7B to supply feedback current to current output from summer circuit 704. In operation, unit cell circuit 1508 operates to sink current from either of nodes Vopm or Vonm.

Biasing circuit 1506 is provided to generate a current for the one or more-unit cell circuit 1508. Circuit 1506 is a simplified representation of circuit 1120 (e.g., MN27 in biasing circuit 1506 can act like MN26 in biasing circuitry 1120 and resistor R10 in biasing circuit 1506 can act like resistor R9 in biasing circuitry 1120). Thus, biasing circuit 1506 may be the same circuit used to bias summer circuit 1100 since they both sink current from a shared node Vbn. Biasing circuit 1506 comprises a current source $I_u$ that is fed to drain and gate terminals of MN27. The gate terminal of MN27 is connected to a first terminal of resistor R10, which has a second terminal connected to voltage node Vbn and gate terminal of MN28. Source terminal of MN27 is connected to drain terminal of MN28. In the case that multiple unit cell circuit 1508 are included in 1505, respective gate terminals and source terminals of respective MN28s would be connected to the circuit 1506 in parallel.

Each differential amplifier 1504 is driven by control signals generated at a logic control circuit 1502, which sets the gain factor for the multiplier 1500. For example, logic control circuit 1502 receives command codes, such as a global enable code (which enable or disable all DFE taps 717a, 717b, 717c, 717d), a tap enable code that enables multiplier 1500 (e.g., a tap enable code for each tap of FIGS. 7A and 7B), and gain factor code for the tap that program the gain by selectively enabling or disabling the differential amplifiers 1504. The logic control circuit 1502 consumes command codes to enable the multiplier 1500 and generate control signals from the gain factor bits, which are provided to the differential amplifiers 1504. Logic control circuit 1502 decodes the gain factor code to generate gain factor signals as SGN+ or SGN−, which are provided to the differential amplifiers 1504. For example, each differential amplifier 1504 receives two voltages levels as an input signal corresponding to selected bits of data from the multiplexers 718 and 719, as described above in connection with FIGS. 7A and 7B. Based on the gain factor control signals, each differential amplifier 1504 is controlled to apply a respective transconductance multiplier (e.g., 1×, 2×, etc.) to the input signals, which sinks current from the differential nodes N1 and N2 of FIGS. 7A and 7B to generate the feedback current at the summer circuit 704.

With reference to FIGS. 7A and 7B, multipliers 717a-717d may each be implemented as an instance of multiplier 1500 and the gain factor of each multiplier 1500 respectively programed as outlined above. Thus, each multiplier 1500 outputs a respective feedback current to the summer circuit 704 based on the gain applied by multiplier 1500 to data from the multiplexers 718 and 719. In an illustrative example, in the case of multiplier 717a, the gain factor bits used to program multiplier 1500 may be a 6 bit command code. The 6 bit command code can be decoded into a 3 bit binary encoded control signal and 7 bit thermometer encoded control signal. Unit cells 1504a-f can be driven using 3 binary bits, while differential amplifiers 1504 *g-i* are driven using 5 bits of the thermometer encoded control signal. Only 5 thermometer bits are used because 41 steps are only needed and the two of the thermometer bits need not be used. Unlike tap 728a, which could be responsible to remove most of the ISI, the rest of taps may require less resolution. Hence, for multipliers 717b-d, a 4-bit command code tap value and a sign bit can be used, which allows for 32 possible signed tap values. For example, an input value may be 6-bits, 3 LSB bits can be used for binary and 3 MSB bits can be converted to thermometer coding. From the 6-bit input, $2^6$ or 64 steps are possible. Since 41 steps are needed, 23 steps are not implemented (e.g., 64 minus 41).

FIGS. 16A-16D and FIGS. 17A-17D depict simulation results of multiplier 1500 in accordance with an example implementation of the present disclosure. FIGS. 16A-16D provides simulation results obtained from a multiplier 1500 of a first tap (e.g., tap 728a of FIGS. 7A and 7B) and FIGS. 17A-17D provides simulation results obtained from a multiplier 1500 of a second tap (e.g., tap 728b of FIGS. 7A and 7B), or a later tap. In the example implementation, the first tap may involve 41 steps and the second tap involves 16 steps. Simulation results were, in both cases, obtained using 100 Mont Carlo simulations on 15 corners for three temperatures (25° C., 25° C., and 100° C.), providing a total of 4500 simulation runs. As outlined above, a step in the case of a multiplier 1500 refers to increasing the gain (e.g., by adjusting the transconductance) by a step through increasing the number of activated unit cell circuits 1508. Plots 1602 and 1702 are box and whisker plots of simulated step sizes as a function of step number. That is, for each step number, the box and whisker indicates simulated step sizes for all simulations at that step number. Plots 1604 and 1704 are box and whisker plots of simulated INL as a function of step number and plots 1606 and 1706 are box and whisker plots of simulated DNL as a function of step number. Plots 1608 and 1708 depict a spread of max bias for each simulation. That is, plots 1608 and 1708 show counts (e.g., numbers of simulations) that returned a given maximum bias (e.g., maximum gain to add/subtract). Plot 1608 shows a maximum bias is not less than 0.2V, while plot 1708 shows a maximum bias of 0.076 V.

Figure 18:
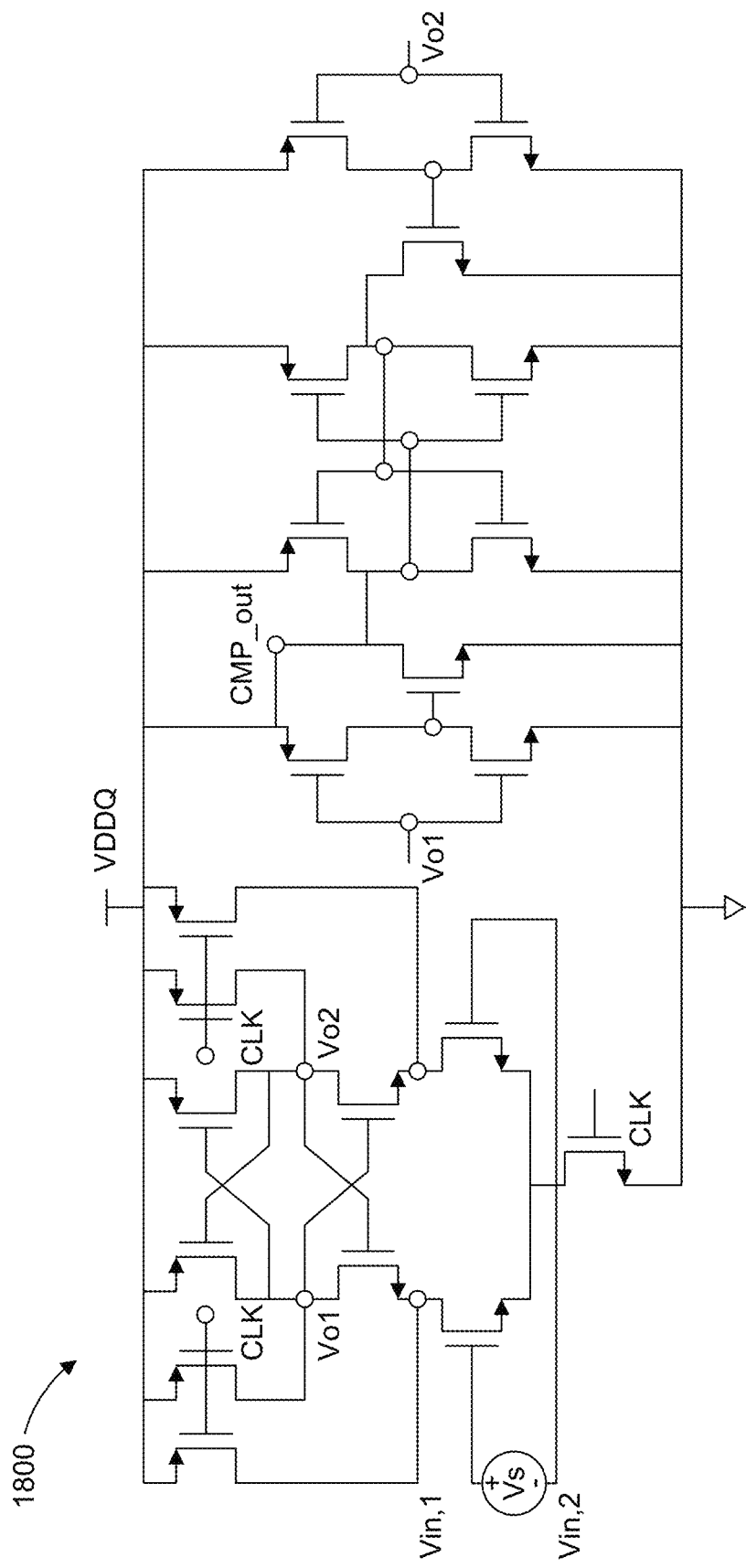
FIG. 18 is a schematic diagram of an example slicer circuit according to an embodiment of the disclosed technology.
Figure 19A:
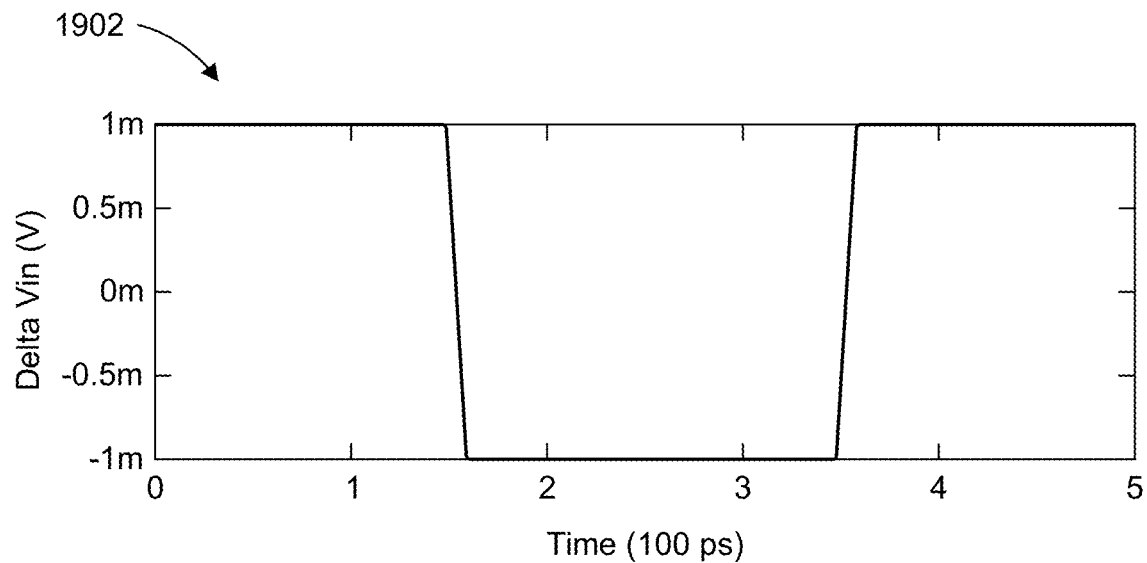
FIGS. 19A-19D depict waveforms that can be generated by the slicer circuit of FIG. 18 in accordance with the present disclosure.
Figure 19B:
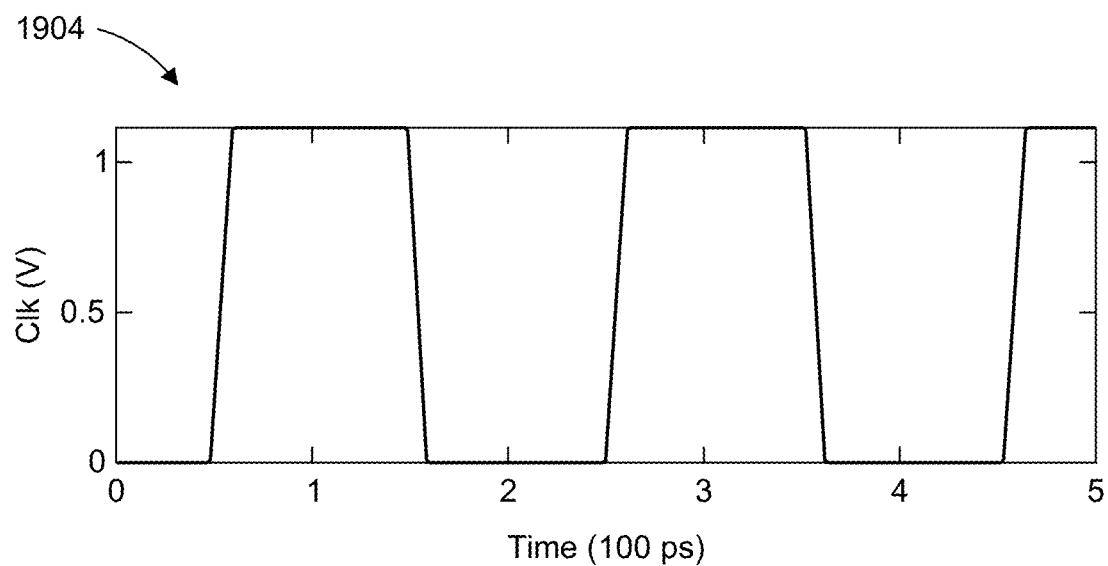
Figure 19C:
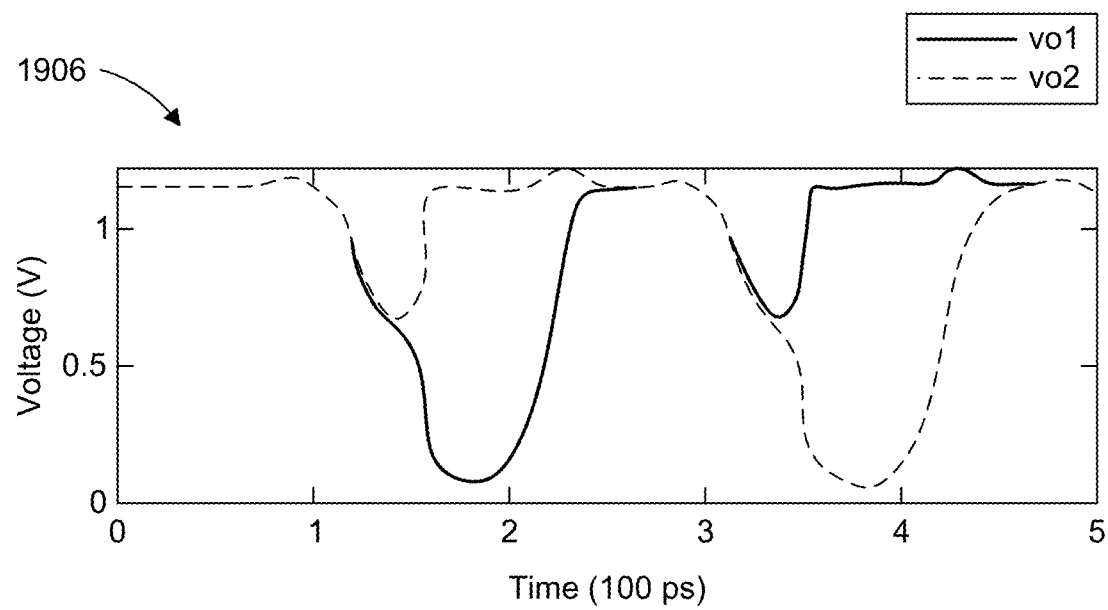
Figure 19D:
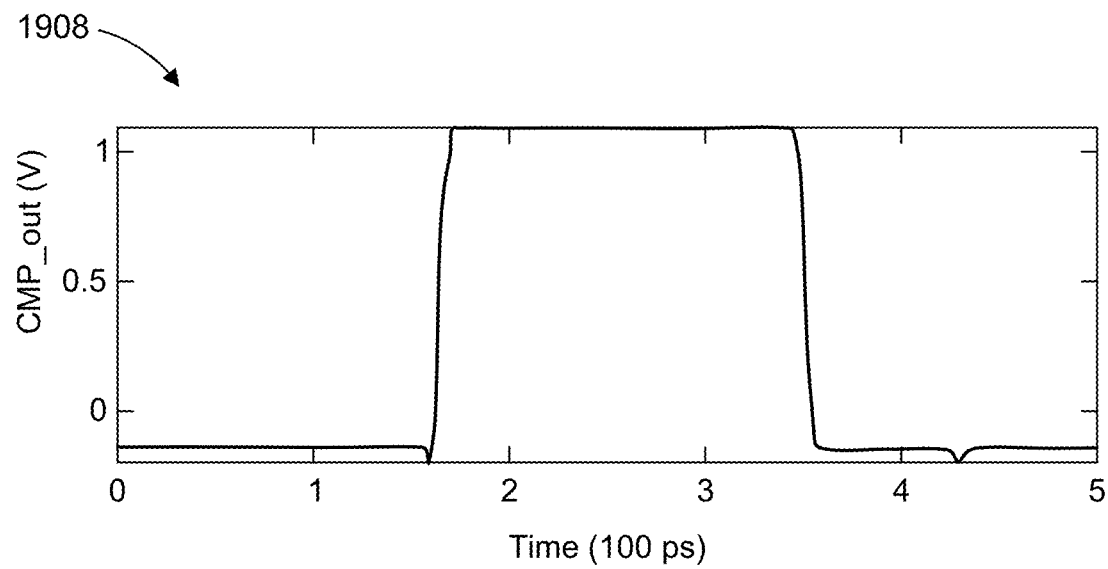

FIG. 18 is a schematic diagram of an example slicer circuit 1800 according to an embodiment of the disclosed technology. Slicer circuit 1800 is an example implementation of slicers 710 and 714 of FIGS. 7A and 7B. Slicer circuit 1800 illustrates an example StrongARM latch comparator topology, which consumes zero static power, provides high energy efficiency in comparison with current-mode logic (CML), and produces rail-to-rail outputs. Some embodiments may use a CML latch comparator topology instead, which may be provide for faster operation because CML is not rail to rail comparator and consumes more power. For example, slicer circuit 1800 may consume on average about 700 microwatts in the typical-typical process corner and require about 65 picoseconds (e.g., 7.6 GHz) to settle when stimulated by 50 mV of differential input.

Slicer circuit 1800 receives a voltage source Vin,1 and Vin,2 from the differential nodes N1 and N2 of FIGS. 7A and 7B. Slicer circuit 1800 comprises a plurality of n-channel MOSFETS or another suitable semiconductor device to operate as a comparator that compares the two voltage levels to output a logic level at the COMP_out node latched according to input clock CLK signals. For example, when implemented as slicer 710, slicer circuit 1800 samples the input voltage levels Vin,1 and Vin,2 on the rising edges of CLK and outputs a logic high level or a logic low level based on the comparison. Whereas, when implemented as slicer 714, slicer circuit 1800 samples the input voltage levels Vin,1 and Vin,2 on the falling edges of CLK to output a logic high or a logic low level. An output from slicer circuit 1800 are provided on Vo1 and Vo2.

FIGS. 19A-19D depict waveforms that can be generated by the slicer circuit 1800 in accordance with the present disclosure. Waveform 1902 shows Vin as a function of time into slicer circuit 1800. Waveform 1904 shows a clock signal as a function of time. Waveform 1906 illustrates an example output on Vo1 and Vo2 of the slicer circuit 1800, and waveform 1908 illustrative the comparative output (CMP_out) from slicer circuit 1800.

Figure 20A:
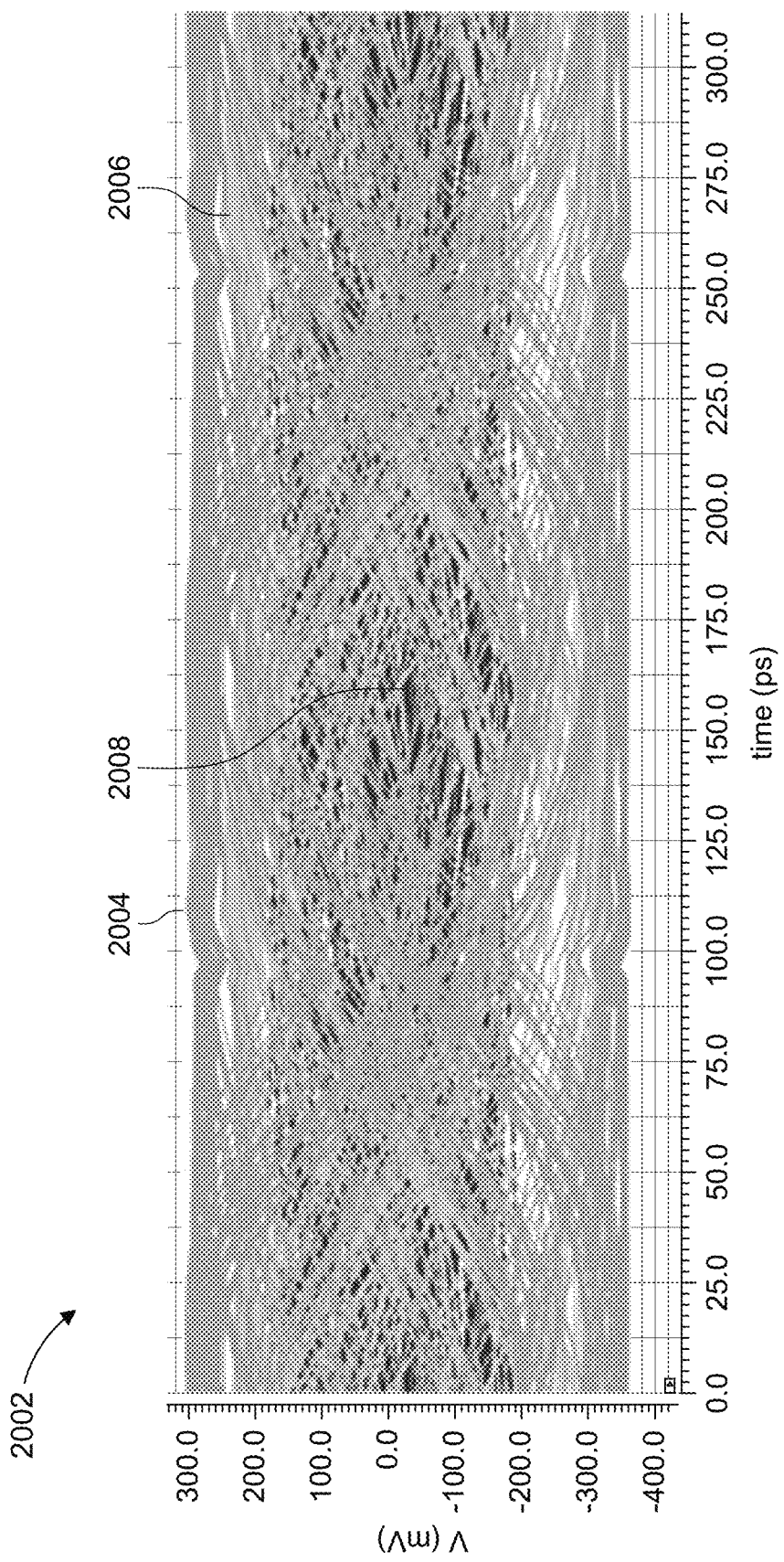
FIGS. 20A and 20B depict simulation results of a full response at a receiver device to an input data signal in accordance with an example implementation of the present disclosure.
Figure 20B:
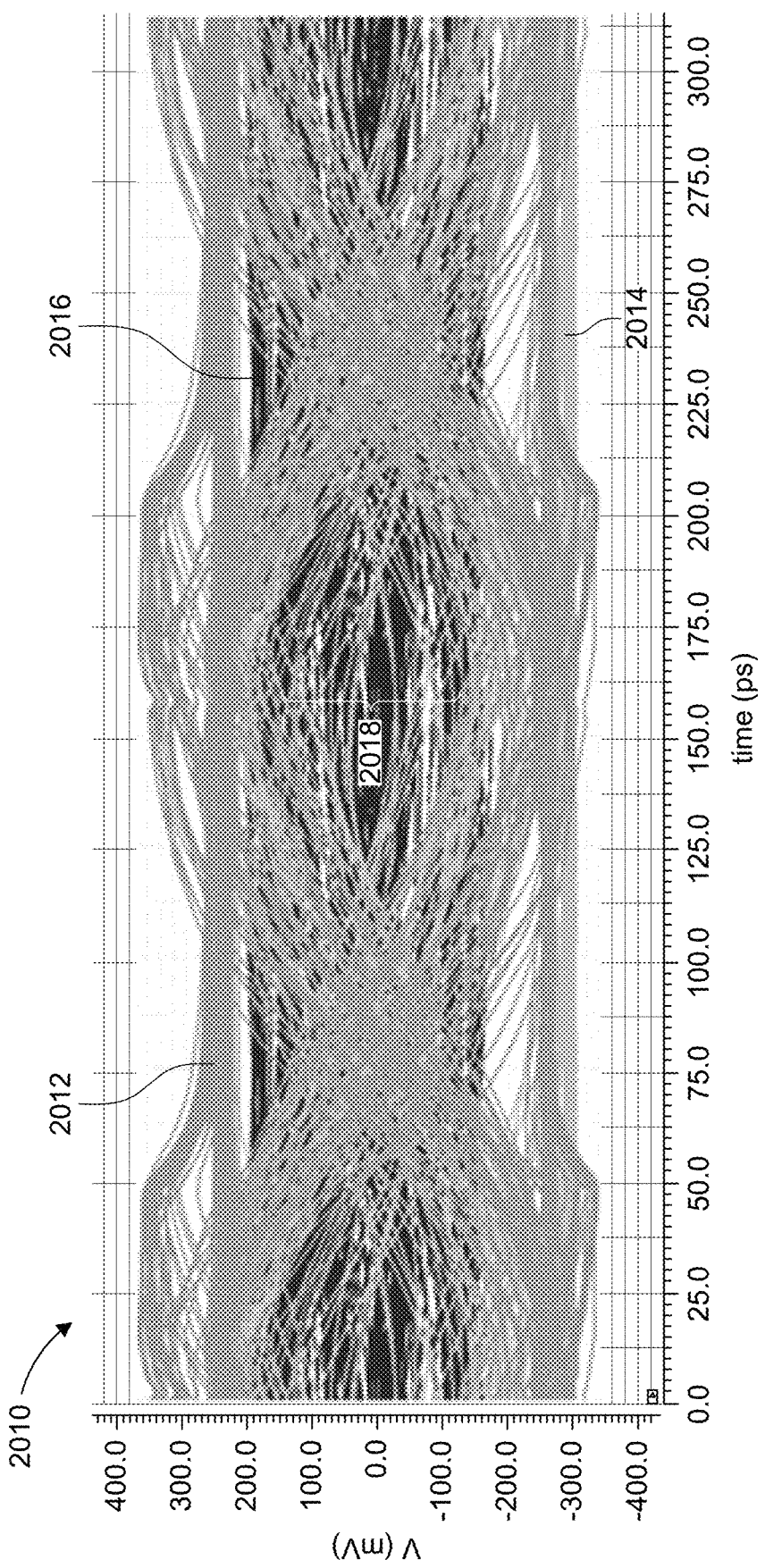

FIGS. 20A and 20B depict simulation results of a full response at a receiver device (e.g., receiver device 700) to an input data signal in accordance with an example implementation of the present disclosure. FIG. 20A shows simulation result 2002 in a case that equalization is disabled and FIG. 20B shows simulation result 2010 in a case with equalization enabled. Simulation result 2002 includes a channel response 2008, CTLE output 2006, and summer output 2008. As can be seen in results 2002, the data eye for the summer (e.g., summer output 2008) is almost completely closed and thus data may not be easily detected or latched. Simulation result 2010 also includes a channel response 2012, CTLE output 2014, and summer output 2016. Simulation result 2010 shows that the data eye 2018 of summer output 2016 is open, thereby improving data detection. The simulations were obtained using two packages of four dies having 100 mm channel lengths, a driver resistance of 40 ohms, an on-die termination resistance of 34 ohms and a parked resistance of 40 ohms. Forty simulations were performed without noise at the typical-typical corner. The simulations resulted in opening the data eye of the summer output 2016 by 85 picoseconds and 252 mV.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A compensation circuit for improving a data eye of an input data signal, the compensation circuit comprising:
   an input/output (I/O) terminal configured to detect the input data signal from a channel, the input data signal comprising a plurality of consecutive pulses representative of a data pattern encoded on the input data signal and inter-symbol interference (ISI) between the plurality of consecutive pulses;
   a first equalization circuit having a first input terminal that receives the input data signal from the I/O terminal and an output terminal that provides a first compensated data signal, the first equalization circuit configured to apply amplification to the input data signal as the first compensated data signal; and a second equalization circuit connected to an output terminal of the first equalization circuit, the second equalization circuit configured to reduce the ISI on the first compensated data signal and output a second compensated data signal by adjusting a first pulse of the plurality of consecutive pulses based on a subset of pulses of the plurality of consecutive pulses that are sequentially prior to the first pulse.

2. The compensation circuit of claim 1, wherein amplification applied to the input data signal comprises a fixed boost component and an adjustable gain component.

3. The compensation circuit of claim 2, wherein the adjustable gain component is adjustable between a upper gain and a lower gain, and wherein the fixed boost component is less than the upper gain.

4. The compensation circuit of claim 1, wherein the first equalization circuit comprises a continuous time linear equalization (CTLE) circuit, the CTLE circuit comprising the first input terminal, a second input terminal connected to a reference signal, and the output terminal.

5. The compensation circuit of claim 4, wherein the CTLE circuit is configured to generate a transfer function that inverts a frequency response of the channel, apply the transfer function to the input data signal, and output the first compensated data signal on the output terminal.

6. The compensation circuit of claim 1, wherein the second equalization circuit is configured to generate feedback current based on the subset of pulses and apply the feedback current to the first compensated data signal and reduce the ISI on the first compensated data signal.

7. The compensation circuit of claim 1, wherein the subset of pulses comprises four pulses of the plurality of consecutive pulses that are prior to the first pulse.

8. The compensation circuit of claim 1, wherein the second equalization circuit is a multi-data path decision feedback equalization (DFE) circuit, the multi-data path DFE comprises a first data path including a first slicer circuit and a first plurality of flip-flop circuits and a second data path including a second slicer circuit and a second plurality of flip-flop circuits.

9. The compensation circuit of claim 8, wherein the first data path is configured to detect even bits of the data pattern from even pulses of the plurality of consecutive pulses, and the second data path is configured to detect odd bits of the data pattern from odd pulses of the plurality of consecutive pulses, wherein the second equalization circuit is configured to: reduce ISI on the even pulses of the first compensated data signal based on the detected even bits, and reduce ISI on the odd pulses of the first compensated data signal based on the detected odd bits.

10. A method for improving a data eye of an input data signal, the method comprising:

detecting the input data signal on a channel, the input data signal comprising a plurality of consecutive pulses representative of a data pattern encoded on the input data signal and inter-symbol interference (ISI) between the plurality of consecutive pulses;

supplying a first compensated data signal by applying amplification to the input data signal by a first equalization circuit;

reducing, by a second equalization circuit, the ISI on the first compensated data signal by adjusting a first pulse of the plurality of consecutive pulses based on a subset of pulses of the plurality of consecutive pulses that are sequentially prior to the first pulse; and outputting a second compensated data signal as the first compensated data signal with the reduced ISI.

11. The method of claim 10, wherein applying amplification to the input data signal comprises: applying a fixed boost component and an adjustable gain component to the input data signal.

12. The method of claim 11, wherein the adjustable gain component is adjustable between a upper gain and a lower gain, and wherein the fixed boost component is less than the upper gain.

13. The method of claim 10, wherein the first equalization circuit comprises a continuous time linear equalization (CTLE) circuit.

14. The method of claim 13, further comprising:

generating a transfer function by the CTLE circuit that inverts a frequency response of the channel;

applying the transfer function to the input data signal; and outputting the first compensated data signal to the second equalization circuit.

15. The method of claim 10, further comprising:

generating, by the second equalization circuit, feedback current based on the subset of pulses; and applying the feedback current to the first compensated data signal to reduce the ISI on the first compensated data signal.

16. The method of claim 10, wherein the subset of pulses comprises four pulses of the plurality of consecutive pulses that are prior to the first pulse.

17. The method of claim 10, wherein the second equalization circuit is a multi-data path decision feedback equalization (DFE) circuit, the multi-data path DFE comprises a first data path including a first slicer circuit and a first plurality of flip-flop circuits and a second data path including a second slicer circuit and a second plurality of flip-flop circuits.

18. The method of claim 17, further comprising:

detecting even bits of the data pattern from even pulses of the plurality of consecutive pulses on the first data path;

detecting odd bits of the data pattern from odd pulses of the plurality of consecutive pulses on the second data path; and reducing ISI on the even pulses of the first compensated data signal based on the detected even bits, and reducing ISI on the odd pulses of the first compensated data signal based on the detected odd bits.

19. An receiver circuit comprising:

an input/output (I/O) pad that receives an input data signal transmitted over a channel, the input data signal is encoded with a data pattern comprising a plurality of bits;

a termination circuit connected to the I/O pad that detects a plurality of first pulses on the input data signal, wherein each first pulse is representative of a bit of the plurality of bits;

a continuous time linear equalization (CTLE) circuit connected to an output of the termination circuit and receives the plurality of first pulses, the CTLE circuit applies amplification to the plurality of first pulses to generate a plurality of second pulses, the amplification having a fixed boost component and an adjustable gain component; and a multi-path decision feedback equalization (DFE) circuit connected to an output of the CTLE circuit and receives the plurality of second pulses, the multi-path DFE circuit generates a feedback current for a first pulse of the plurality of second pulses based on a subset of the plurality of second pulses that preceded the first pulse, and applies the feedback current to the first pulse to reduce noise on the input data signal due to the channel.

20. The receiver circuit of claim 19, wherein the multi-path DFE circuit comprises:
   a first data path that detects a subset of even bits of the plurality of bits from the plurality of second pulses;
   a second data path that detects a subset of odd bits of the plurality of bits from the plurality of second pulses; and
   a summer circuit configured to apply the feedback current to the first pulse,
   wherein, in a case where the first pulse corresponds to an even bit, the feedback current is generated based on the subset of the subset of even bits, and
   wherein in a case where the first pulse corresponds to an odd bit, the feedback current is generated based on the subset of the subset of odd bits.

* * * * *